(12) United States Patent
Kato

(10) Patent No.: US 8,896,046 B2
(45) Date of Patent: Nov. 25, 2014

(54) SEMICONDUCTOR DEVICE

(75) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 136 days.

(21) Appl. No.: 13/285,450

(22) Filed: Oct. 31, 2011

(65) Prior Publication Data
US 2012/0112257 A1 May 10, 2012

(30) Foreign Application Priority Data

Nov. 5, 2010 (JP) ................................ 2010-249111
May 20, 2011 (JP) ................................ 2011-113176

(51) Int. Cl.
H01L 27/108 (2006.01)
H01L 27/105 (2006.01)
H01L 27/115 (2006.01)
H01L 27/06 (2006.01)
H01L 27/12 (2006.01)

(52) U.S. Cl.
CPC .......... H01L 27/1156 (2013.01); H01L 27/105 (2013.01); H01L 27/11551 (2013.01); H01L 27/0688 (2013.01); H01L 27/1225 (2013.01)
USPC ................................. 257/298; 257/E21.645

(58) Field of Classification Search
USPC .......................................... 257/298, E21.645
See application file for complete search history.

(56) References Cited

U.S. PATENT DOCUMENTS 4,466,081 A 8/1984 Masuoka
5,731,856 A 3/1998 Kim et al.
5,744,864 A 4/1998 Cillessen et al.
6,294,274 B1 9/2001 Kawazoe et al.
6,563,174 B2 5/2003 Kawasaki et al.
6,727,522 B1 4/2004 Kawasaki et al.
6,839,260 B2 1/2005 Ishii
7,049,190 B2 5/2006 Takeda et al.
7,061,014 B2 6/2006 Hosono et al.

(Continued)

FOREIGN PATENT DOCUMENTS

EP 1 737 044 A1 12/2006
EP 2 226 847 A2 9/2010

(Continued)

OTHER PUBLICATIONS

Toshio Kamiya et al.; "Carrier transport properties and electronic structures of amorphous oxide semiconductors: the present status"; Solid State Physics; Sep. 1, 2009; pp. 621-633; vol. 44, No. 9 (with English abstract).

(Continued)

Primary Examiner — Amar Movva
(74) Attorney, Agent, or Firm — Fish & Richardson P.C.

(57) ABSTRACT

Provided is a semiconductor device with a novel structure in which stored data can be retained even when power is not supplied, and which does not have a limitation on the number of writing. The semiconductor device includes both a memory circuit including a transistor including an oxide semiconductor (in a broader sense, a transistor whose off-state current is sufficiently small), and a peripheral circuit such as a driver circuit including a transistor including a material other than an oxide semiconductor (that is, a transistor capable of operating at sufficiently high speed). Further, the peripheral circuit is provided in a lower portion and the memory circuit is provided in an upper portion, so that the area and size of the semiconductor device can be decreased.

14 Claims, 31 Drawing Sheets

(56) References Cited

U.S. PATENT DOCUMENTS

| | | | |
|---|---|---|---|
| 7,064,346 B2 | 6/2006 | Kawasaki et al. |
| 7,105,868 B2 | 9/2006 | Nause et al. |
| 7,177,187 B2 | 2/2007 | Ishii |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,336,519 B2 | 2/2008 | Ishii |
| 7,355,913 B2 | 4/2008 | Kang et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,570,516 B2 | 8/2009 | Ishii |
| 7,674,650 B2 | 3/2010 | Akimoto et al. |
| 7,732,819 B2 | 6/2010 | Akimoto et al. |
| 7,826,266 B2 | 11/2010 | Ishii |
| 8,036,010 B2 | 10/2011 | Maejima |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0233038 A1 | 10/2006 | Kang et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230435 A1 | 9/2009 | Maejima |
| 2009/0268519 A1 | 10/2009 | Ishii |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0317463 A1 | 12/2011 | Maejima |

FOREIGN PATENT DOCUMENTS

| | | | |
|---|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319682 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-287225 A | 10/2006 |
| JP | 2009-223971 A | 10/2009 |
| JP | 2009-260364 A | 11/2009 |
| KR | 10-0571650 B1 | 4/2006 |
| WO | 2004/114391 A1 | 12/2004 |

OTHER PUBLICATIONS

International Search Report (International Patent Application No. PCT/JP2011/074600) dated Jan. 31, 2012.

Written Opinion (International Patent Application No. PCT/JP2011/074600) dated Jan. 31, 2012.

Kamiya, T et al., "Carrier transport properties and electronic structures of amorphous oxide semiconductors: the present status," Solid State Physics, Sep. 1, 2009, vol. 44, No. 9, Agne Gijutsu Center, pp. 621-633 with full English translation.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

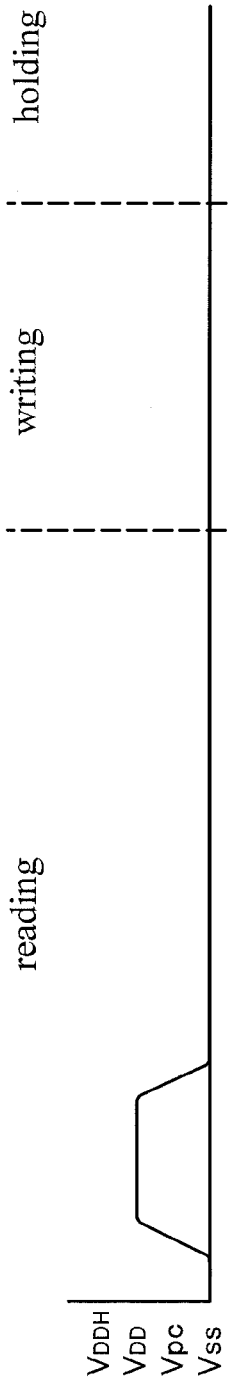
FIG. 4A
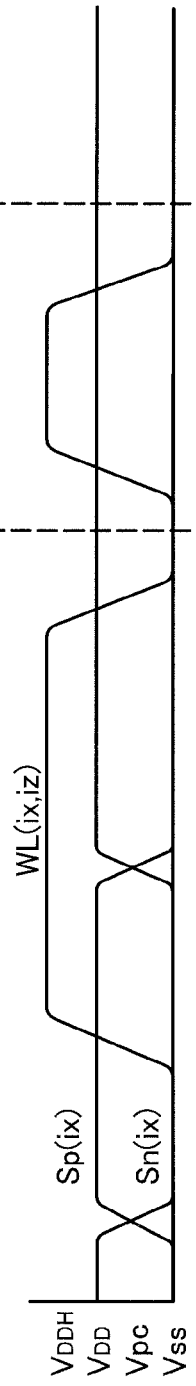
FIG. 4B
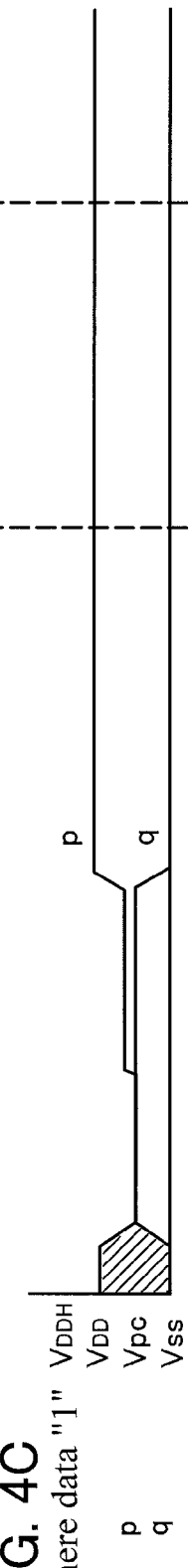
FIG. 4C where data "1"
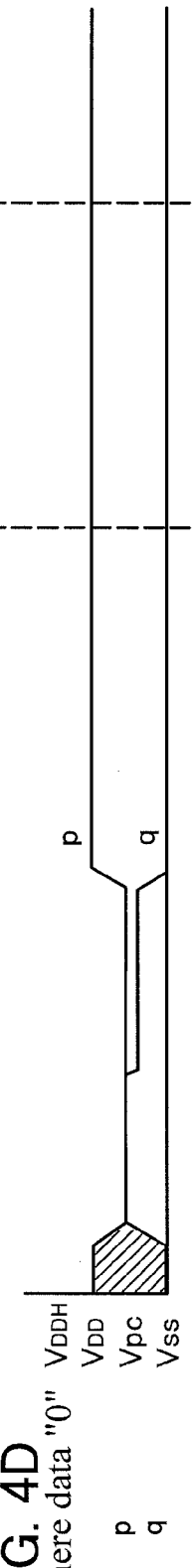
FIG. 4D where data "0"

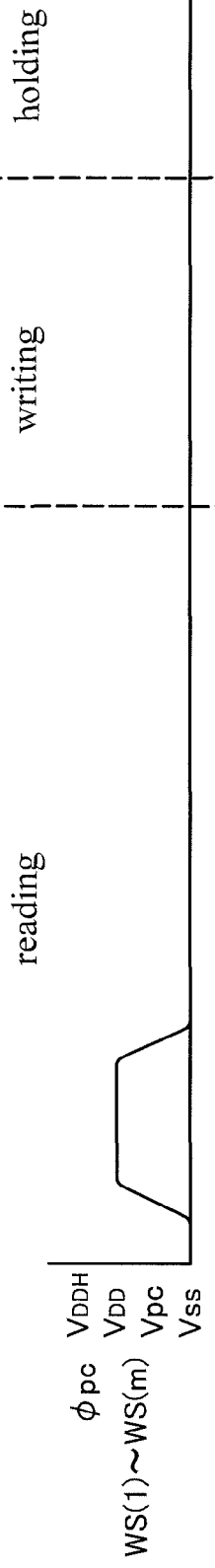
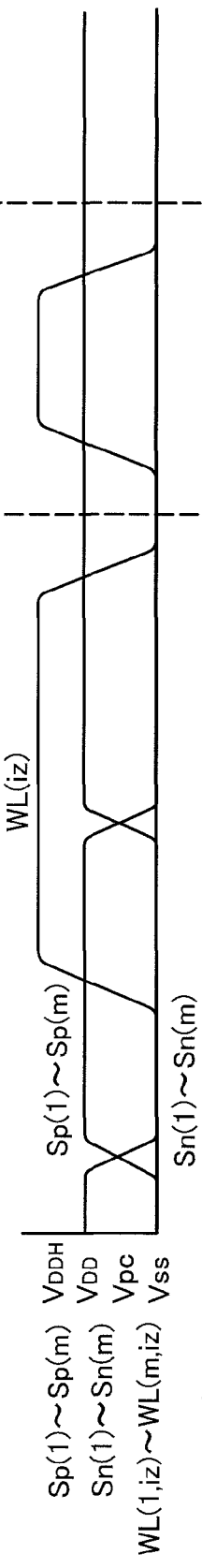
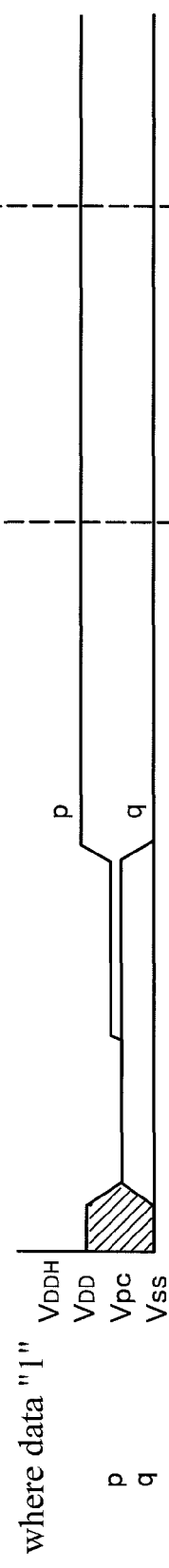
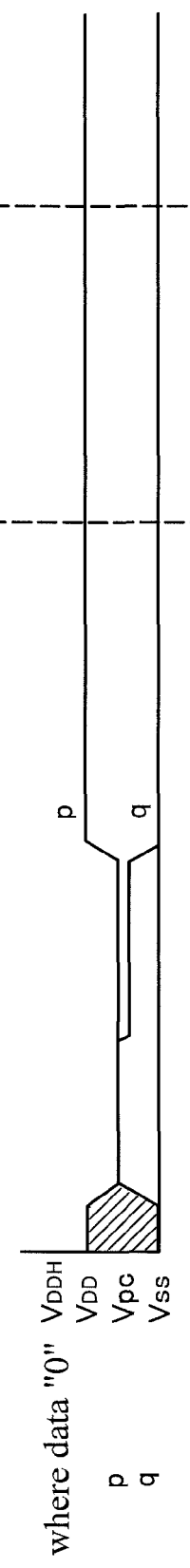

FIG. 16A    FIG. 16B
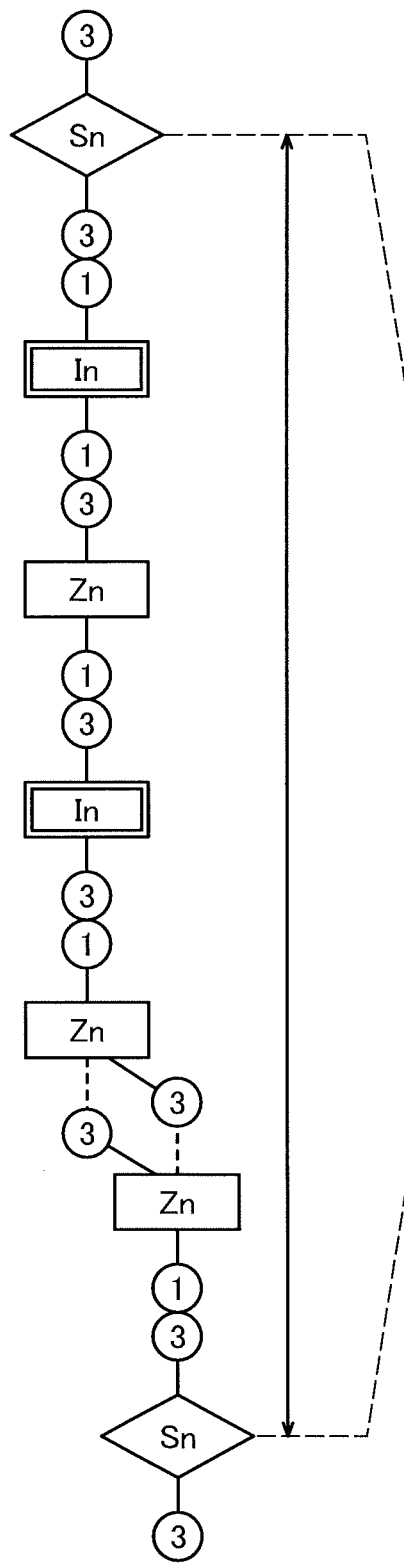
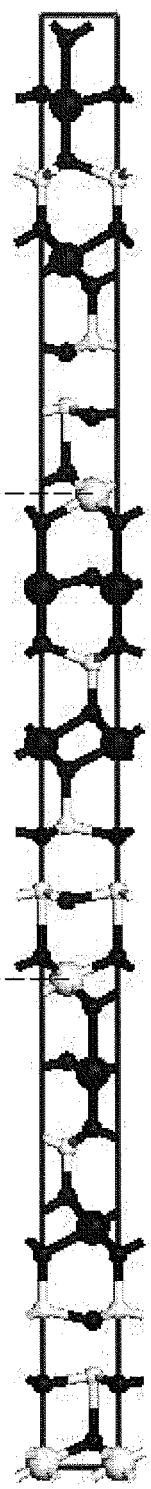
FIG. 16C
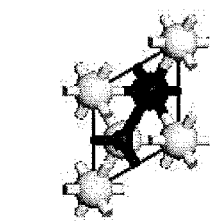
● In
○ Sn
○ Zn
• O FIG. 17A
FIG. 17B
FIG. 17C
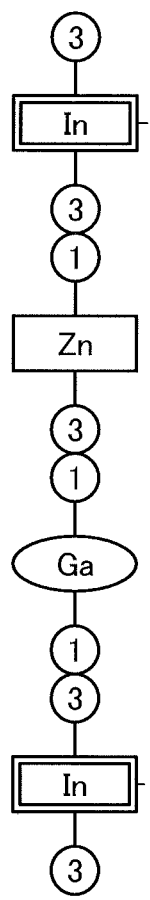
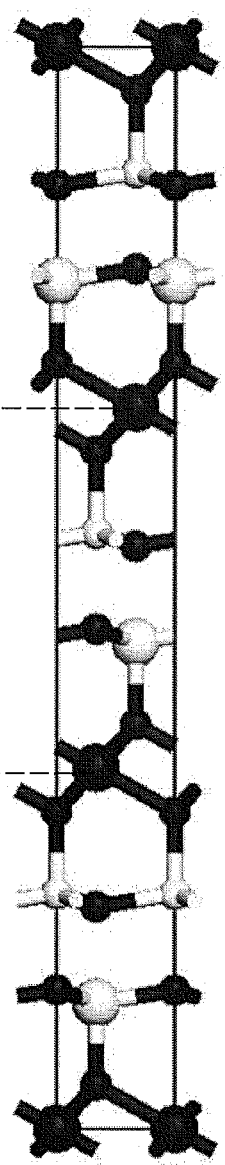
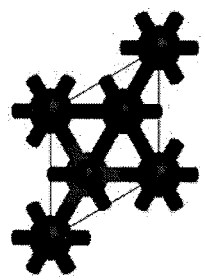
- In
- Ga
- Zn
- O

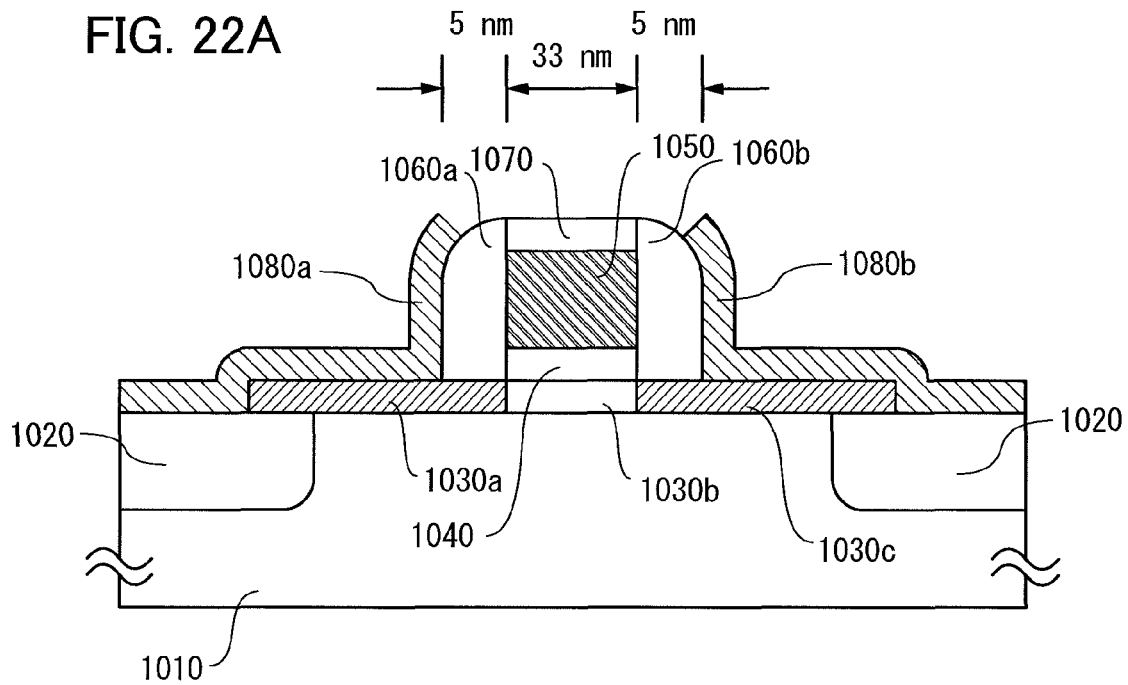
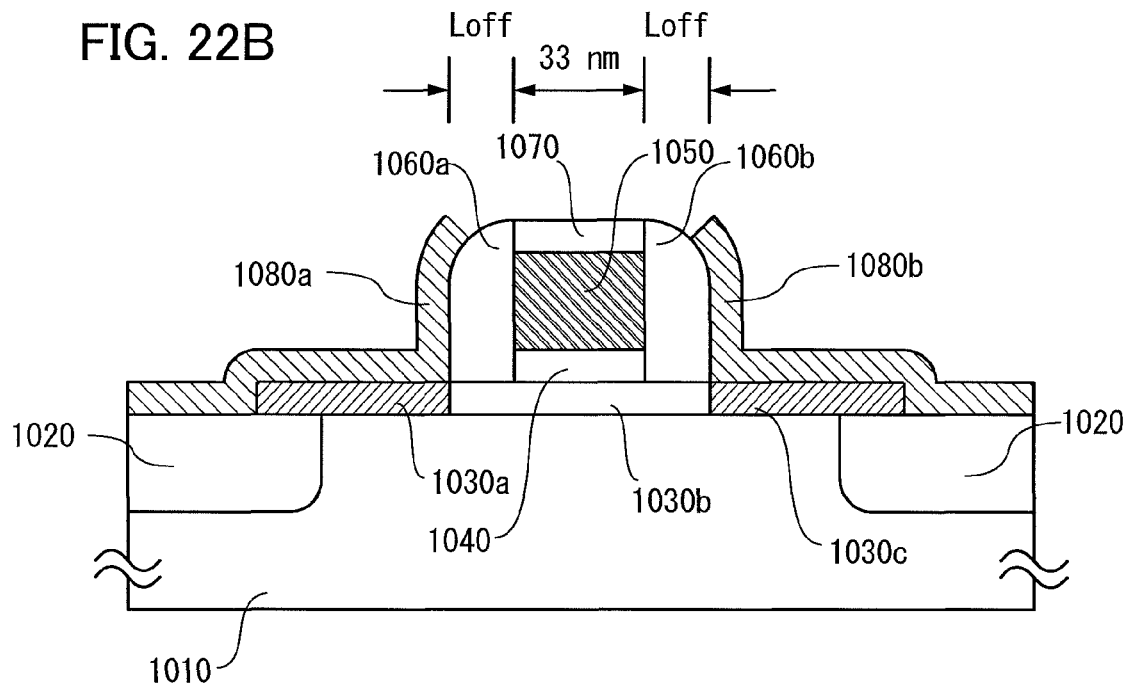

SEMICONDUCTOR DEVICE

TECHNICAL FIELD

The disclosed invention relates to a semiconductor device using a semiconductor element and a method for driving the semiconductor device.

BACKGROUND ART

Memory devices using semiconductor elements are broadly classified into two categories: a volatile device that loses stored data when power supply stops, and a non-volatile device that retains stored data even when power is not supplied.

A typical example of a volatile memory device is a dynamic random access memory (DRAM). A DRAM stores data in such a manner that a transistor included in a storage element is selected and electric charge is accumulated in a capacitor.

When data is read from a DRAM, charge in a capacitor is lost according to the above-described principle; thus, another writing operation is necessary whenever data is read out. Moreover, since leakage current (off-state current) or the like flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional memory device using a magnetic material or an optical material is needed in order to hold the data for a long time.

Another example of a volatile memory device is a static random access memory (SRAM). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding electric charge in the floating gate. Therefore, a flash memory has advantages in that the data holding period is extremely long (almost permanent) and refresh operation which is necessary in a volatile memory device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary in order to inject charge into the floating gate or remove the charge, and a circuit for generating high voltage is also necessary. Further, it takes a relatively long time to inject or remove charge, and it is not easy to perform writing and erasing at higher speed.

Another example of a non-volatile memory device is a magnetoresistive random access memory (MRAM) which is a memory device including a magnetic material. An MRAM consumes a comparatively large amount of current in writing operation; therefore, there is a problem in that it is difficult for an MRAM to perform writing operation in a plurality of memory cells at concurrently.

REFERENCE

Patent Document

[Patent Document 1] Japanese Published Patent Application No. S57-105889

DISCLOSURE OF INVENTION

In view of the foregoing problems, an object of one embodiment of the disclosed invention is to provide a semiconductor device with a novel structure in which stored data can be retained even when power is not supplied and which does not have a limitation on the number of writing operations.

In one embodiment of the present invention, a memory circuit is formed using a material which allows a sufficient reduction in the off-state current of a transistor, e.g., an oxide semiconductor material which is a wide bandgap semiconductor. When a semiconductor material which allows a sufficient reduction in the off-state current of a transistor is used for a memory circuit, stored data can be held for a long time. In addition, a peripheral circuit such as a driver circuit or a control circuit is formed using a semiconductor material other than an oxide semiconductor. When a semiconductor material other than oxide semiconductor, which allows higher speed operation than an oxide semiconductor material, is used for a peripheral circuit, a memory circuit can be operated at high speed.

One embodiment of the present invention is a semiconductor device including a sense latch array provided using a semiconductor substrate and a memory cell array provided over the sense latch array. The sense latch array includes a plurality of sense latches arranged in matrix. The memory cell array includes a plurality of memory cells arranged in matrix. Each of the plurality of memory cells includes a transistor including a gate electrode, a source electrode, a drain electrode, a gate insulating layer, and an oxide semiconductor layer, and a capacitor. At least one of a first terminal and a second terminal of each of the sense latches is electrically connected to the source electrode or the drain electrode of the corresponding transistor provided over the sense latch.

Another embodiment of the present invention is a semiconductor device including a sense latch array provided using a semiconductor substrate and a plurality of memory cell arrays stacked over the sense latch array. The sense latch array includes a plurality of sense latches arranged in matrix. Each of the plurality of memory cell arrays includes a plurality of memory cells arranged in matrix. Each of the plurality of memory cells includes a transistor including a gate electrode, a source electrode, a drain electrode, a gate insulating layer, and an oxide semiconductor layer, and a capacitor. At least one of a first terminal and a second terminal of each of the sense latches is electrically connected to the source electrode or the drain electrode of the corresponding transistor in each of the plurality of memory cell arrays, which is provided over the sense latch.

Each of the above semiconductor devices may further include a first word line driver circuit, a second word line driver circuit, and a data line driver circuit. The first word line driver circuit may be electrically connected to the plurality of memory cells through first word lines. The second word line driver circuit may be electrically connected to the plurality of sense latches through second word lines. The data line driver circuit may be electrically connected to the plurality of sense latches through first data lines and second data lines.

Another embodiment of the present invention is a semiconductor device including a sense latch array provided using a semiconductor substrate and a first memory cell array and a second memory cell array stacked over the sense latch array. The sense latch array includes a plurality of sense latches arranged in matrix. Each of the first memory cell array and the second memory cell array includes a plurality of memory cells arranged in matrix. Each of the plurality of memory cells included in the first memory cell array includes a first transistor including a first gate electrode, a first source electrode, a first drain electrode, a first gate insulating layer, and a first oxide semiconductor layer, and a first capacitor. Each of the plurality of memory cells included in the second memory cell array includes a second transistor including a second gate electrode, a second source electrode, a second drain electrode, a second gate insulating layer, and a second oxide semiconductor layer, and a second capacitor. At least one of a first terminal and a second terminal of each of the sense latches is electrically connected to the first source electrode or the first drain electrode of the corresponding first transistor and the second source electrode or the second drain electrode of the corresponding second transistor, which are provided over the sense latch.

The above semiconductor device may further include a first word line driver circuit, a second word line driver circuit, and a data line driver circuit. The first word line driver circuit may be electrically connected to each of the plurality of memory cells included in the first memory cell array and the second memory cell array through first word lines. The second word line driver circuit may be electrically connected to the plurality of sense latches through second word lines. The data line driver circuit may be electrically connected to the plurality of sense latches through first data lines and second data lines.

Further, in the above semiconductor device, it is preferable that the first oxide semiconductor layer and the second oxide semiconductor layer include the same oxide semiconductor material.

Furthermore, in the above semiconductor device, it is preferable that the semiconductor substrate include a semiconductor material other than the material for the oxide semiconductor layers.

Note that although the transistor may be formed using an oxide semiconductor material in any of the above-described semiconductor devices, the disclosed invention is not limited thereto. A material which can realize the off current characteristics equivalent to those of the oxide semiconductor material, such as a wide bandgap material like silicon carbide (more specifically, a semiconductor material with an energy gap Eg of greater than 3 eV) may be used.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are simply used for convenience of explanation.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on "an object having any electric function" as long as electric signals can be transmitted and received between components that are connected through the object.

Since the off-current of a transistor including an oxide semiconductor material is extremely small, stored data can be retained for an extremely long time by using the transistor for a memory circuit. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, a memory circuit including a transistor including an oxide semiconductor material does not need high voltage for data writing and does not have a problem of deterioration of a memory element. For example, unlike a conventional non-volatile memory device, it is not necessary to inject and extract electrons into and from a floating gate, and thus a problem such as deterioration of a gate insulating layer does not arise at all. In other words, the memory circuit including a transistor including an oxide semiconductor material does not have the limitation on the number of writing, which is a problem of a conventional non-volatile memory device, and reliability thereof is markedly improved. Furthermore, data is written depending on the on state and the off state of the transistor, whereby high-speed operation can be easily realized. In addition, there is an advantage that operation for erasing data is not needed.

Further, a transistor including a semiconductor material other than an oxide semiconductor can perform operation much higher than a transistor including an oxide semiconductor material. Therefore, when a transistor including a semiconductor material other than an oxide semiconductor is used for a peripheral circuit (e.g., a control circuit or a driver circuit), a peripheral circuit which performs operation at sufficiently high speed can be favorably realized. Accordingly, when such a peripheral circuit is combined with a memory circuit including a transistor including an oxide semiconductor material, operation (e.g., data reading operation or data writing operation) of the semiconductor device can be performed at sufficiently high speed.

A semiconductor device having a novel feature can be realized by being provided with both a peripheral circuit including a transistor including a semiconductor material other than an oxide semiconductor (in other words, a transistor capable of operating at sufficiently high speed) and a memory circuit including a transistor including an oxide semiconductor material (in a broader sense, a transistor whose off-state current is sufficiently small).

BRIEF DESCRIPTION OF DRAWINGS

In the accompanying drawings:

FIGS. 4A to 4D are timing diagrams;

FIGS. 5A to 5D are timing diagrams;

FIGS. 16A to 16C are views illustrating a crystal structure of an oxide material;

FIGS. 17A to 17C are views illustrating a crystal structure of an oxide material;

FIGS. 22A and 22B illustrate cross-sectional structures of transistors which are used in calculation;

BEST MODE FOR CARRYING OUT THE INVENTION

Figure 1A:
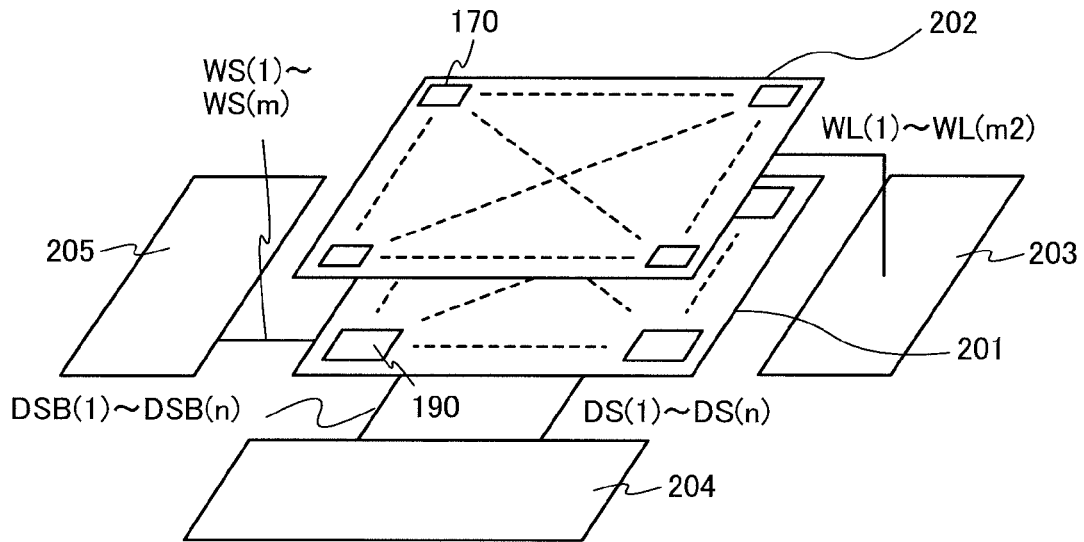
FIGS. 1A and 1B are each a schematic view of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

Structures of semiconductor devices according to one embodiment of the present invention will be described with reference to FIGS. 1A and 1B, FIG. 2, FIG. 3, FIGS. 4A to 4D, FIGS. 5A to 5D, and FIG. 6.

<Structure of Semiconductor Device>

Figure 1B:
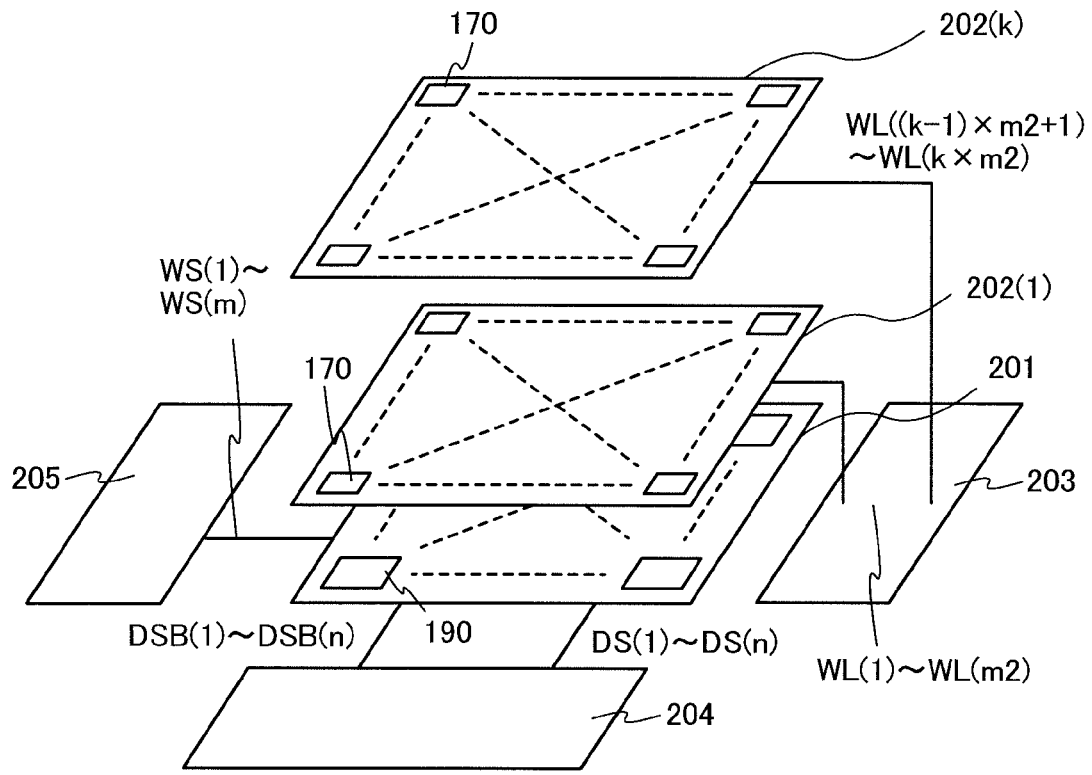

FIGS. 1A and 1B are each a schematic view illustrating an example of a structure of a semiconductor device according to one embodiment of the present invention. The semiconductor device according to one embodiment of the present invention has a stacked structure and includes a memory circuit in an upper portion and a peripheral circuit including a driver circuit, a control circuit, and the like, which needs to operate at high speed for driving the memory circuit, in a lower portion. Note that the driver circuit or the control circuit may be a logic circuit. The driver circuit or the control circuit may include an analog circuit or an arithmetic circuit.

The semiconductor device illustrated in FIG. 1A includes a sense latch array 201 including a plurality of sense latches 190 arranged in matrix in a lower portion, and a memory cell array 202 (also referred to as a memory circuit) including a plurality of memory cells 170 (also referred to as memory elements) arrange in matrix in an upper portion. In addition to the sense latch array 201, peripheral circuits such as a first word line driver circuit 203, a data line driver circuit 204, a second word line driver circuit 205, and the like are provided in the lower portion. Note that except for the sense latch array 201, the first word line driver circuit 203, the data line driver circuit 204, and the second word line driver circuit 205 are also referred to as external circuits.

The data line driver circuit 204 includes a reading circuit and a writing circuit. Further, the data line driver circuit 204 is connected to the plurality of sense latches 190 included in the sense latch array 201 through n first data lines DS(1) to DS(n) and n second data lines DSB(1) to DSB(n). The data line driver circuit 204 selects a predetermined column including the sense latches 190 from the sense latch array 201 in accordance with an address signal. The reading circuit receives output signals of the sense latches 190 in the selected column as input signals, and reads out data stored in the sense latches 190. The writing circuit outputs a signal corresponding to data to be written to the sense latches 190 in the selected column. Note that the data line driver circuit 204 may include a precharge circuit. The precharge circuit supplies a predetermined potential (precharge potential $V_{pc}$) to an input/output terminal of sense latches in a selected column.

The first word line driver circuit 203 is connected to the plurality of memory cells 170 included in the memory cell array 202 through m2 first word lines WL(1) to WL(m2). The first word line driver circuit 203 selects a predetermined row including the memory cells 170 of the memory cell array 202, in accordance with an address signal. One row or a plurality of rows may be selected.

The second word line driver circuit 205 is connected to the plurality of sense latches 190 included in the sense latch array 201 through m second word lines WS(1) to WS(m). The second word line driver circuit 205 selects a predetermined row including the sense latches 190 from the sense latch array 201, in accordance with an address signal. One row or a plurality of rows may be selected.

FIG. 1B illustrates an example of a semiconductor device which is partly different from the semiconductor device illustrated in FIG. 1A. The semiconductor device illustrated in FIG. 1B includes the sense latch array 201 including the plurality of sense latches 190 arranged in matrix in a lower portion and a plurality of memory cell arrays 202(1) to 202(k) each including the plurality of memory cells 170 arranged in matrix in an upper portion. In addition to the sense latch array 201, peripheral circuits such as the first word line driver circuit 203, the data line driver circuit 204, the second word line driver circuit 205, and the like are provided in the lower portion. Note that in the semiconductor device illustrated in FIG. 1B, a first layer is the sense latch array 201, a second layer is the memory cell array 202(1), and a (k+1)-th layer is the memory cell array 202(k). Here, k is a natural number.

The data line driver circuit 204 includes a reading circuit and a writing circuit. Further, the data line driver circuit 204 is connected to the plurality of sense latches 190 included in the sense latch array 201 through the n first data lines DS(1) to DS(n) and the n second data lines DSB(1) to DSB(n). The data line driver circuit 204 selects a predetermined column including the sense latches 190 from the sense latch array 201 in accordance with an address signal. The reading circuit receives output signals of the sense latches 190 in the selected column as input signals, and reads out data stored in the sense latches 190. The writing circuit outputs a signal corresponding to data to be written to the sense latches 190 in the selected column Note that the data line driver circuit 204 may include a precharge circuit. The precharge circuit supplies a predetermined potential (precharge potential $V_{pc}$) to an input/output terminal of sense latches in a selected column.

The first word line driver circuit 203 is connected to the plurality of memory cells 170 included in each of the memory cell arrays 202(1) to 202(k) through k×m2 first word lines WL(1) to WL(k×m2). The first word line driver circuit 203 selects a predetermined memory cell array from the memory cell arrays 202(1) to 202(k) in accordance with an address signal for selecting a layer, and selects a predetermined row including the memory cells 170 of the memory cell array in the selected layer in accordance with an address signal for selecting a row. One row or a plurality of rows of the memory cells 170 may be selected.

The second word line driver circuit 205 is connected to the plurality of sense latches 190 included in the sense latch array 201 through m second word lines WS(1) to WS(m). The second word line driver circuit 205 selects a predetermined row including the sense latches 190 from the sense latch array 201 in accordance with an address signal. One row or a plurality of rows may be selected.

<Structures of Memory Cell and Sense Latch>

Figure 2:
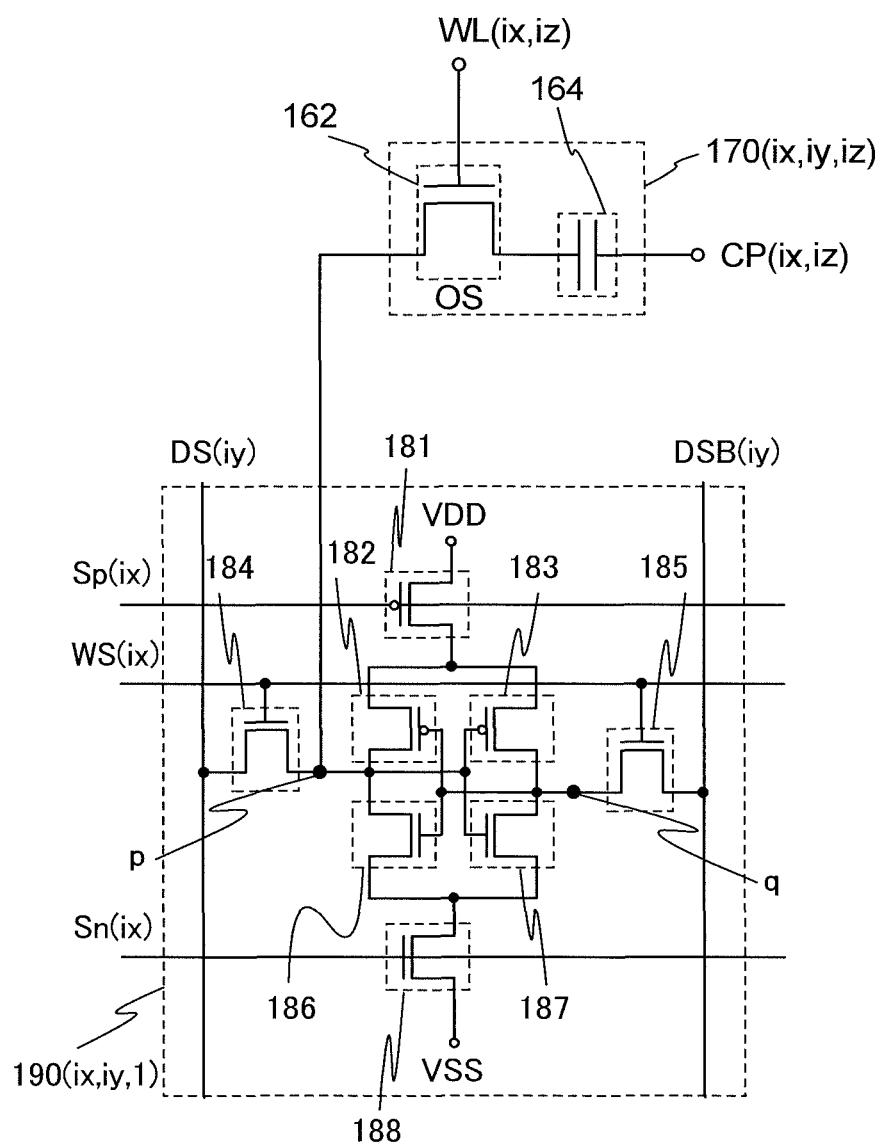
FIG. 2 is a circuit diagram of a semiconductor device.

FIG. 2 illustrates a circuit configuration of the memory cell 170($ix,iy,iz$) in an ix-th row and an iy-th column of the memory cell array 202($iz$) in an (iz+1)-th layer and the sense latch 190 (ix,iy,1) in the ix-th row and the iy-th column of the sense latch array 201 in a first layer in the semiconductor device illustrated in FIG. 1A and FIG. 1B.

The memory cell 170($ix,iy,iz$) illustrated in FIG. 2 includes a transistor 162 including an oxide semiconductor material and a capacitor 164. Note that a mark "OS" is added in FIG. 2 to show that the transistor 162 includes an oxide semiconductor material.

In the memory cell 170($ix,iy,iz$) illustrated in FIG. 2, a first word line WL(ix,iz) is electrically connected to a gate electrode of the transistor 162, a capacitor line CP(ix,iz) is electrically connected to one terminal of the capacitor 164, the other terminal of the capacitor 164 is electrically connected to a source electrode or a drain electrode of the transistor 162, and the source electrode or the drain electrode of the transistor 162 is electrically connected to a node p of the sense latch 190($ix,iy$,1). Note that the first word line WL(ix,iz) is a first word line WL in the ix-th row in the memory cell array 202($iz$) and the capacitor line CP(ix,iz) is a capacitor line CP in the ix-th row in the memory cell array 202($iz$).

The sense latch 190($ix,iy$,1) illustrated in FIG. 2 includes transistors 181 to 188 which are formed using a semiconductor material other than an oxide semiconductor. As the semiconductor material other than an oxide semiconductor, silicon or the like can be used, for example. The transistors 181 to 183 are p-channel transistors and the transistors 184 to 188 are n-channel transistors.

In the sense latch 190($ix,iy$,1) illustrated in FIG. 2, a first data line DS(iy) is electrically connected to a source electrode or a drain electrode of the transistor 184, and a second data line DSB(iy) is electrically connected to a source electrode or a drain electrode of the transistor 185. A signal line Sp(ix) is electrically connected to a gate electrode of the transistor 181. A second word line WS(ix) is electrically connected to a gate electrode of the transistor 184 and a gate electrode of the transistor 185. A signal line Sn(ix) is electrically connected to a gate electrode of the transistor 188.

A CMOS circuit A is formed with the transistor 182 which is a p-channel transistor and the transistor 186 which is an n-channel transistor. Similarly, a CMOS circuit B is formed with the transistor 183 which is a p-channel transistor and the transistor 187 which is an n-channel transistor. An output terminal of the CMOS circuit A is connected to an input terminal of the CMOS circuit B and the source electrode or the drain electrode of the transistor 185, and an input terminal of the CMOS circuit A is connected to an output terminal of the CMOS circuit B and the source electrode or the drain electrode of the transistor 184. Further, a source electrode of the transistor 182 and a source electrode of the transistor 183 are connected to a drain electrode of the transistor 181, and a source electrode of the transistor 186 and a source electrode of the transistor 187 are connected to a drain electrode of the transistor 188.

Here, a node between the output terminal of the CMOS circuit A and the source electrode or the drain electrode of the transistor 184 is the node p. A node between the output terminal of the CMOS circuit B and the source electrode or the drain electrode of the transistor 185 is a node q.

Although the case where the memory cell 170($ix,iy,iz$) is connected to the node p of the sense latch 190($ix,iy$,1) is described with reference to FIG. 2, the memory cell 170 may be connected to the node q of the sense latch 190($ix,iy$,1) or the memory cell 170 may be connected to the node p and the node q of the sense latch 190($ix,iy$,1). When memory cells are connected to the node p and the node q of the sense latch 190($ix,iy$,1), the integration degree of the memory cell array 202 can be increased.

Further, although FIG. 2 illustrates the case where the memory cell 170($ix,iy,iz$) is connected to the node p of the sense latch 190($ix,iy$,1), one embodiment of the present invention is not limited thereto. A plurality of memory cells may be connected to the node p of the sense latch 190($ix,iy$,1). For example, in the case where a plurality of memory cell arrays are stacked over the sense latch array 201, each of memory cells included in the plurality of memory cell arrays can be connected to the node p of the sense latch 190($ix,iy$,1). Specifically, in the case where iz memory cell arrays are stacked, each of memory cells 170($ix,iy$,2) to 170($ix,iy,iz$+1) can be connected to the node p of the sense latch 190($ix,iy$,1). Note that the same can be applied to the node q.

Next, writing and holding data in the memory cell 170($ix, iy,iz$) illustrated in FIG. 2 will be described.

First, the potential of the first word line WL(ix,iz) is set to a potential at which the transistor 162 is turned on, and the transistor 162 is turned on. Accordingly, the potential of the node p of the sense latch 190($ix,iy$,1) is supplied to a first terminal of the capacitor 164 (writing). After that, the potential of the first word line WL(ix,iz) is set to a potential at which the transistor 162 is turned off, and the transistor 162 is turned off. Thus, the potential of the first terminal of the capacitor 164 (or charge accumulated in the capacitor 164) is held (holding).

The transistor 162 includes an oxide semiconductor material in a channel formation region. A transistor including an oxide semiconductor material in a channel formation region has a characteristic of a significantly small off-state current. For that reason, when the transistor 162 is in an off state, a potential of the first terminal of the capacitor 164 (or charge accumulated in the capacitor 164) can be held for an extremely long time. Further, in the transistor 162 including an oxide semiconductor material in a channel formation region, a short channel effect is not likely to be caused, which is advantageous.

Next, reading of data held in the memory cell 170($ix,iy,iz$) will be described. First, the potential of the first word line WL(ix,iz) is set to a potential at which the transistor 162 is turned on, and the transistor 162 is turned on. Accordingly, the node p in a floating state and the capacitor 164 are electrically connected to each other, and the charge is redistributed between the node p and the capacitor 164. As a result, the potential of the node p is changed. The amount of change in potential of the node p varies depending on the potential of the first terminal of the capacitor 164 (or charge accumulated in the capacitor 164).

For example, the potential $V_p$ of the node p after charge redistribution is $(C_B \times V_{B0} + C \times V)/(C_B + C)$, where V is the potential of the first terminal of the capacitor 164, C is the capacitance of the capacitor 164, $C_B$ is the capacitance of the node p (hereinafter also referred to as a node p capacitance), and $V_{B0}$ is the potential of the node p before the charge redistribution. Therefore, it can be found that assuming that the memory cell 170($ix,iy,iz$) is in either of two states in which the potentials of the first terminal of the capacitor 164 are $V_1$ and $V_0$ ($V_1 > V_0$), the potential $V_{p1}$ of the node p in the case of holding the potential $V_1$ ($=(C_B \times V_{B0} + C \times V_1)/(C_B + C)$) is higher than the potential $V_{p0}$ of the node p in the case of holding the potential $V_0$ ($=(C_B \times V_{B0} + C \times V_0)/(C_B + C)$).

Then, by comparing the potential of the node p with a predetermined potential, data can be read. In the sense latch 190($ix,iy$,1), the potential $V_p$ of the node p is compared with the potential $V_q$ of the node q. The potential $V_q$ of the node q may be a value between the potential $V_{p0}$ and $V_{p1}$ of the node p.

Since the off-state current of a transistor including an oxide semiconductor material is extremely small, stored data can be held for an extremely long time by using the transistor for a memory cell. In other words, power consumption can be adequately reduced because refresh operation becomes unnecessary or the frequency of refresh operation can be extremely low. Moreover, stored data can be held for a long time even when power is not supplied (note that a potential is preferably fixed). Thus, additional memory device including a magnetic material or an optical material is unnecessary, so that size reduction of a semiconductor device can be achieved.

Further, a memory cell including a transistor including an oxide semiconductor material does not need high voltage for data writing and does not have a problem of deterioration of a memory cell. For example, unlike a conventional non-volatile memory device, it is not necessary to inject and extract electrons into and from a floating gate, and thus a problem such as deterioration of a gate insulating layer does not arise at all. In other words, the memory cell including a transistor including an oxide semiconductor material does not have the limitation on the number of writing, which is a problem of a conventional non-volatile memory device, and reliability thereof is markedly improved. Furthermore, data is written depending on the on state and the off state of the transistor, whereby high-speed operation can be easily realized. In addition, there is an advantage that operation for erasing data is not needed.

Further, a transistor including a semiconductor material other than an oxide semiconductor can perform operation much higher than a transistor including an oxide semiconductor material. Accordingly, when a sense latch including a transistor including a semiconductor material other than an oxide semiconductor is combined with a memory cell including a transistor including an oxide semiconductor material, operation (e.g., data reading operation or data writing operation) of the semiconductor device can be performed at sufficiently high speed.

<Driving Method of Semiconductor Device>

Next, as for the semiconductor device illustrated in FIG. 2, reading of data from a memory cell array to a sense latch array, writing of data to the memory cell array from the sense latch array, and holding of data of the memory cell array will be described with reference to FIG. 3, FIGS. 4A to 4D, FIGS. 5A to 5D, and FIG. 6. Note that it is assumed that a memory cell is in either of two states of holding a potential $V_{DD}$ and a potential $V_{SS}$ at a first terminal of a capacitor, and a state in which the potential $V_{DD}$ is held is data "1" and a state in which the potential $V_{SS}$ is held is data "0".

Figure 3:
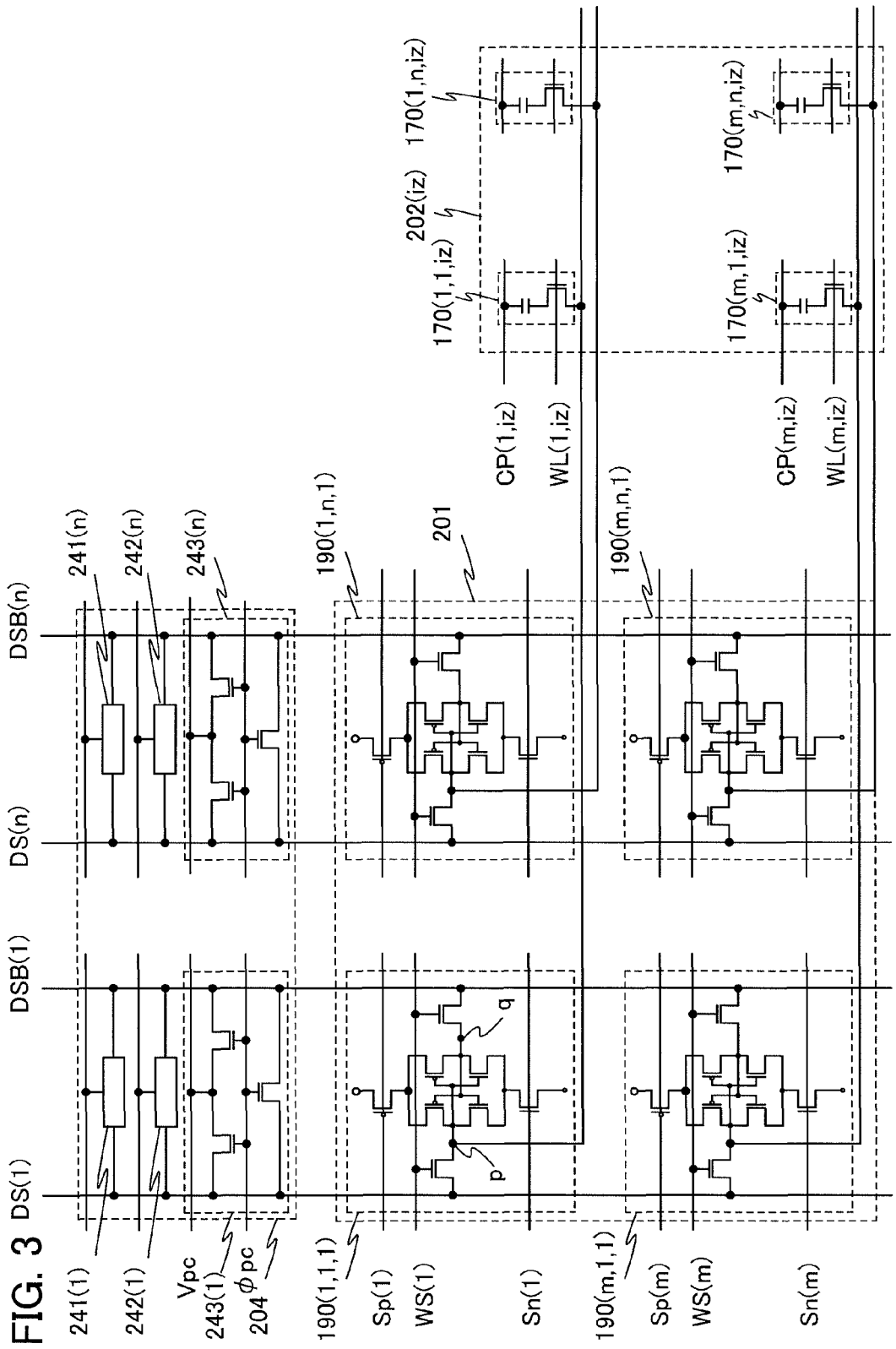
FIG. 3 is a circuit diagram of a semiconductor device.

FIG. 3 illustrates the data line driver circuit 204, the sense latch array 201, and the memory cell array 202($iz$). FIG. 3 illustrates part of the semiconductor device illustrated in FIG. 1B. The memory cell array 202($iz$) includes m first word lines WL(1,iz) to WL(m,iz), m capacitor lines CP(1,iz) to CP(m, iz), and memory cells 170(1,1,$iz$) to 170($m,n,iz$) arranged in matrix of m (in a vertical direction)×n (in a horizontal direction). Further, the sense latch array 201 includes in signal lines Sp(1) to Sp(m), m signal lines Sn(1) to Sn(m), m second word line WS(1) to WS(m), and sense latches 190(1,1,1) to 190($m,n$,1) arranged in matrix of m (in a vertical direction)×n (in a horizontal direction). Note that here, the number of the first word lines and the number of the second word lines are m, which are equal (m2 in FIG. 1B is m in FIG. 3). Note that a signal line may serve as the capacitor lines CP(1,iz) to CP(m,iz).

The memory cell 170($ix,iy,iz$) in the ix-th row and the iy-th column in the memory cell array 202($iz$) in the (1+iz)-th layer is connected to the node p of the sense latch 190($ix,iy$,1) in the ix-th row and the iy-th column in the sense latch array 201 in the first layer. The same can be applied to other memory cells and sense latches.

Further, the data line driver circuit 204 is connected to the sense latch array 201 through the first data lines DS(1) to DS(n) and the second data lines DSB(1) to DSB(n). The data line driver circuit 204 includes a signal line φpc, n reading circuits 241(1) to 241(n), n writing circuits 242(1) to 242(n), and n precharge circuits 243(1) to 243(n). For example, in the iy-th column, the reading circuit 241(iy), the writing circuit 242(iy), the precharge circuit 243(iy), and the sense latches 190(1,iy,1) to 190(m,iy,1) are electrically connected to one another through the first data line DS(iy) and the second data line DSB(iy).

Here, the case where data is read from, written to, and held in the memory cells 170(ix,1,iz) to 170(ix,n,iz) in the ix-th row in the memory cell array 202(iz) in the (iz+1)-th layer will be described with reference to timing diagrams in FIGS. 4A to 4D.

FIG. 4A is a timing diagram of the signal line φpc and the second word line WS(ix). FIG. 4B is a timing diagram of the signal line Sp(ix), the signal line Sn(ix), and the first word line WL(ix,iz). FIG. 4C is a timing diagram of the node p and the node q connected to the memory cells 170 in the case where data "1" is read or written. FIG. 4D is a timing diagram of the node p and the node q connected to the memory cells 170 in the case where data "0" is read or written.

In the memory cell array 202(iz), when data is read from the memory cells 170(ix,1,iz) to 170(ix,n,iz) in the ix-th row, first, the potential $V_{DD}$ is supplied to the signal line Sp(ix) and the potential $V_{SS}$ is supplied to the signal line Sn(ix), so that the sense latches 190(ix,1,1,) to 190(ix,n,1) in the ix-th row are deactivated.

The potential $V_{pc}$ is supplied to the node p and the node q of each of the sense latches 190(ix,1,1) to 190(ix,n,1) in the ix-th row; thus, precharge is performed. For example, the potential $V_{DD}$ is supplied to the signal line φpc and the potential $V_{DD}$ is supplied to the second word line WS(ix), so that the potential $V_{pc}$ is supplied to the node p and the node q of each of the sense latches 190(ix,1,1) to 190(ix,n,1). The potential $V_1$ is ($V_{DD}/2$), for example. Then, the potential $V_{SS}$ is supplied to the signal line φpc and the second word line WS(ix); thus, precharge is completed.

Next, the first word line WL(ix,iz) in the ix-th row is activated; thus, the transistor of each of the memory cells 170(ix,1,iz) to 170(ix,n,iz) is turned on. Here, the first word line WL(ix,iz) is supplied with the potential $V_{DDH}$ which is higher than the potential $V_{DD}$.

As a result, the potential of the node p connected to the memory cell 170 of the memory cells 170(ix,1,iz) to 170(ix,n,iz), which stores data "1", is slightly increased because charge is distributed between the capacitance of the node p and the capacitor of the memory cell 170. The potential of the node p connected to the memory cell 170 of the memory cells 170(ix,1,iz) to 170(ix,n,iz), which stores data "0", is slightly decreased because charge is distributed between the capacitance of the node p and the capacitor of the memory cell 170.

Next, the sense latches 190(ix,1,1) to 190(ix,n,1) in the ix-th row are activated. Specifically, the potential supplied to the signal line Sn(ix) is changed from the potential $V_{SS}$ to the potential $V_{DD}$, and the potential supplied to the signal line Sp(ix) is changed from the potential $V_{DD}$ to the potential $V_{SS}$.

As a result, the sense latches 190(ix,1,1) to 190(ix,n,1) in the ix-th row are activated and amplify the potential difference between the node p and the node q. The potential of the node p of the sense latch 190, which is connected to the memory cell 170 storing data "1", is slightly higher than the potential of the node q, due to the charge redistribution. Thus, this potential difference is amplified by the sense latch and stored in the sense latch. In other words, the potential $V_{DD}$ is supplied to the node p and the potential $V_{SS}$ is supplied to the node q. Further, the potential of the node p of the sense latch 190, which is connected to the memory cell 170 storing data "0", is slightly lower than the potential of the node q, due to the charge redistribution. Thus, this potential difference is amplified by the sense latch and stored in the sense latch. In other words, the potential $V_{SS}$ is supplied to the node p and the potential $V_{DD}$ is supplied to the node q. Thus, data is read from the memory cells 170(ix,1,iz) to 170(ix,n,iz) to the sense latches 190(ix,1,1) to 190(ix,n,1).

After that, the first word line WL(ix,iz) is deactivated (here, the potential $V_{SS}$ is supplied), so that the transistor of each of the memory cells 170(ix,1,iz) to 170(ix,n,iz) is turned off. At this time, data originally stored in the memory cells 170(ix,1,iz) to 170(ix,n,iz) is stored again in the memory cells 170(ix,1,iz) to 170(ix,n,iz).

As described above, data can be read from the memory cells 170(ix,1,iz) to 170(ix,n,iz) to the sense latches 190(ix,1,1) to 190(ix,n,1).

Next, the case where data stored in the sense latches 190(ix,1,1) to 190(ix,n,1) is written to the memory cells 170(ix,1,iz) to 170(ix,n,iz) in the ix-th row in the memory cell array 202(iz) in the (iz+1)-th layer will be described with reference to the timing diagrams in FIGS. 4A to 4D.

In order that the data stored in the sense latches 190(ix,1,1) to 190(ix,n,1) is written to the memory cells 170(ix,1,iz) to 170(ix,n,iz) in the ix-th row in the memory cell array 202(iz), the first word line WL(ix,iz) in the ix-th row may be activated. Here, the first word line WL(ix,iz) is supplied with the potential $V_{DDH}$ which is higher than the potential $V_{DD}$.

As a result, in the case where data "1" is stored in the sense latch 190, $V_{DD}$ is supplied to the node p and $V_{SS}$ is supplied to the node q. Thus, $V_{DD}$ is supplied to a first terminal of the capacitor of the memory cell 170 connected to the node p of the sense latch 190 which stores data "1". Alternatively, in the case where data "0" is stored in the sense latch 190, $V_{SS}$ is supplied to the node p and $V_{DD}$ is supplied to the node q. Thus, $V_{SS}$ is supplied to the first terminal of the capacitor of the memory cell 170 connected to the node p of the sense latch 190 which stores data "0".

After that, the first word line WL(ix,iz) is deactivated (here, the potential $V_{SS}$ is supplied), so that the transistor of each of the memory cells 170(ix,1,iz) to 170(ix,n,iz) is turned off.

As described above, data can be written to the memory cells 170(ix,1,iz) to 170(ix,n,iz) from the sense latches 190(ix,1,1) to 190(ix,n,1).

In the case where data stored in the memory cells 170(ix,1,iz) to 170(ix,n,iz) is held, the first word line WL(ix,iz) connected to the memory cells 170(ix,1,iz) to 170(ix,n,iz) may be deactivated (here, the potential $V_{SS}$ is supplied). Thus, the transistor of each of the memory cells 170(ix,1,iz) to 170(ix,n,iz) is turned off, so that the potential of the first terminal of the capacitor (or charge accumulated in the capacitor) is held.

Next, the case where data is read from, written to, and held in the memory cells 170(1,1,iz) to 170(m,n,iz) in the first to m-th rows in the memory cell array 202(iz) in the (iz+1)-th layer will be described with reference to timing diagrams in FIGS. 5A to 5D.

FIG. 5A is a timing diagram of the signal line φpc and the second word lines WS(1) to WS(m). FIG. 5B is a timing diagram of the signal lines Sp(1) to Sp(m), the signal lines Sn(1) to Sn(m), and the first word lines WL(1,iz) to WL(m,iz). FIG. 5C is a timing diagram of the node p and the node q connected to the memory cell 170 which stores data "1". FIG. 5D is a timing diagram of the node p and the node q connected to the memory cell 170 which stores data "0".

In order that data is read from the memory cells 170(1,1,iz) to 170(m,n,iz) in the first to m-th rows in the memory cell array 202(iz), first, the potential $V_{DD}$ is supplied to the signal lines Sp(1) to Sp(m) and the potential $V_{SS}$ is supplied to the signal lines Sn(1) to Sn(m), so that the memory cells 170(1,1,iz) to 170(m,n,iz) in the first to m-th rows are deactivated.

Next, the potential $V_{pc}$ is supplied to the node p and the node q of each of the sense latches 190(1,1,1) to 190(m,n,1); thus, precharge is performed. For example, the potential $V_{DD}$ is supplied to the signal line φpc and the potential $V_{DD}$ is supplied to the second word lines WS(1) to WS(m), so that the potential $V_1$ is supplied to the node p and the node q of each of the sense latches 190(1,1,1) to 190(m,n,1). The potential $V_{pc}$ is ($V_{DD}/2$), for example. Then, the potential $V_{SS}$ is supplied to the signal line φpc and the second word lines WS(1) to WS(m); thus, precharge is completed.

Next, the first word lines WL(1,iz) to WL(m,iz) in the first to m-th rows are activated, so that the transistor of each of the memory cells 170(1,1,iz) to 170(m,n,iz) is turned on. Here, the first word lines WL(1,iz) to WL(m,iz) are supplied with the potential $V_{DDH}$ which is higher than the potential $V_{DD}$.

As a result, the potential of the node p connected to the memory cell 170 of the memory cells 170(1,1,iz) to 170(m,n,iz), which stores data "1", is slightly increased because charge is distributed between the capacitance of the node p and the capacitor of the memory cell 170. The potential of the node p connected to the memory cell 170 of the memory cells 170(1,1,iz) to 170(m,n,iz), which stores data "0", is slightly decreased because charge is distributed between the capacitance of the node p and the capacitor of the memory cell 170.

Next, the sense latches 190(1,1,1) to 190(m,n,1) in the first to m-th rows are activated. Specifically, the potential supplied to the signal lines Sn(1) to Sn(m) is changed from the potential $V_{SS}$ to the potential $V_{DD}$, and the potential supplied to the signal lines Sp(1) to Sp(m) is changed from the potential $V_{DD}$ to the potential $V_{SS}$.

As a result, the sense latches 190(1,1,1) to 190(m,n,1) are activated and amplify the potential difference between the node p and the node q. The potential of the node p of the sense latch 190, which is connected to the memory cell 170 storing data "1", is slightly higher than the potential of the node q, due to the charge redistribution. Thus, this potential difference is amplified by the sense latch and stored in the sense latch. In other words, the potential $V_{DD}$ is supplied to the node p and the potential $V_{SS}$ is supplied to the node q. Further, the potential of the node p of the sense latch 190, which is connected to the memory cell 170 storing data "0", is slightly lower than the potential of the node q, due to the charge redistribution. Thus, this potential difference is amplified by the sense latch and stored in the sense latch. In other words, the potential $V_{SS}$ is supplied to the node p and the potential $V_{DD}$ is supplied to the node q. Thus, data is read from the memory cells 170(1,1,iz) to 170(m,n,iz) to the sense latches 190(1,1,1) to 190(m,n,1).

After that, the first word lines WL(1,iz) to WL(m,iz) are deactivated (here, the potential $V_{SS}$ is supplied), so that the transistor of each of the memory cells 170(1,1,iz) to 170(m,n,iz) is turned off. At this time, data originally stored in the memory cells 170(1,1,iz) to 170(m,n,iz) is stored again in the memory cells 170(1,1,iz) to 170(m,n,iz).

As described above, data can be read from the memory cells 170(1,1,iz) to 170(m,n,iz) to the sense latches 190(1,1,1) to 190(m,n,1).

Next, the case where data stored in the sense latches 190(1,1,1) to 190(m,n,1) is written to the memory cells 170(1,1,iz) to 170(m,n,iz) in the first to m-th rows in the memory cell array 202(iz) in the (iz+1)-th layer will be described with reference to the timing diagrams in FIGS. 5A to 5D.

In order that the data stored in the sense latches 190(1,1,1) to 190(m,n,1) is written to the memory cells 170(1,1,iz) to 170(m,n,iz) in the first to m-th rows in the memory cell array 202(iz), the first word lines WLs(1,iz) to WL(m,iz) in the first to m-th rows may be activated. Here, the first word lines WL(1,iz) to WL(m,iz) are supplied with the potential $V_{DDH}$ which is higher than the potential $V_{DD}$.

As a result, in the case where data "1" is stored in the sense latch 190, $V_{DD}$ is supplied to the node p and $V_{SS}$ is supplied to the node q. Thus, $V_{DD}$ is supplied to a first terminal of the capacitor of the memory cell 170 connected to the node p of the sense latch 190 which stores data "1". Alternatively, in the case where data "0" is stored in the sense latch 190, $V_{SS}$ is supplied to the node p and $V_{DD}$ is supplied to the node q. Thus, $V_{SS}$ is supplied to the first terminal of the capacitor of the memory cell 170 connected to the node p of the sense latch 190 which stores data "0".

After that, the first word lines WL(1,iz) to WL(m,iz) are deactivated (here, the potential $V_{SS}$ is supplied), so that the transistor of each of the memory cells 170(1,1,iz) to 170(m,n,iz) is turned off.

As described above, data can be written to the memory cells 170(1,1,iz) to 170(m,n,iz) from the sense latches 190(1,1) to 190(m,n,1).

In the case where data stored in the memory cells 170(1,1,iz) to 170(m,n,iz) is held, the first word lines WL(1,iz) to WL(m,iz) connected to the memory cells 170(1,1,iz) to 170(m,n,iz) may be deactivated (here, the potential $V_{SS}$ is supplied). Thus, the transistor of each of the memory cells 170(1,1,iz) to 170(m,n,iz) is turned off, so that the potential of the first terminal of the capacitor (or charge accumulated in the capacitor) is held.

Figure 6:
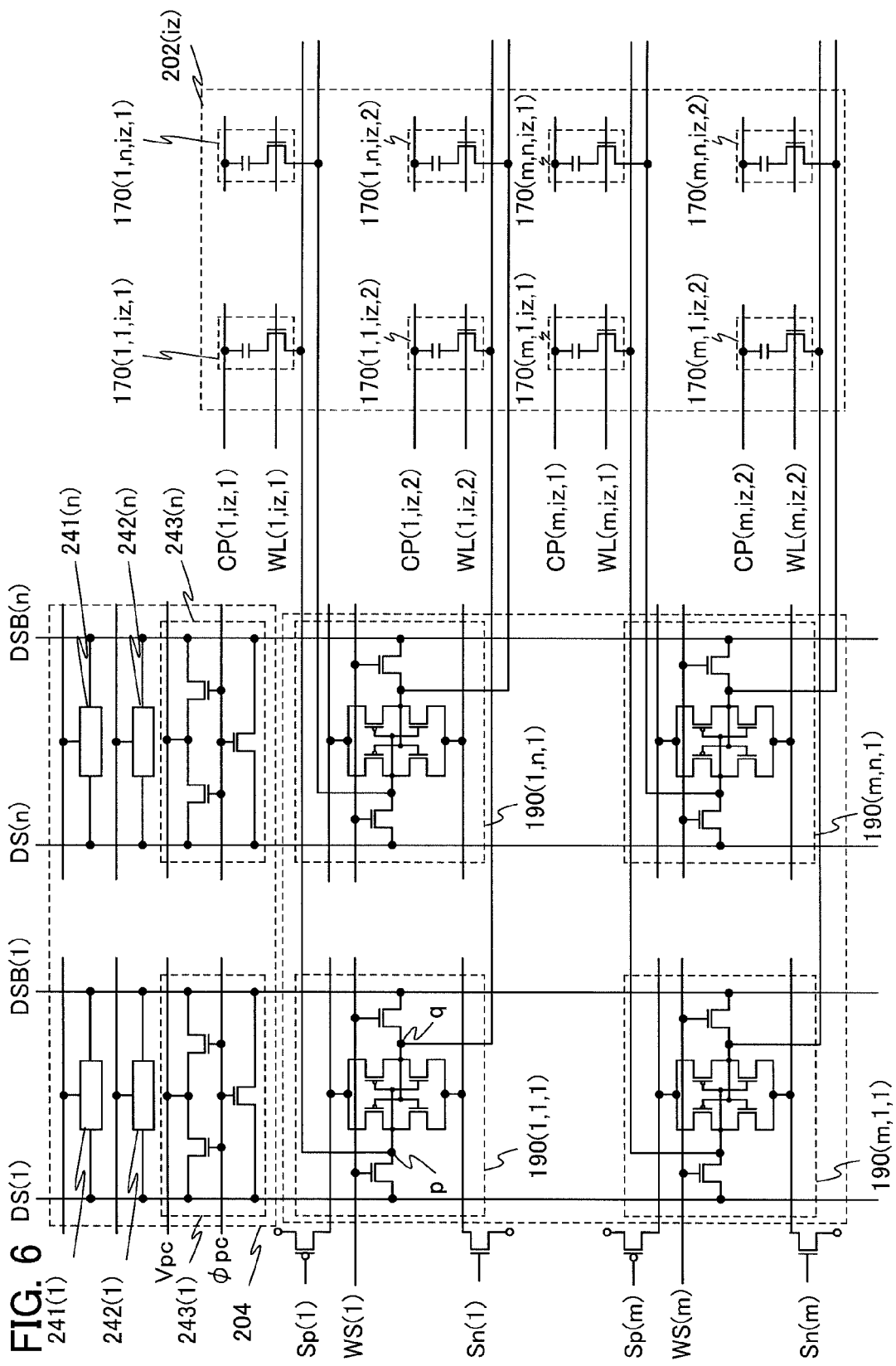
FIG. 6 is a circuit diagram of a semiconductor device.

Next, FIG. 6 illustrates part of the semiconductor device illustrated in FIG. 1B. The sense latch 190 illustrated in FIG. 6 is partly different from the sense latch 190 illustrated in FIG. 3. In other words, the sense latch 190 illustrated in FIG. 3 includes 8 transistors, whereas the sense latch 190 illustrated in FIG. 6 includes 6 transistors. Further, in the sense latch 190 illustrated in FIG. 6, transistors corresponding to the transistors 181 and 188 in FIG. 2 are provided for each row. With such a structure, the area occupied by the sense latch array 201 can be reduced as compared to that in FIG. 3.

Further, memory cells are provided for the node p and the node q, respectively, in the sense latch 190 illustrated in FIG. 6. Thus, the integration of the memory cell array 202 can be higher than that in FIG. 3.

In FIG. 6, the memory cell array 202(iz) includes m first word lines WL(1,iz,1) to WL(m,iz,1) connected to the nodes p, m capacitor lines CP(1,iz,1) to CP(m,iz,1) connected to the nodes p, and memory cells 170(1,1,iz,1) to 170(m,n,iz,1) which are connected to the nodes p and arranged in matrix of m (in a vertical direction)×n (in a horizontal direction). Further, the memory cell array 202(iz) includes m first word lines WL(1,iz,2) to WL(m,iz,2) connected to the nodes q, in capacitor lines CP(1,iz,2) to CP(m,iz,2) connected to the nodes q, and memory cells 170(1,1,iz,2) to 170(m,n,iz,2) which are connected to the nodes q and arranged in matrix of m (in a vertical direction)×n (in a horizontal direction). In other words, the memory cell array 202(iz) includes the m×2 first word lines WL, the m×2 capacitor lines CP, and the (m×2) (in a vertical direction)×n (in a horizontal direction) memory cells 170. Further, the sense latch array 201 includes m signal lines Sp(1) to Sp(m), m signal lines Sn(1) to Sn(m), second word lines WS(1) to WS(m), and sense latches 190(1,1,1) to 190(m,n,1) arranged in matrix of in (in a vertical direction)×n (in a horizontal direction). In other words, here, the number of the first word lines WL is twice the number of the second word lines WS (m2 in FIG. 1B is 2×m in FIG. 6). Note that a signal line may serve as the capacitor lines CP(1,iz,1) to CP(m,iz,1) and CP(1,iz,2) to CP(m,iz,2).

Further, the memory cell 170(*ix,iy,iz,*1) in the ix-th row and the iy-th column in the memory cell array 202(*iz*) in the (1+iz)-th layer is connected to the node p of the sense latch 190(*ix,iy,*1) in the ix-th row and the iy-th column in the sense latch array 201 in the first layer. The memory cell 170(*ix,iy,iz,*2) in the ix-th row and the iy-th column is connected to the node q of the sense latch 190(*ix,iy,*1) in the ix-th row and the iy-th column in the sense latch array 201 in the first layer. The same can be applied to other memory cells and sense latches.

Further, the data line driver circuit 204 is connected to the sense latch array 201 through the first data lines DS(1) to DS(n) and the second data lines DSB(1) to DSB(n). The data line driver circuit 204 includes n reading circuits 241(1) to 241(*n*), n writing circuits 242(1) to 242(*n*), and n precharge circuits 243(1) to 243(*n*). For example, in the iy-th column, the reading circuit 241(*iy*), the writing circuit 242(*iy*), the precharge circuit 243(*iy*), and the sense latches 190(1,*iy*,1) to 190(*m*,iy,1) are electrically connected to one another through the first data line DS(iy) and the second data line DSB(iy).

Operation of the circuit illustrated in FIG. 6 is similar to the operation of the circuit illustrated in FIG. 3. In other words, in the memory cell array 202(*iz*) in the (iz+1)-th layer, in the case where the data is read from, written to, and held in the memory cells 170(*ix,*1,*iz,*1) to 170(*ix,n,iz,*1) in the ix-th row, the timing diagrams in FIGS. 4A to 4D can be applied with the first word line WL(ix,iz) replaced with the first word line WL(ix,iz,1). Further, in the memory cell array 202(*iz*) in the (iz+1)-th layer, in the case where data is read from, written to, and held in the memory cells 170(*ix,*1,*iz,*2) to 170(*ix,n,iz,*2) in the ix-th row, the timing diagrams in FIGS. 4A to 4D can be applied with the first word line WL(ix,iz) replaced with the first word line WL(ix,iz,2).

Further, in the memory cell array 202(*iz*) in the (iz+1)-th layer, in the case where data is read from, written to, and held in the memory cells 170(1,1,*iz,*1) to 170(*m,n,iz,*1) in the first to m-th rows, which are connected to the nodes p, the timing diagrams in FIGS. 5A to 5D can be applied with the first word lines WL(1,iz) to WL(m,iz) replaced with the first word lines WL(1,iz,1) to WL(m,iz,1). Further, in the memory cell array 202(*iz*) in the (iz+1)-th layer, in the case where data is read from, written to, and held in the memory cells 170(1,1,*iz,*2) to 170(*m,n,iz,*2) in the first to m-th rows, which are connected to the nodes q, the timing diagrams in FIGS. 5A to 5D can be applied with the first word lines WL(1,iz) to WL(m,iz) replaced with the first word lines WL(1,iz,2) to WL(m,iz,2).

Note that in this embodiment, the case where the memory cell array 202(*iz*) in the (iz+1)-th layer includes m (rows)×n (columns) memory cells and the case where the memory cell array 202(*iz*) in the (iz+1)-th layer includes (m×2) (rows)×n (columns) memory cells are described. However, the semiconductor device according to one embodiment of the present invention is not limited thereto. In the memory cell array 202(*iz*) in the (iz+1)-th layer, ip memory cells may be connected to a node p of each of sense latches and iq memory cells may be connected to a node q of each of the sense latches (ip and iq are natural numbers). In this case, the number of the first word lines WL connected to the memory cell array 202 (*iz*) in the (iz+1)-th layer is (ip+iq) times the number of the second word lines WS (m2=(ip+iq)×m in FIG. 1B).

As described above, the semiconductor device according to one embodiment of the present invention includes a sense latch array including a semiconductor material other than an oxide semiconductor in a first layer, and a memory cell array including an oxide semiconductor material in a second layer (or second and the following layers), so that a substantially non-volatile memory which can perform writing and reading at high speed can be obtained. In particular, as described above, data can be read from or written to memory cells arranged in parallel with respect to word lines, which are the same number as the number of the sense latches (m (in a vertical direction)×n (in a horizontal direction)); therefore, the reading speed or writing speed per bit, from a memory cell to a sense latch, can be extremely high. Needless to say, operation of writing to a sense latch array from an external circuit and operation of reading from a sense latch array to an external circuit can also be performed at high speed.

Further, a memory cell including a transistor including an oxide semiconductor can perform writing operation per bit at extremely high speed as compared to a conventional flash memory, due to difference in operating principles. For example, when a conventional flash memory is used for a memory circuit and one memory cell is focused, in the case where writing is performed using tunneling current, high-speed operation is difficult because charges are injected and released using a minute amount of current. In the case where hot-electron writing is performed, writing can be performed at higher speed; however, a large amount of current is consumed, and thus, it is difficult to perform writing of a large number of bits at once. Further, in either case, a high potential is required for wiring operation; accordingly, a booster circuit for generating a high potential is required. Moreover, an MRAM which is a memory device including a magnetic material has a problem in that it consumes a comparatively large amount of current in writing operation. Accordingly, in the case where an MRAM is used for a memory circuit and writing of a large number of bits is performed at once, there is a problem in that an extremely large amount of current is consumed.

On the contrary, a memory cell including a transistor including an oxide semiconductor does not require high voltage at which tunneling current flows, and consumes an extremely small amount of current. Accordingly, a semiconductor device according to one embodiment of the present invention can perform writing of bits which are the same number as the sense latch array 201 in the first layer to the memory cell array 202 in an upper layer at once. Thus, a memory cell array in which writing speed per bit is extremely high can be obtained.

Further, a transistor including an oxide semiconductor has extremely small off-state current; therefore, a memory device including the transistor is not a volatile memory device from which stored data is lost within one second unless refresh operation is performed, like a conventional DRAM. Such a memory device can hold stored data for an extremely long time as compared to the conventional DRAM. Accordingly, a substantially non-volatile memory cell can be obtained with the use of the transistor including an oxide semiconductor for a memory cell.

In addition, a transistor including a semiconductor material other than an oxide semiconductor can operate at higher speed than a transistor including an oxide semiconductor material. Therefore, when the transistor including a semiconductor material other than an oxide semiconductor is used for a sense latch, the sense latch array and a peripheral circuit such as a data line driver circuit, which performs operation at sufficiently high speed, can be favorably obtained. Accordingly, when such a sense latch array is combined with a memory cell array including a transistor including an oxide semiconductor material, operation (e.g., data reading operation or data writing operation) of the semiconductor device can be performed at sufficiently high speed.

A semiconductor device having a novel feature can be realized by being provided with both a peripheral circuit, such as a driver circuit, including a transistor including a semiconductor material other than an oxide semiconductor (in other words, a transistor capable of operating at sufficiently high speed) and a memory circuit including a transistor including an oxide semiconductor (in a broader sense, a transistor whose off-state current is sufficiently small).

This embodiment can be implemented in appropriate combination with the structures described in the other embodiments.

Embodiment 2

In this embodiment, a structure and a manufacturing method of a semiconductor device according to one embodiment of the present invention will be described with reference to FIG. 7, FIGS. 8A to 8E, FIGS. 9A to 9D, FIGS. 10A to 10C, and FIGS. 11A and 11B.

<Cross-Sectional Structure of Semiconductor Device>

Figure 7:
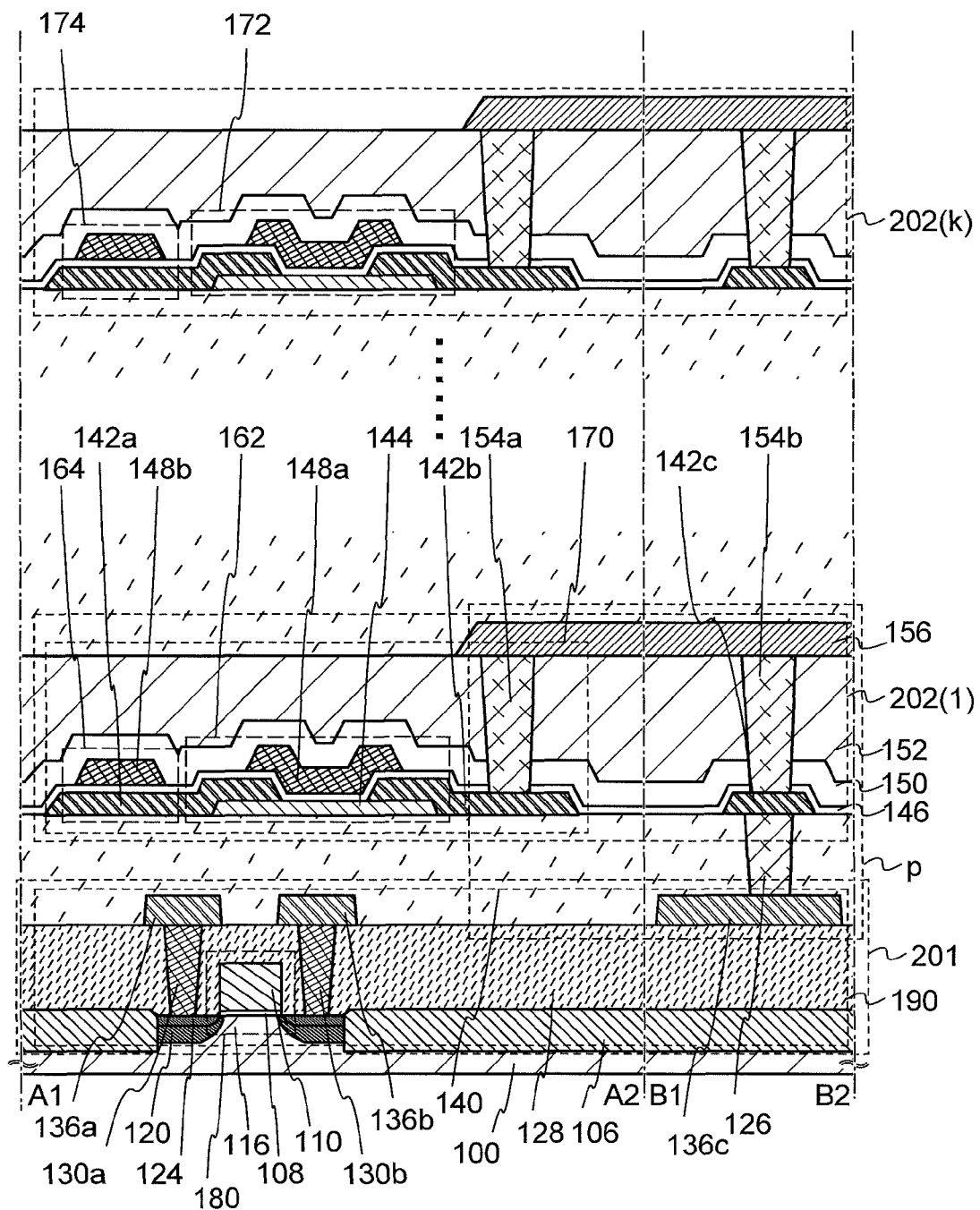
FIG. 7 is a cross-sectional view of a semiconductor device.

FIG. 7 is a cross-sectional view of a semiconductor device according to one embodiment of the present invention. In FIG. 7, A1-A2 is a cross section perpendicular to the channel length direction of a transistor, and B1-B2 is a cross section of the node p. The semiconductor device illustrated in FIG. 7 includes the sense latch array 201 in a lower portion and the memory cell arrays 202(1) to 202(k) in an upper portion. The sense latch array 201 in the lower portion includes a transistor 180 including a semiconductor material other than an oxide semiconductor, and each of the memory cell arrays 202(1) to 202(k) in the upper portion includes the transistor 162 including an oxide semiconductor material.

The transistor 180 including a semiconductor material other than an oxide semiconductor is included in a first layer of the semiconductor device illustrated in FIG. 7. The transistor 180 includes a channel formation region 116 provided in a substrate 100 including a semiconductor material (e.g., silicon); impurity regions 120 provided such that the channel formation region 116 is sandwiched therebetween; metal compound regions 124 in contact with the impurity regions 120; a gate insulating layer 108 provided over the channel formation region 116; a gate electrode 110 provided over the gate insulating layer 108; and a source or drain electrode 130a and a source or drain electrode 130b electrically connected to the metal compound regions 124. In addition, an insulating layer 128 is provided so as to cover the transistor 180. The source or drain electrode 130a and the source or drain electrode 130b are electrically connected to the metal compound regions 124 through openings formed in the insulating layer 128. Over the insulating layer 128, a conductive layer 136a is formed in contact with the source or drain electrode 130a, and a conductive layer 136b is formed in contact with the source or drain electrode 130b. Note that the transistor 180 may be either an n-channel transistor or a p-channel transistor. When the sense latches 190 each including the transistor 180 including a semiconductor material other than an oxide semiconductor are arranged in matrix, the sense latch array 201 can be formed. Further, when a plurality of the transistors 180 each including a semiconductor material other than an oxide semiconductor is combined, a peripheral circuit such as the first word line driver circuit 203 can be formed.

The substrate 100 is provided with an element isolation insulating layer 106 which surrounds the transistor 180. Note that for high integration, it is preferable that, as in FIG. 7, the transistor 180 do not have a sidewall insulating layer. On the other hand, in the case where characteristics of the transistor 180 have priority, a sidewall insulating layer may be provided on a side surface of the gate electrode 110, and the impurity regions 120 may include a region having a different impurity concentration in a region overlapping with the sidewall insulating layer.

The memory cell array 202(1) is provided over the sense latch array 201 with an insulating layer 140 provided therebetween. The memory cell array 202(1) includes the memory cell 170, and the memory cell 170 includes the transistor 162 and the capacitor 164. The transistor 162 includes an oxide semiconductor layer 144 provided over the insulating layer 140 and the like, a source or drain electrode 142a and a source or drain electrode 142b electrically connected to the oxide semiconductor layer 144, a gate insulating layer 146 for covering the oxide semiconductor layer 144, the source or drain electrode 142a, and the source or drain electrode 142b, and a gate electrode 148a provided over the gate insulating layer 146 so as to overlap with the oxide semiconductor layer 144. When the memory cells 170 each including the transistor 162 including an oxide semiconductor material are arranged in matrix, the memory cell array 202(1) can be formed. A structure of a transistor 172 in the memory cell array 202(k) is similar to that of the transistor 162.

Here, the oxide semiconductor layer 144 used for the transistor in the memory cell 170 is preferably purified by sufficiently removing an impurity such as hydrogen therefrom or sufficiently supplying oxygen thereto. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 144 is measured by secondary ion mass spectrometry (SIMS). In the oxide semiconductor layer 144 which is purified by sufficiently reducing the hydrogen concentration and in which defect levels in an energy gap due to oxygen deficiency are reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature (25° C.) is lower than or equal to 100 zA (1 zA (zeptoampere) is $1\times10^{-21}$ A), preferably lower than or equal to 10 zA. In this manner, by using an oxide semiconductor material which is made to be an i-type (intrinsic) oxide semiconductor or a substantially i-type oxide semiconductor for the transistor (the transistor 162), extremely favorable off-state current characteristics can be obtained.

In addition, it is preferable that the concentration of an alkali metal and an alkaline earth metal be sufficiently decreased in the oxide semiconductor layer 144. The concentration of an alkali metal or an alkaline earth metal is decreased to such a degree that, for example, the concentration of Na is lower than or equal to $5\times10^{16}$ cm$^{-3}$, preferably lower than or equal to $1\times10^{16}$ cm$^3$, more preferably lower than or equal to $1\times10^{15}$ cm$^3$, the concentration of Li is lower than or equal to $5\times10^{15}$ cm$^3$, preferably lower than or equal to $1\times10^{15}$ cm$^3$, and the concentration of K is lower than or equal to $5\times10^{15}$ cm$^{-3}$, preferably lower than or equal to $1\times10^{15}$ cm$^3$ when measured through an SIMS analysis.

It has been pointed out that an oxide semiconductor is insensitive to impurities, there is no problem when a considerable amount of metal impurities is contained in the film, and therefore, soda-lime glass which contains a large amount of an alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. An alkali metal and an alkaline earth metal are adverse impurities for the oxide semiconductor and are preferably contained as little as possible. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5 \times 10^{19}$ cm$^{-3}$, particularly lower than or equal to $5 \times 10^{18}$ cm$^{-3}$.

The capacitor 164 includes the source or drain electrode 142a, the gate insulating layer 146, and a conductive layer 148b. In other words, the source or drain electrode 142a functions as one electrode of the capacitor 164, and the conductive layer 148b functions as the other electrode of the capacitor 164. With such a structure, capacitance can be sufficiently secured. When the oxide semiconductor layer 144 and the gate insulating layer 146 are stacked, insulation between the source or drain electrode 142a and the conductive layer 148b can be sufficiently secured. Further, the capacitor 164 may be omitted in the case where a capacitor is not needed. A structure of a capacitor 174 in the memory cell array 202(k) is similar to that of the capacitor 164.

An insulating layer 150 and an insulating layer 152 are provided over the transistor 162 and the capacitor 164. An electrode 154a and an electrode 154b are provided in openings farmed in the gate insulating layer 146, the insulating layer 150, the insulating layer 152, and the like, and a wiring 156 is formed over the insulating layer 152 so as to be connected to the electrode 154a and the electrode 154b. The wiring 156 is for connecting one memory cell to another memory cell, and is connected to the node p of the sense latch 190 formed in the first layer. The wiring 156 is also connected to a conductive layer 136c through the electrode 154b, an electrode 142c, and an electrode 126. Thus, the sense latch array 201 in the lower portion can be connected to the memory cell array 202(1) in the upper layer. Although FIG. 7 illustrates the case where the electrode 142c is electrically connected to the conductive layer 136c through the electrode 126, an opening may be formed in the insulating layer 140 and the electrode 142c and the conductive layer 136c may be in direct contact with each other. Note that although the structure of the node p is illustrated in FIG. 7, the node q has a similar structure.

Figure 14:
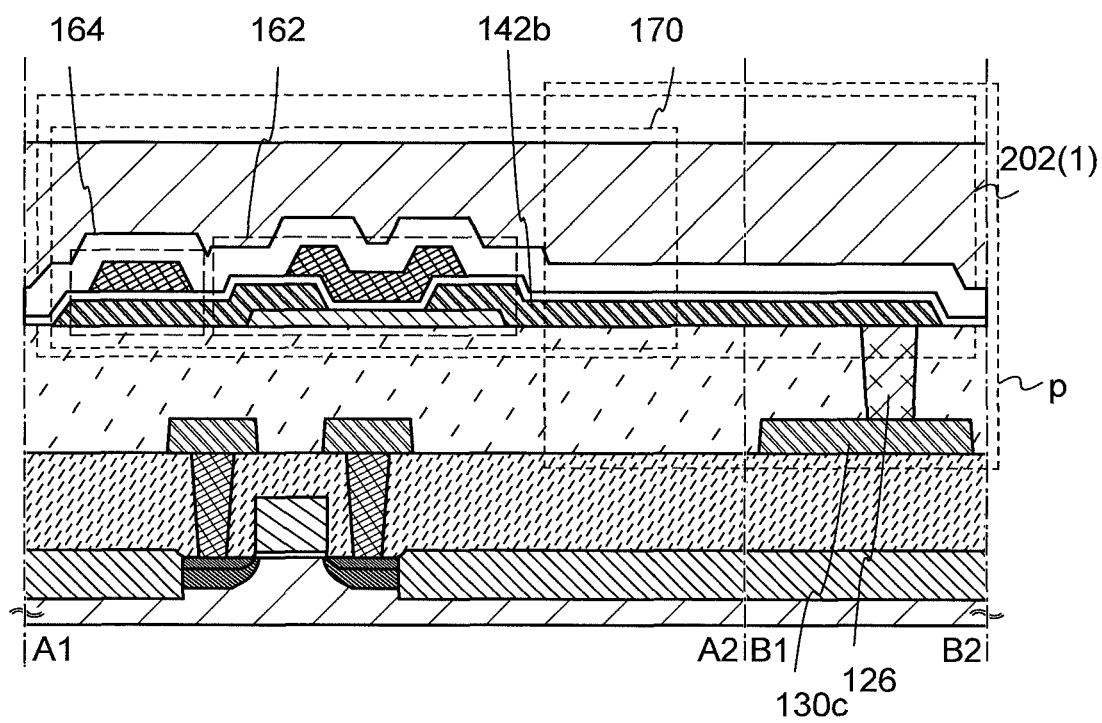
FIG. 14 is a cross-sectional view of a semiconductor device.

Although an example in which the node p of the sense latch 190 is connected to the memory cell 170 through the wiring 156 is illustrated in FIG. 7, the node p of the sense latch 190 can be connected to the memory cell 170 by connecting the conductive layer 136c, the electrode 126, and the source or drain electrode 142b to one another as illustrated in FIG. 14.

Further, in FIG. 7, an example in which k memory cell arrays are stacked is illustrated. As compared to manufacturing steps of a conventional DRAM, manufacturing steps of the memory cell array including an oxide semiconductor material can be simplified as follows.

Since the conventional DRAM includes a large number of memory cells connected to a bit line and has large bit line capacitance, a large capacitor is required for a memory cell. Therefore, the height of the capacitor is large, and manufacturing steps thereof are complicated.

On the other hand, in the semiconductor device according to one embodiment of the present invention, the number of memory cells connected to the node p or the node q is not large (e.g., smaller than or equal to 64, preferably smaller than or equal to 32), and capacitance of the node p or the node q is small.

In reading operation, potential change due to redistribution of charge between a capacitor of a memory cell and the capacitance of the node p or the node q is detected. This means that as the capacitance of the node p or the node q is smaller, the capacitor of the memory cell can be smaller.

Accordingly, in the semiconductor device according to one embodiment of the present invention, manufacturing steps of a capacitor can be simplified as compared to manufacturing steps of a capacitor in a conventional DRAM. Further, when a capacitance of a memory cell is made sufficiently small, a capacitor can have a small area in a plane structure. As a result, manufacturing steps of a capacitor can be simplified, and memory cells can be easily stacked.

Thus, a memory cell array is formed using an oxide semiconductor material, so that two or more memory cell arrays can be stacked. Accordingly, high integration of a semiconductor device can be achieved.

<Method for Manufacturing Semiconductor Device>

Next, an example of a method for manufacturing the semiconductor device will be described. First, a method for manufacturing the transistor 180 in the lower portion will be described below with reference to FIGS. 8A to 8E and FIGS. 9A to 9D, and then a method for manufacturing the transistor 162 and the capacitor 164 in the upper portion will be described with reference to FIGS. 10A to 10C and FIGS. 11A and 11B.

<Method for Manufacturing Transistor in Lower Portion>

Figure 8A:
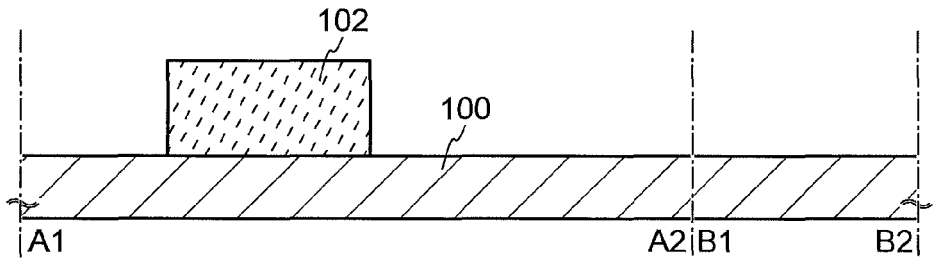
FIGS. 8A to 8E are cross-sectional views illustrating manufacturing steps of a semiconductor device.
Figure 8B:
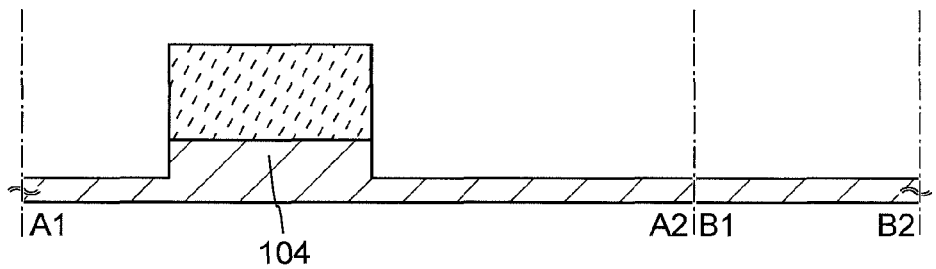

First, the substrate 100 is prepared (see FIG. 8A). As the substrate 100, a single crystal semiconductor substrate or a polycrystalline semiconductor substrate containing silicon, silicon carbide, or the like, or a compound semiconductor substrate containing silicon germanium, gallium arsenide, indium phosphide, or the like can be used. Alternatively, as the substrate 100, an SOT substrate can be used. Here, a single crystal silicon substrate is used as the substrate 100. Note that the term "SOI substrate" generally means a substrate in which a silicon layer is provided over an insulating surface. In this specification and the like, the term "SOI substrate" also means a substrate in which a semiconductor layer containing a material other than silicon is provided over an insulating surface. In other words, a semiconductor layer included in the "SOI substrate" is not limited to a silicon layer. Further, the "SOT substrate" includes a substrate in which a semiconductor layer is provided over an insulating substrate such as a glass substrate with an insulating layer provided therebetween. Since the substrate 100 does not include an oxide semiconductor material, the substrate 100 is also referred to as a substrate 100 including a semiconductor material other than an oxide semiconductor.

It is particularly preferable to use a single crystal semiconductor substrate including silicon or the like as the substrate 100, because the peripheral circuit such as the sense latch array 201 described in Embodiment 1 can operate at higher speed.

Next, a protective layer 102 serving as a mask for forming an element isolation insulating layer is formed over the substrate 100 (see FIG. 8A). As the protective layer, for example, an insulating layer formed using silicon oxide, silicon nitride, silicon oxynitride, or the like can be used. Note that before or after this step, an impurity element imparting n-type conductivity or an impurity element imparting p-type conductivity may be added to the substrate 100 in order to control the threshold voltage of the transistor. In the case where silicon is used for the substrate 100, for example, phosphorus, arsenic, or the like can be used as an impurity element imparting n-type conductivity. On the other hand, boron, aluminum, gallium, or the like can be used as an impurity element imparting p-type conductivity.

Next, part of the substrate 100 in a region that is not covered with the protective layer 102 (in an exposed region) is removed by etching with the use of the protective layer 102 as a mask. Thus, a semiconductor region 104 isolated from the other semiconductor regions is formed (see FIG. 8B). For the etching, dry etching is preferably performed, but wet etching may be performed. An etching gas and an etchant can be selected as appropriate depending on a material of layers to be etched.

Figure 8C:
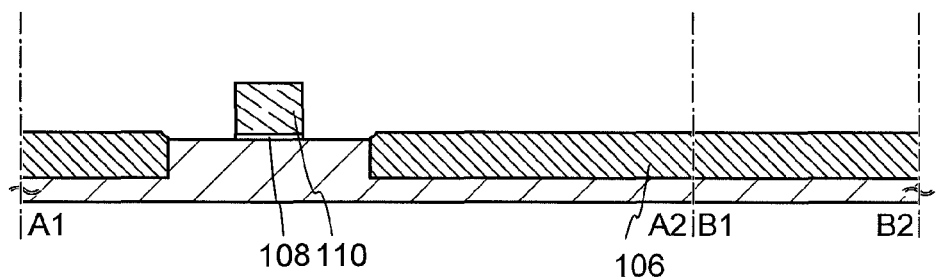

Then, an insulating layer is formed so as to cover the semiconductor region 104, and the insulating layer in a region overlapping with the semiconductor region 104 is selectively removed, whereby the element isolation insulating layer 106 is formed (see FIG. 8C). As the insulating layer, an insulating layer formed using silicon oxide, silicon nitride, silicon oxynitride, or the like can be used. As a method for removing the insulating layer, polishing treatment such as chemical mechanical polishing (CMP) (hereinafter, also referred to as CMP treatment), etching treatment, or the like can be given, and any of the above treatment may be used. Note that the protective layer 102 is removed after the formation of the semiconductor region 104 or after the formation of the element isolation insulating layer 106.

Here, the CMP treatment is treatment of planarizing a surface of an object to be processed by a combination of chemical and mechanical actions using the surface as a reference. More specifically, the CAR treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the element isolation insulating layer 106 may be formed by, instead of selectively removing an insulating layer, implanting oxygen or nitrogen to form an insulating region, for example.

Next, an insulating layer is formed over a surface of the semiconductor region 104, and a layer including a conductive material is formed over the insulating layer.

The insulating layer is to be a gate insulating layer later and can be formed by heat treatment (thermal oxidation treatment, thermal nitridation treatment, or the like) of the surface of the semiconductor region 104, for example. High-density plasma treatment may be employed instead of heat treatment. The high-density plasma treatment can be performed using, for example, a mixed gas of any of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single-layer structure or a stacked structure including a film which contains any of silicon oxide, silicon oxynitride, silicon nitride, hafnium oxide, aluminum oxide, tantalum oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), and the like. The thickness of the insulating layer can be, for example, greater than or equal to 1 nm and less than or equal to 100 nm, preferably greater than or equal to 10 nm and less than or equal to 50 nm.

The layer including a conductive material is to be a gate electrode later and can be formed using a metal material such as aluminum, copper, titanium, tantalum, or tungsten. The layer including a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. Note that an example of the case where the layer containing a conductive material is formed using a metal material is described in this embodiment.

Next, the insulating layer and the layer including a conductive material are selectively etched to form the gate insulating layer 108 and the gate electrode 110 (see FIG. 8C).

Figure 8D:
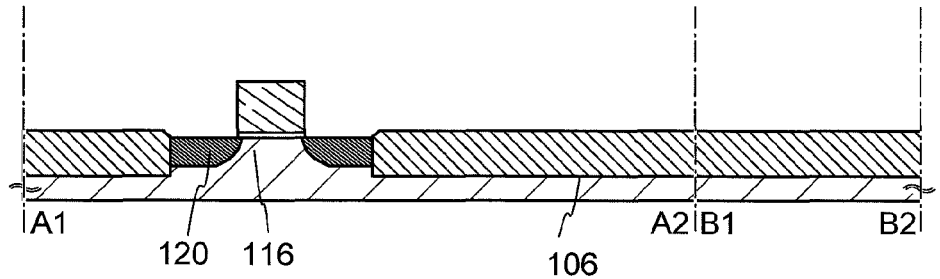

Next, phosphorus, arsenic, or the like is added to the semiconductor region 104, so that the channel formation region 116 and the impurity regions 120 are formed (see FIG. 8D). In the case where an n-channel transistor is formed, phosphorus or arsenic may be added; in the case where a p-channel transistor is formed, an impurity element such as boron or aluminum may be added. Here, the concentration of the impurity element to be added can be set as appropriate. The concentration of the impurity element to be added is preferably increased in the case where the semiconductor element is highly minimized.

Note that a sidewall insulating layer may be formed around the gate electrode 110, and impurity regions to which the impurity element is added at a different concentration may be formed.

Figure 8E:
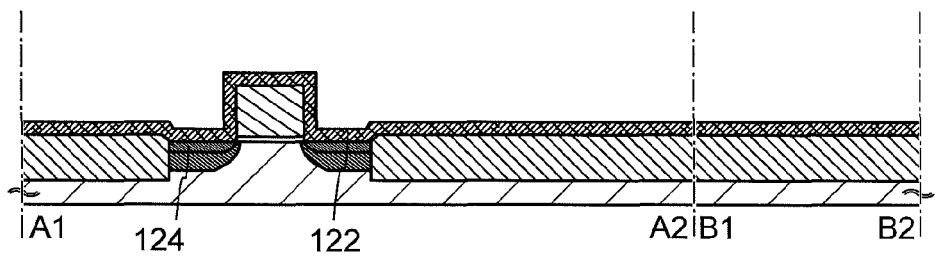

Next, a metal layer 122 is formed so as to cover the gate electrode 110, the impurity regions 120, and the like (see FIG. 8E). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low resistance metal compound. Examples of such metal materials include titanium, tantalum, tungsten, nickel, cobalt, and platinum.

Next, heat treatment is performed so that the metal layer 122 reacts with the semiconductor material. Thus, the metal compound regions 124 that are in contact with the impurity regions 120 are formed (see FIG. 8E). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 9A:
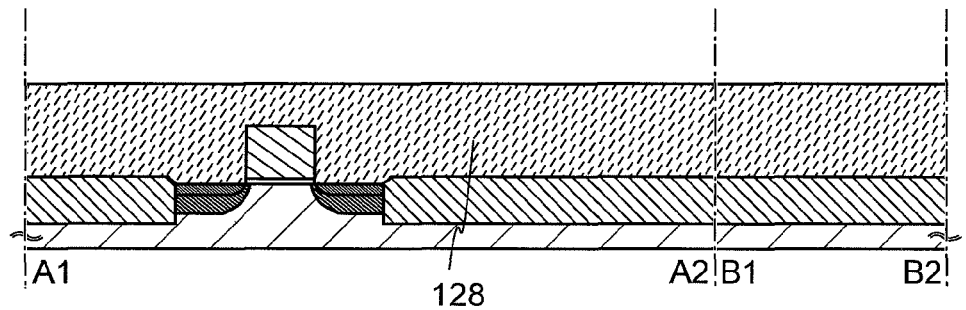
FIGS. 9A to 9D are cross-sectional views illustrating manufacturing steps of a semiconductor device.
Figure 9B:
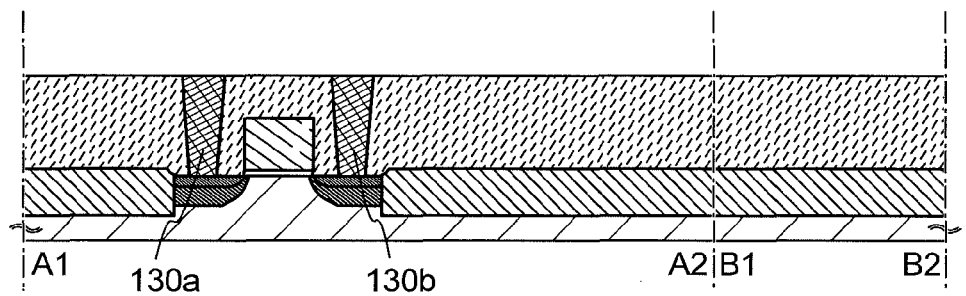

Next, the insulating layer 128 is formed so as to cover the components formed in the above steps (see FIG. 9A). The insulating layer 128 can be formed using a material including an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that a porous insulating layer with such a material may be employed as the insulating layer 128. A porous insulating layer has a lower dielectric constant than an insulating layer with high density, and thus allows a further reduction in capacitance due to electrodes or wirings. Further, the insulating layer 128 can be formed using an organic insulating material such as polyimide or acrylic. Although the insulating layer 128 has a single-layer structure in FIG. 9A, the insulating layer 128 may have a stacked structure including two or more layers.

Next, openings reaching the metal compound regions 124 are formed in the insulating layer 128, and a layer including a conductive material is formed so as to fill the openings. The layer including a conductive material is to be the source or drain electrode 130a and the source or drain electrode 130b, and can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, or a spin coating method can be employed.

Figure 9C:
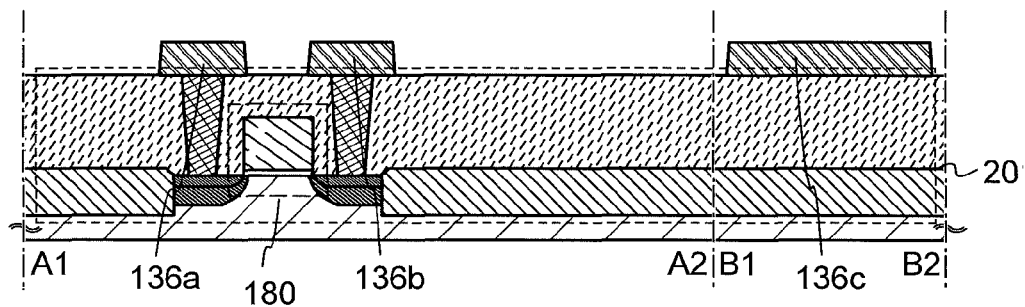

Next, the layer including a conductive material is selectively etched to form the source or drain electrode 136a, the source or drain electrode 136b, and the conductive layer 136c (see FIG. 9C).

Through the above steps, the transistor 180 is formed with the use of the substrate 100 including a semiconductor material other than an oxide semiconductor (see FIG. 9C). Further, when a plurality of such transistors 180 is formed, a peripheral circuit including the sense latch array 201 can be formed. The transistor 180 can operate at high speed. Therefore, when the transistors 180 are used for a peripheral circuit such as the sense latch array 201, the peripheral circuit such as the sense latch array 201 can operate at higher speed, which is preferable.

Figure 9D:
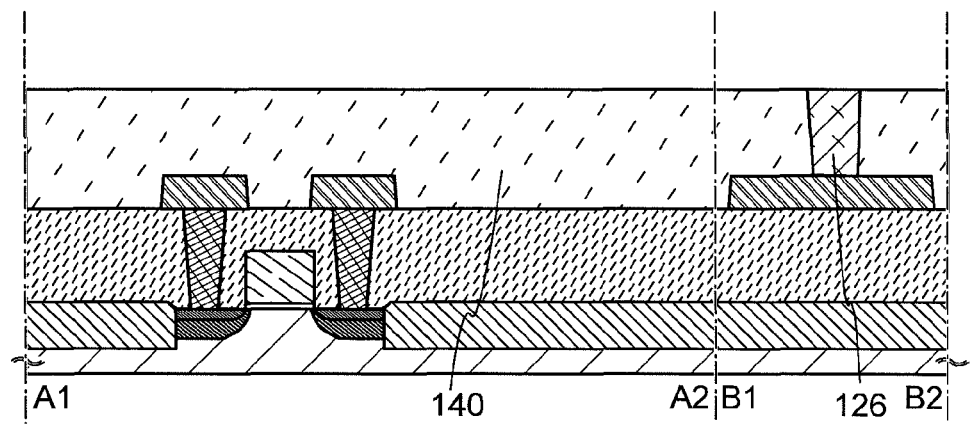

Next, the insulating layer 140 is formed so as to cover the components formed in the above steps (see FIG. 9D). The insulating layer 140 can be formed using the material and the formation method of the insulating layer 128.

Next, an opening reaching the conductive layer 136c is formed in the insulating layer 140, and a layer including a conductive material is formed so as to fill the opening. The layer including a conductive material can be formed using the material and the formation method of the gate electrode layer 110, the source or drain electrode 136a, or the source or drain electrode 136b.

After that, as treatment before formation of the transistor 162 and the capacitor 164, CMP treatment is performed on the insulating layer 140 to planarize a surface of the insulating layer 140. Thus, the electrode 126 embedded in the insulating layer 140 is formed. At this time, an upper surface of the electrode 126 is preferably exposed (see FIG. 9D). As planarization treatment of the insulating layer 140, etching treatment or the like can also be employed instead of CMP treatment. In order to improve characteristics of the transistor 162, the surface of the insulating layer 140 is preferably made as flat as possible.

Note that before or after each of the above steps, a step of forming an electrode, a wiring, a semiconductor layer, an insulating layer, or the like may be further performed. For example, a multilayer wiring structure in which an insulating layer and a conductive layer are stacked is employed as a wiring structure, whereby a highly integrated semiconductor device can be provided.

<Method for Manufacturing Transistor in Upper Portion>

First, an oxide semiconductor layer is formed over the insulating layer 140, the electrode 126, and the like.

The oxide semiconductor layer is formed to have a thickness of greater than or equal to 5 nm and less than or equal to 50 μm by a sputtering method or the like using a metal oxide target including at least zinc.

An oxide semiconductor to be used preferably contains at least indium (In) or zinc (Zn). It is particularly preferable that In and Zn be contained. As a stabilizer for reducing change in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids which include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For the oxide semiconductor layer, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In:Ga:Zn. Further, a metal element in addition to In, Ga, and Zn may be contained.

Further, a material represented by $InMO_3(ZnO)_m$ (m>0) may be used as the oxide semiconductor. Note that M represents one or more metal elements selected from Ga, Fe, Mn, and Co. Alternatively, a material represented by $In_3SnO_5(ZnO)_m$ (n>0) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:

⅓), In:Sn:Zn=2:1:3 (=⅓:⅙:½), or In:Sn:Zn=2:1:5 (=¼:⅛:⅝), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy Formula 1.

$$(a-A)^2+(b-B)^2+(c-C)^2 \le r^2 \qquad \text{[Formula 1]}$$

For example, r may be 0.05. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding centerline average roughness that is defined by JIS B 0601 so as to be able to be applied to a surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad \text{[Formula 2]}$$

Note that, in the above formula, $S_0$ represents the area of a measurement surface (a rectangular region which is defined by four points represented by the coordinates $(x_1,y_1)$, $(x_1,y_2)$, $(x_2,y_1)$, and $(x_2,y_2)$), and $Z_0$ represents average height of a measurement surface. $R_a$ can be measured using an atomic force microscope (AFM).

In this embodiment, an oxide including a crystal with c-axis alignment (also referred to as c-axis aligned crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoordinate O and O surrounded by a double circle represents tricoordinate O.

Figure 15A:
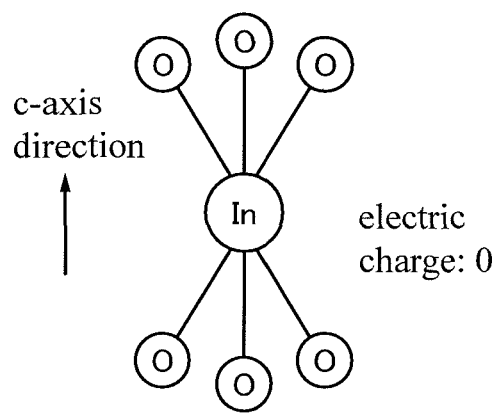
FIGS. 15A to 15E are views illustrating crystal structures of oxide materials.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
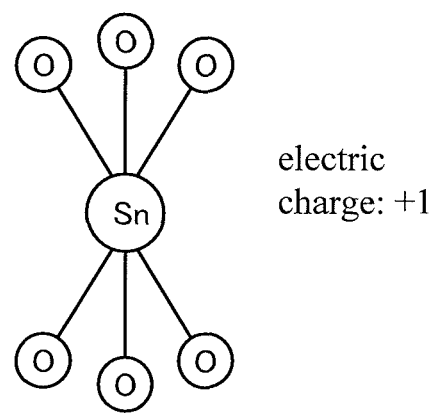
Figure 15B:
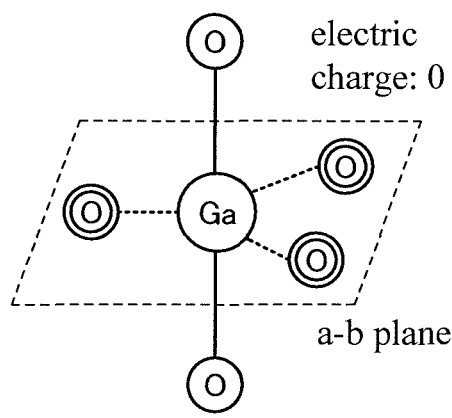

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
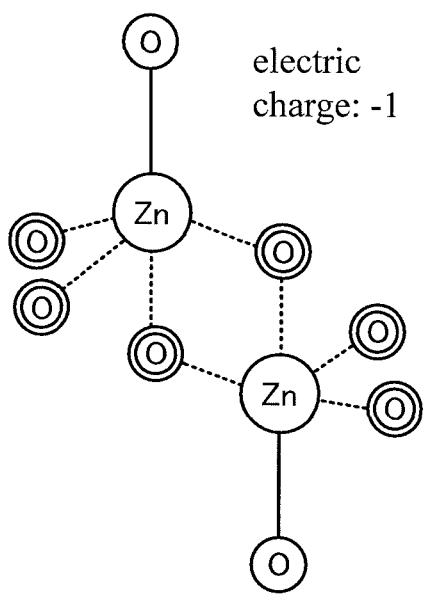
Figure 15C:
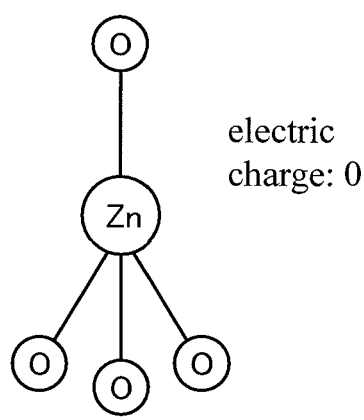

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom in FIG. 15B has one proximate Ga atom in the downward direction, and the one O atom in the lower half has one proximate Ga atom in the upward direction. The one O atom in the upper half with respect to the tetracoordinate Zn atom in FIG. 15C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the stacked structure is 0.

FIG. 16A illustrates a model of a medium group included in a stacked structure of an In—Sn—Zn—O-based material.

FIG. 16B illustrates a large group including three medium groups. Note that FIG. 16C illustrates an atomic arrangement in the case where the stacked structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the stacked structure of the In—Sn—Zn—O-based material in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a stacked structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the stacked structure can be 0.

When the large group illustrated in FIG. 16B is repeated, an In—Sn—Zn-based oxide crystal ($In_2SnZn_3O_8$) can be obtained. Note that a stacked structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 17A illustrates a model of a medium group included in a stacked structure of an In—Ga—Zn-based oxide.

In the medium group included in the stacked structure of the In—Ga—Zn-based oxide in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 17B illustrates a large group including three medium groups. Note that FIG. 17C illustrates an atomic arrangement in the case where the stacked structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 17A but also a medium group in which the arrangement of the In atom, the Ga atom, and the Zn atom is different from that in FIG. 17A.

As a target, a four-component metal oxide such as an In—Sn—Ga—Zn-based oxide, a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide, a two-component metal oxide such as an In—Zn-based oxide or a Sn—Zn-based oxide, or the like can be used.

As an example of the target, a target which contains In, Ga, and Zn and has a composition ratio of $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used. An oxide semiconductor obtained by a sputtering method with the use of a target containing In, Ga, and Zn is represented by In—Ga—Zn—O, and its oxide semiconductor material is $InGaO_3(ZnO)_m$ (m>0). The fact that m is not a natural number can be confirmed by analysis using inductively coupled plasma mass spectrometry (ICP-MS) or Rutherford backscattering (RBS).

Further, an In—Sn—Zn-based oxide can be referred to as ITZO. A target which has a composition ratio of In:Sn:Zn=1:2:2, 2:1:3, 1:1:1, 20:45:35, or the like in atomic ratio is used.

In addition, at the formation of the oxide semiconductor layer, the pressure of a treatment chamber in a sputtering apparatus is set to 0.4 Pa or less, whereby mixing of an impurity such as alkali metal or hydrogen to an object or a surface of the object can be suppressed. Note that hydrogen may be contained in the object as a hydrogen molecule, water, a hydroxyl group, or hydride in some cases in addition to a hydrogen atom.

In addition, at the formation of the oxide semiconductor layer, the distance between a target and a substrate (a T-S distance) is greater than or equal to 40 mm and less than or equal to 300 mm (preferably, greater than or equal to 60 mm).

In the case where the oxide semiconductor layer is formed by a sputtering method, the temperature of the surface where the film is formed is higher than or equal to 250° C. and lower than or equal to the upper limit of the heat treatment temperature for the substrate. The temperature at which entry of impurities such as hydrogen or water into a film to be formed is prevented and the impurity is released to a vapor phase in the chamber is 250° C. In addition, in the case where the oxide semiconductor layer is formed by a sputtering method, the upper limit of the temperature of the surface where the film is formed is the upper limit of the heat treatment temperature for the substrate or the upper limit of the temperature of the film to be formed (if the temperature exceeds the latter upper limit, components in the film significantly change).

A high-purity gas from which an impurity such as hydrogen, water, a hydroxyl group, or hydride is sufficiently removed is introduced while moisture remaining in the deposition chamber is removed, and the oxide semiconductor layer is formed over the substrate with the use of the target. In order to remove moisture remaining in the deposition chamber, an entrapment vacuum pump such as a cryopump, an ion pump, or a titanium sublimation pump is desirably used. The evacuation unit may be a turbo molecular pump (TMP) provided with a cold trap. In the deposition chamber which is evacuated with the cryopump, for example, impurities such as hydrogen, water, a hydroxyl group, or hydride (also including a compound containing a carbon atom) or the like are removed, whereby the concentration of impurities such as hydrogen, water, a hydroxyl group, or hydride in the oxide semiconductor layer formed in the deposition chamber can be reduced.

Moreover, when the leakage rate of the treatment chamber of the sputtering apparatus is set to lower than or equal to $1 \times 10^{-10}$ Pa·m$^3$/second at the formation of the oxide semiconductor layer, entry of impurities such as an alkali metal or hydride into the oxide semiconductor layer that is being formed by a sputtering method can be reduced. Further, with the use of an entrapment vacuum pump (e.g., a cryopump) as an evacuation system, counter flow of impurities such as alkali metal, a hydrogen atom, a hydrogen molecule, water, a hydroxyl group, or hydride from the evacuation system can be reduced.

Next, the oxide semiconductor layer is processed, whereby the oxide semiconductor layer 144 is formed. The oxide semiconductor layer can be processed by being etched after a mask having a desired shape is formed over the oxide semiconductor layer. The above mask can be formed by a method such as a photolithography method. Alternatively, the mask may be formed by an inkjet method or the like. For the etching of the oxide semiconductor layer, either dry etching or wet etching may be employed. Needless to say, both of them may be employed in combination.

After the semiconductor layer is formed or after the oxide semiconductor layer 144 is formed, if necessary, heat treatment may be performed in an atmosphere which hardly contains hydrogen, water, or the like (a nitrogen atmosphere, an oxygen atmosphere, a dry-air atmosphere (for example, as for water, a dew point is lower than or equal to −40° C., preferably lower than or equal to −60° C.), or the like) at a temperature higher than or equal to 200° C. and lower than or equal to 700° C. The heat treatment can be called dehydration or dehydrogenation which is for detaching H, OH, or the like from the oxide semiconductor layer. In the case where temperature is raised in an inert atmosphere and the atmosphere is switched to an atmosphere containing oxygen during the heat treatment, or in the case where an oxygen atmosphere is employed, the heat treatment can also be called treatment for supplying oxygen.

Figure 10A:
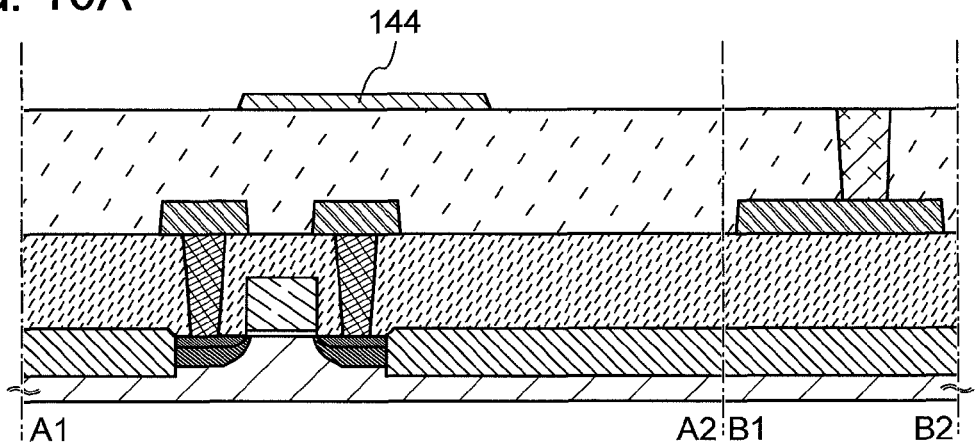
FIGS. 10A to 10C are cross-sectional views illustrating manufacturing steps of a semiconductor device.

Through the above steps, the i-type (intrinsic) or substantially i-type oxide semiconductor layer 144 in which the impurities are reduced can be formed (see FIG. 10A).

Next, a layer including a conductive material is formed over the oxide semiconductor layer 144 or the like.

The layer including a conductive material is to be a source electrode and a drain electrode later, and can be formed using a metal material such as aluminum, chromium, copper, titanium, tantalum, molybdenum, or tungsten. Alternatively, the layer including a conductive material can be formed using an alloy containing any of the above metal materials as a component, or the like. Moreover, one or more materials selected from manganese, magnesium, zirconium, beryllium, neodymium, and scandium may be used.

The layer including a conductive material may have a single-layer structure or a stacked structure including two or more layers. For example, the layer including a conductive material can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the layer including a conductive material has a single-layer structure of a titanium film or a titanium nitride film, there is an advantage that the layer including a conductive material can be easily processed into the source or drain electrodes 142a and 142b having tapered shapes.

Further, as the layer including a conductive material, indium oxide, indium tin oxide (also referred to as ITO), indium zinc oxide, zinc oxide, zinc oxide to which gallium is added, graphene, or the like can be used.

Figure 10B:
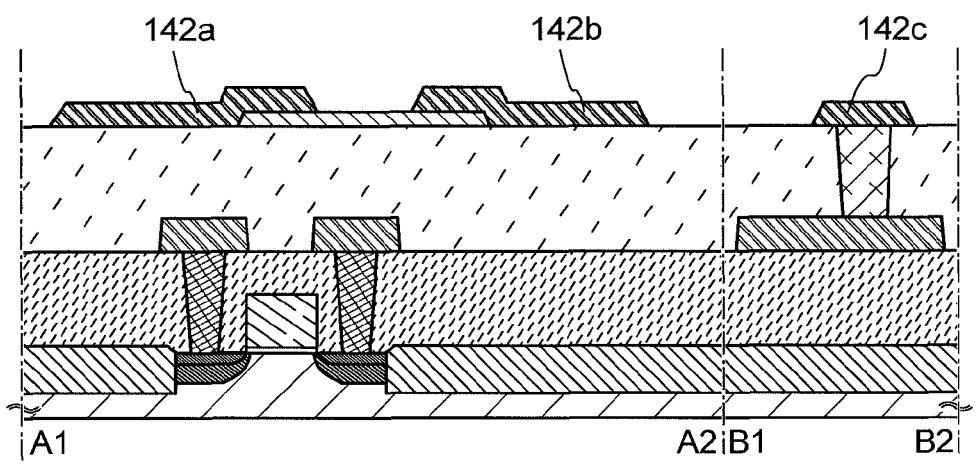

The layer including a conductive material is selectively etched to form the source or drain electrodes 142a and 142b and the electrode 142c (see FIG. 10B).

The layer including a conductive material is preferably etched such that the source or drain electrodes 142a and 142b and the electrode 142c are formed to have tapered end portions. Here, the taper angle thereof is, for example, preferably greater than or equal to 30° and less than or equal to 60°. When the source or drain electrodes 142a and 142b and the electrode 142c are formed by etching so as to have tapered end portions, coverage of the source or drain electrodes 142a and 142b and the electrode 142c with the gate insulating layer which is formed later can be improved and disconnection of the gate insulating layer can be prevented.

The channel length (L) of the transistor is determined by a distance between lower edge portions of the source or drain electrode 142a and the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet rays, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Figure 10C:
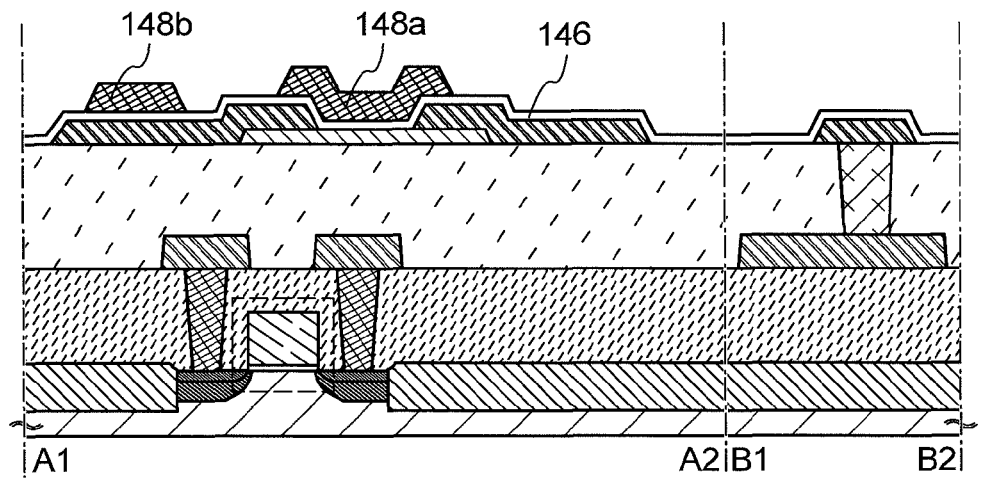

Next, the gate insulating layer 146 is formed so as to cover the source or drain electrodes 142a and 142b and the electrode 142c and to be in contact with part of the oxide semiconductor layer 144 (see FIG. 10C).

The gate insulating layer 146 can be formed by a CVD method, a sputtering method, or the like. The gate insulating layer 146 is preferably formed so as to contain silicon oxide, silicon nitride, silicon oxynitride, gallium oxide, aluminum oxide, tantalum oxide, hafnium oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), or the like. The gate insulating layer 146 may have a single-layer structure or a stacked structure in which these materials are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as in the above description, a problem of gate leakage due to a tunnel effect or the like is caused. In order to solve the problem of gate leakage, it is preferable that the gate insulating layer 146 be formed using a high dielectric constant (high-k) material such as hafnium oxide, tantalum oxide, yttrium oxide, hafnium silicate ($HfSi_xO_y$ ($x>0$, $y>0$)), hafnium silicate to which nitrogen is added ($HfSi_xO_yN_z$ ($x>0$, $y>0$, $z>0$)), or hafnium aluminate to which nitrogen is added ($HfAl_xO_yN_z$ ($x>0$, $y>0$, $z>0$)). By using a high-k material for the gate insulating layer 146, electrical characteristics can be ensured and the thickness can be large to prevent gate leakage. Note that a stacked structure of a film containing a high-k material and a film containing any of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be an insulating material including a Group 13 element and oxygen. Many of oxide semiconductor materials include a Group 13 element, and thus an insulating material including a Group 13 element works well with an oxide semiconductor. By using such an insulating material including a Group 13 element for an insulating layer in contact with the oxide semiconductor layer, the condition of an interface between the oxide semiconductor layer and the insulating layer can keep a favorable state.

An insulating material including a Group 13 element refers to an insulating material including one or more Group 13 elements. As the insulating material including a Group 13 element, a gallium oxide, an aluminum oxide, an aluminum gallium oxide, a gallium aluminum oxide, and the like are given, for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, a material containing gallium oxide may be used for a gate insulating layer, so that favorable characteristics can be kept at the interface between the oxide semiconductor layer and the gate insulating layer. When the oxide semiconductor layer and the insulating layer containing gallium oxide are provided in contact with each other, pile-up of hydrogen at the interface between the oxide semiconductor layer and the insulating layer can be suppressed, for example. Note that a similar effect can be obtained in the case where an element belonging to the same group as a constituent element of the oxide semiconductor is used for an insulating layer. For example, it is effective to form an insulating layer with the use of a material containing aluminum oxide. Note that aluminum oxide has a property of not easily transmitting water. Thus, it is preferable to use a material containing aluminum oxide in terms of preventing entry of water into the oxide semiconductor layer.

The insulating layer in contact with the oxide semiconductor layer 144 preferably contains oxygen in a proportion higher than that in the stoichiometric proportion by heat treatment in an oxygen atmosphere or by oxygen doping. "Oxygen doping" refers to adding oxygen into a bulk. Note that the term "bulk" is used in order to clarify that oxygen is added not only to a surface of a thin film but also to the inside of the thin film. In addition, "oxygen doping" includes oxygen plasma doping in which oxygen plasma is added to a bulk. The oxygen doping may be performed by an ion implantation method or an ion doping method.

For example, in the case where the insulating layer in contact with the oxide semiconductor layer 144 is formed using gallium oxide, the composition of gallium oxide can be set to be $Ga_2O_x$ ($x=3+\alpha$, $0<\alpha<1$) by heat treatment in an oxygen atmosphere or by oxygen doping. In the case where the insulating layer in contact with the oxide semiconductor layer 144 is formed using aluminum oxide, the composition of aluminum oxide can be set to be $Al_2O_x$ ($x=3+\alpha$, $0<\alpha<1$) by heat treatment in an oxygen atmosphere or by oxygen doping. In the case where the insulating layer in contact with the oxide semiconductor layer 144 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping or the like, an insulating layer which has a region where the proportion of oxygen is higher than that in the stoichiometric proportion can be formed. When the insulating layer having such a region is in contact with the oxide semiconductor layer, excess oxygen in the insulating layer is supplied to the oxide semiconductor layer, and oxygen deficiency in the oxide semiconductor layer or at an interface between the oxide semiconductor layer and the insulating layer can be reduced. Thus, the oxide semiconductor layer can be an i-type or substantially i-type oxide semiconductor.

Note that the insulating layer having a region where the proportion of oxygen is higher than that in the stoichiometric proportion may be applied to an insulating layer (e.g., the insulating layer 140) serving as a base film for the oxide semiconductor layer 144 instead of the gate insulating layer 146, or may be applied to both the gate insulating layer 146 and the base insulating layer.

Next, a layer including a conductive material is formed so as to cover the components formed in the above steps. The layer including a conductive material can be formed using a metal material such as molybdenum, titanium, tantalum, tungsten, aluminum, copper, neodymium, or scandium, or an alloy material containing any of these materials as its main component. The layer including a conductive material is selectively etched to form the gate electrode 148a and the conductive layer 148b. Note that the gate electrode 148a and the conductive layer 148b may have a single-layer structure or a stacked structure.

Figure 11A:
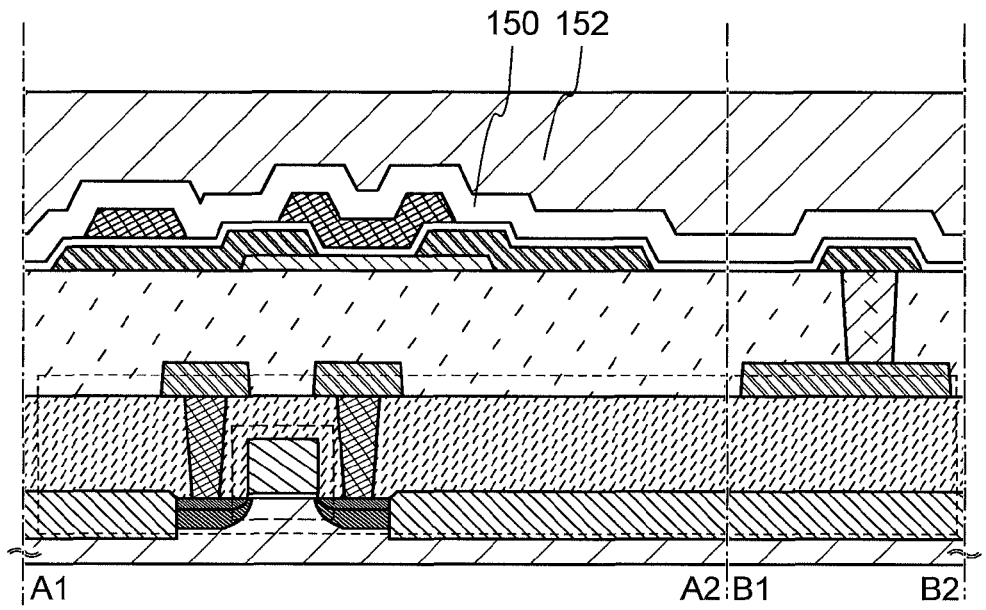
FIGS. 11A and 11B are cross-sectional views illustrating manufacturing steps of a semiconductor device.

Then, the insulating layer 150 and the insulating layer 152 are formed over the gate insulating layer 146, the gate electrode 148a, and the conductive layer 148b (see FIG. 11A). The insulating layer 150 and the insulating layer 152 can be formed by a PVD method, a CVD method, or the like. The insulating layer 150 and the insulating layer 152 can be formed using a material including an inorganic insulating material such as silicon oxide, silicon oxynitride, silicon nitride, hafnium oxide, gallium oxide, or aluminum oxide, or a material including an organic material such as polyimide or acrylic. Note that the insulating layer 150 and the insulating layer 152 are preferably formed using a low dielectric constant material or a low dielectric constant structure (such as a porous structure). This is because when the insulating layer 150 and the insulating layer 152 have a low dielectric constant, capacitance generated between wirings, electrodes, or the like can be reduced and operation at higher speed can be achieved. For example, a material including an inorganic material can be used for the insulating layer 150 and a material including an organic material can be used for the insulating layer 152.

Next, openings reaching the source or drain electrode 142b and the electrode 142c are formed in the gate insulating layer 146, the insulating layer 150, and the insulating layer 152. The openings are formed by selective etching with the use of a mask or the like. After that, a layer including a conductive material is formed in contact with the source or drain electrode 142b and the electrode 142c. Next, the layer including a conductive material is subjected to etching or CMP treatment to form the electrode 154a and the electrode 154b (see FIG. 11B).

Figure 11B:
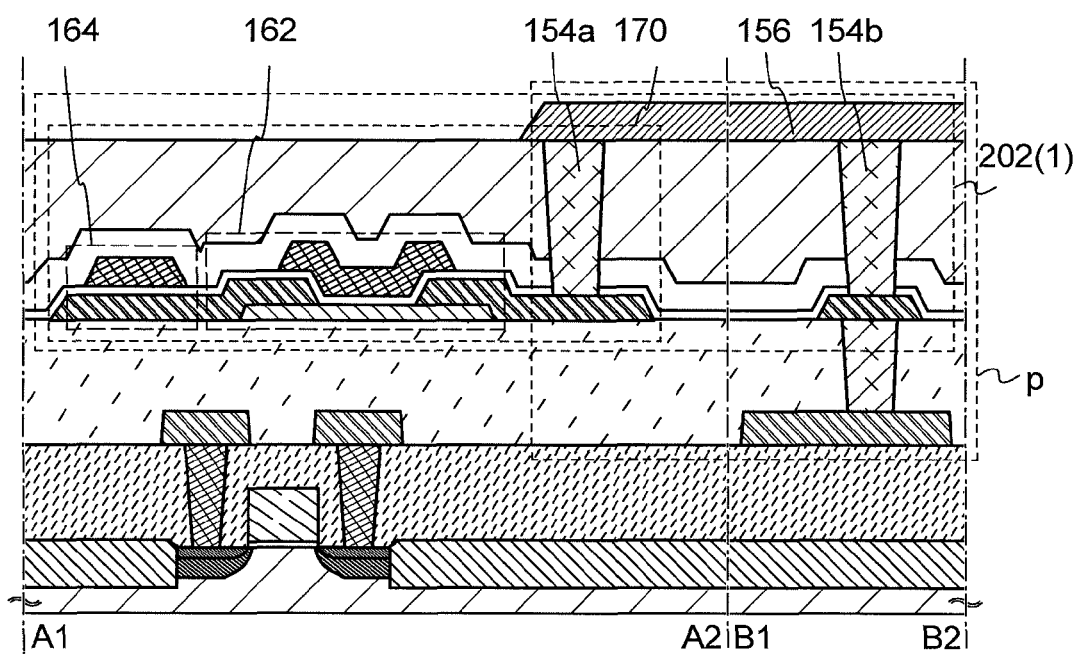

Next, the wiring 156 is formed so as to cover the insulating layer 152 and be in contact with the electrode 154a and the electrode 154b (see FIG. 11B). The wiring 156 is formed in such a manner that after a layer including a conductive material is formed by a PVD method or a CVD method, the layer including a conductive material is patterned. As a material of the layer including a conductive material, an element selected from aluminum, chromium, copper, tantalum, titanium, molybdenum, and tungsten, an alloy containing any of these elements as a component, or the like can be used. Further, one or more materials selected from manganese, magnesium, zirconium, beryllium, neodymium, and scandium may be used.

Further, the wiring 156 may be formed while the electrode 154a and the electrode 154b are not formed. For example, it is possible to employ a method in which a thin titanium film (approximately 5 nm) is formed in a region of the insulating layer 150, in which the openings are formed, by a PVD method and then, an aluminum film is formed so as to fill the openings. Here, the titanium film formed by a PVD method functions to reduce an oxide film (e.g., a natural oxide film) formed on a surface where the titanium film is formed, and to decrease the contact resistance with a lower electrode or the like (here, the source or drain electrode 142a and the electrode 142c). In addition, hillock of an aluminum film can be prevented. A copper film may be formed by a plating method after the formation of a barrier film of titanium, titanium nitride, or the like.

By the wiring 156, the node p of the sense latch 190 and the source or drain electrode 142b of the transistor 162 of the memory cell can be connected (see FIG. 11B).

Thus, the memory cell 170 including the transistor 162 including the purified oxide semiconductor layer 144 and the capacitor 164 is completed (see FIG. 11B). Further, when a plurality of such memory cells 170 is formed, the memory cell array 202(1) can be formed.

Through the above steps, a semiconductor device provided with both a peripheral circuit including a transistor including a semiconductor material other than an oxide semiconductor and a memory circuit including a transistor including an oxide semiconductor material can be manufactured.

With the use of the above manufacturing method, the oxide semiconductor layer 144 in which an impurity such as hydrogen or an alkali metal are extremely reduced can be obtained. When the transistor 162 is manufacturing using such an oxide semiconductor layer 144, a transistor with extremely small off-state current can be manufactured. Since the transistor 162 has extremely small off-state current, the memory cell 170 including the transistor 162 can hold stored data for a long time.

Further, since the memory cell arrays 202(1) to 202(k) illustrated in FIG. 7 have simple element structures, it is easy to stack the memory cell arrays. For example, a conventional flash memory needs high voltage for holding charge in a floating gate or removing the charge. Therefore, a gate insulating layer having good film quality is required and a structure of a memory element is complicated; thus, it has been difficult to stack flash memories as memory circuits. Moreover, in a conventional DRAM, a capacitor whose height is large needs to be formed in order to obtain high integration degree, which also makes it difficult to stack the DRAMs as memory circuits.

In contrast, a memory cell including a transistor including an oxide semiconductor can be manufactured in a simple process, as compared to a flash memory and a DRAM. Further, the memory cell including a transistor including an oxide semiconductor has extremely small off-state current, so that a capacitor for holding charge can be small. With such features, the memory cells (memory cell arrays) each including a transistor including an oxide semiconductor can be stacked, and thus, integration degree of a semiconductor device can be increased.

In this embodiment, the steps of manufacturing up to and including the memory cell array 202(1) are described. A plurality of the memory cell arrays 202 can be stacked by employing the method for manufacturing the memory cell array 202(1). For example, by the above manufacturing method, k memory cell arrays are stacked, so that the semiconductor device illustrated in FIG. 7 can be manufactured. In the case where a plurality of memory cell arrays is stacked, oxide semiconductor materials used for respective memory cell arrays preferably include the same material.

This embodiment can be implemented in appropriate combination with the structures described in the other embodiments.

Embodiment 3

One embodiment of an oxide semiconductor layer which can be used for a channel formation region of a transistor in the above embodiments will be described with reference to FIGS. 12A to 12D.

The oxide semiconductor layer of this embodiment has a stacked structure including a first crystalline oxide semiconductor layer and a second crystalline oxide semiconductor layer which is over the first crystalline oxide semiconductor layer and has a larger thickness than the first crystalline oxide semiconductor layer.

A first oxide semiconductor film with a thickness of greater than or equal to 1 nm and less than or equal to 10 nm is formed over an insulating layer 140.

In this embodiment, an oxide insulating layer with a thickness of greater than or equal to 50 nm and less than or equal to 600 nm is formed as the insulating layer 140 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

The first oxide semiconductor film is formed by a sputtering method, and the substrate temperature in the film formation by a sputtering method is set to be higher than or equal to 200° C. and lower than or equal to 400° C. In this embodiment, the first oxide semiconductor film is formed to a thickness of 5 nm in an oxygen atmosphere, an argon atmosphere, or an atmosphere including argon and oxygen under conditions where a target for an oxide semiconductor (a target for an In—Ga—Zn-based oxide semiconductor ($In_2O_3$:$Ga_2O_3$:ZnO=1:1:2 [molar ratio])) is used, the distance between the substrate and the target is 170 mm, the substrate temperature is 250° C., the pressure is 0.4 Pa, and the direct-current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 145a is formed (see FIG. 12A).

Although it depends on the temperature of the first heat treatment, the first heat treatment causes crystallization from a film surface and crystal grows from the film surface toward the inside of the film; thus, c-axis aligned crystals are obtained. By the first heat treatment, a large amount of zinc and oxygen gather about the film surface, and one or more layers of graphene-type two-dimensional crystal including zinc and oxygen and having a hexagonal upper plane are formed at the outermost surface; the one or more layers at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 140 that is an oxide insulating layer is diffused to an interface between the insulating layer 140 and the first crystalline oxide semiconductor layer 145a or the vicinity of the interface (within ±5 nm from the interface), whereby oxygen deficiencies in the first crystalline oxide semiconductor layer are reduced. Therefore, it is preferable that oxygen be included in (a bulk of) the insulating layer 140 used as a base insulating layer for the first crystalline oxide semiconductor layer or at the interface between the first crystalline oxide semiconductor layer 145a and the insulating layer 140 at an amount that exceeds at least the stoichiometric proportion.

Next, a second oxide semiconductor film with a thickness of greater than 10 nm is formed over the first crystalline oxide semiconductor layer 145a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor film formed over and in contact with the surface of the first crystalline oxide semiconductor layer, and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for an oxide semiconductor (a target for an In—Ga—Zn-based oxide semiconductor ($In_2O_3:Ga_2O_3:ZnO=1:1:2$ [molar ratio])) is used, the distance between the substrate and the target is 170 mm, the substrate temperature is 400° C., the pressure is 0.4 Pa, and the direct-current (DC) power is 0.5 kW.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, a second crystalline oxide semiconductor layer 145b is formed (see FIG. 12B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds with the use of the first crystalline oxide semiconductor layer 145a as a nucleus, in the thickness direction, that is, from the bottom to the inside; thus, the second crystalline oxide semiconductor layer 145b is formed.

It is preferable that steps from the formation of the insulating layer 140 to the second heat treatment be successively performed without exposure to the air. The steps from the formation of the insulating layer 140 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 12A:
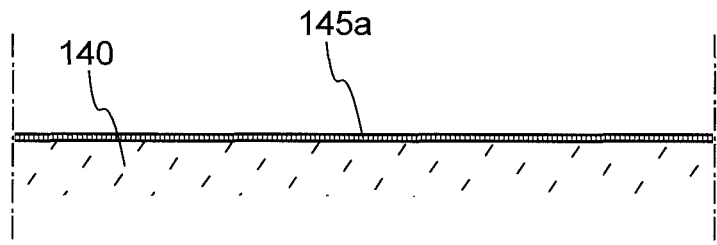
FIGS. 12A to 12D are cross-sectional views illustrating manufacturing steps of a semiconductor device.
Figure 12B:
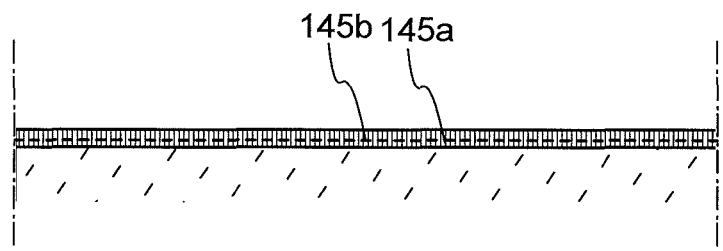
Figure 12C:
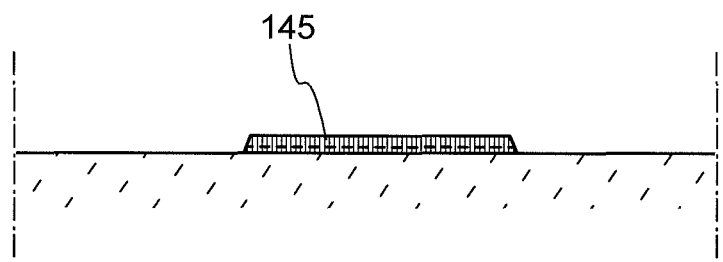
Figure 12D:
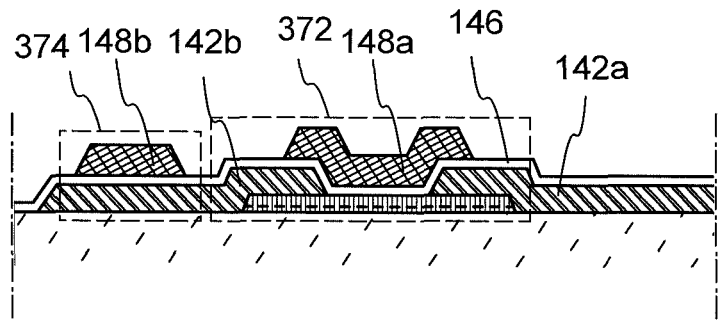

Next, the stack of the oxide semiconductor layers including the first crystalline oxide semiconductor layer 145a and the second crystalline oxide semiconductor layer 145b is processed into an oxide semiconductor layer 145 including a stack of island-shaped oxide semiconductor layers (see FIG. 12C). In FIG. 12C, the interface between the first crystalline oxide semiconductor layer 145a and the second crystalline oxide semiconductor layer 145b is indicated by a dotted line, and the stacked structure of the first crystalline oxide semiconductor layer and the second crystalline oxide semiconductor layer is illustrated; however, the interface is actually not distinct and is illustrated for easy understanding.

The stack of the oxide semiconductor layers can be processed by being etched after a mask having a desired shape is formed over the stack of the oxide semiconductor layers. The mask may be formed by a method such as photolithography. Alternatively, a method such as an inkjet method may be used to form the mask.

For the etching of the stack of oxide semiconductor layers, either dry etching or wet etching may be employed. It is needless to say that both of them may be employed in combination.

A feature of the first crystalline oxide semiconductor layer and the second crystalline oxide semiconductor layer obtained by the above formation method is that these layers have c-axis alignment. Note that the first crystalline oxide semiconductor layer and the second crystalline oxide semiconductor layer comprise an oxide including a crystal with c-axis alignment (also referred to as c-axis aligned crystal (CAAC)), which has neither a single crystal structure nor an amorphous structure.

In any case, in order to obtain CAAC, it is important to form hexagonal crystals in an initial stage of deposition of an oxide semiconductor film and to cause crystal growth from the hexagonal crystals as a seed. In order to achieve this, it is preferable that a substrate heating temperature be 100° C. to 500° C., more preferably 200° C. to 400° C., still preferably 250° C. to 300° C. In addition, the deposited oxide semiconductor film is subjected to heat treatment at a temperature higher than the substrate heating temperature in the film formation. Accordingly, microdefects in the film and defects at the interface of stacked layers can be repaired.

Note that the first and second crystalline oxide semiconductor layers are formed using an oxide material containing at least Zn, for example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; or a Zn—O-based material. In addition, an In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide film containing indium (In), gallium (Ga), and zinc (Zn), and there is no limitation on the composition ratio thereof. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

After that, the source or drain electrodes 142a and 142b, the gate insulating layer 146, the gate electrode 148a, and the conductive layer 148b are formed; thus, a transistor 372 and a capacitor 374 are completed. Embodiment 2 can be referred to for materials and formation methods of the source or drain electrodes 142a and 142b, the gate insulating layer 146, the gate electrode 148a, and the conductive layer 148b.

The oxide semiconductor layer 145 including the stack of the oxide semiconductor layers formed by the above formation method can be used as appropriate for the semiconductor device disclosed in this specification (the transistor 162 and the transistor 172 described in Embodiment 2).

In the transistor 372, in which the stack of the oxide semiconductor layers of this embodiment is used as the oxide semiconductor layer 144, an electric field is not applied from one surface to the other surface of the oxide semiconductor layer and current does not flow in the thickness direction of the stack of the oxide semiconductor layers. The transistor has a structure in which current mainly flows along the interface of the stack of the oxide semiconductor layers; therefore, even when the transistor 372 is irradiated with light or even when a BT stress is applied to the transistor 372, deterioration of transistor characteristics is suppressed or reduced.

By forming the transistor with the use of a stack of a first crystalline oxide semiconductor layer and a second crystalline oxide semiconductor layer, like the oxide semiconductor layer 145, the transistor can have stable electrical characteristics and high reliability.

This embodiment can be implemented in an appropriate combination with the structures described in the other embodiments.

Embodiment 4

In this embodiment, an example of a transistor in which an In—Sn—Zn-based oxide film is used as an oxide semiconductor layer will be described with reference to FIGS. 30A and 30B and the like.

Figure 30A:
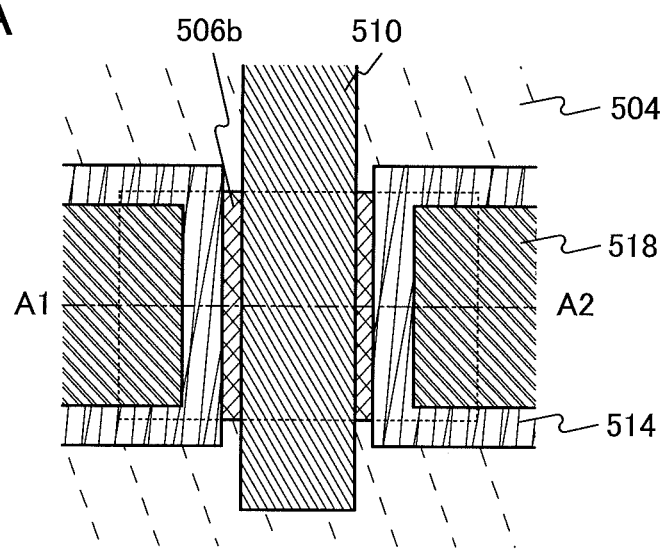
FIGS. 30A and 30B are a top view and a cross-sectional view of a semiconductor device.
Figure 30B:
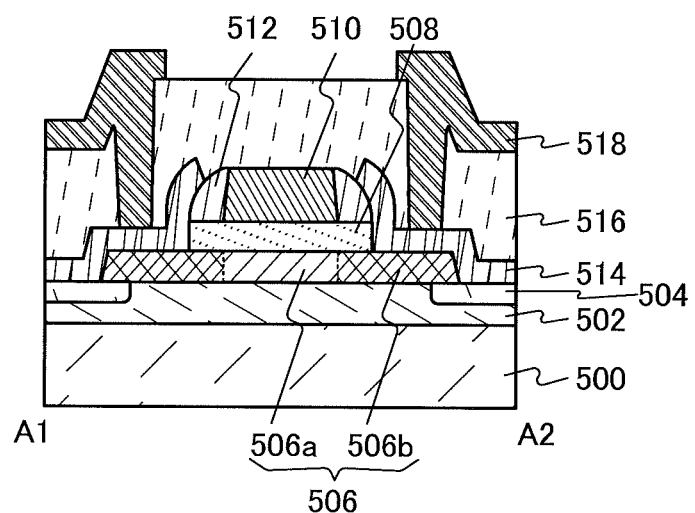

FIGS. 30A and 30B are a top view and a cross-sectional view of a coplanar transistor having a top-gate top-contact structure. FIG. 30A is the top view of the transistor. FIG. 30B is a cross-sectional view along dashed-dotted line A1-A2 in FIG. 30A.

The transistor illustrated in FIG. 30B includes a substrate 500; a base insulating layer 502 provided over the substrate 500; a protective insulating layer 504 provided in the periphery of the base insulating layer 502; an oxide semiconductor layer 506 provided over the base insulating layer 502 and the protective insulating layer 504 and including a high-resistance region 506a and low-resistance regions 506b; a gate insulating layer 508 provided over the oxide semiconductor layer 506; a gate electrode 510 provided to overlap with the oxide semiconductor layer 506 with the gate insulating layer 508 positioned therebetween; a sidewall insulating layer 512 provided in contact with a side surface of the gate electrode 510; a pair of electrodes 514 provided in contact with at least the low-resistance regions 506b; an interlayer insulating layer 516 provided to cover at least the oxide semiconductor film 506, the gate electrode 510, and the pair of electrodes 514; and a wiring 518 provided to be connected to at least one of the pair of electrodes 514 through an opening formed in the interlayer insulating layer 516.

Although not illustrated, a protective film may be provided to cover the interlayer insulating layer 516 and the wiring 518. With the protective film, a minute amount of leakage current generated by surface conduction of the interlayer insulating layer 516 can be reduced and thus the off-state current of the transistor can be reduced.

Embodiment 5

In this embodiment, another example of a transistor in which an In—Sn—Zn-based oxide film is used as an oxide semiconductor layer will be described.

Figure 31A:
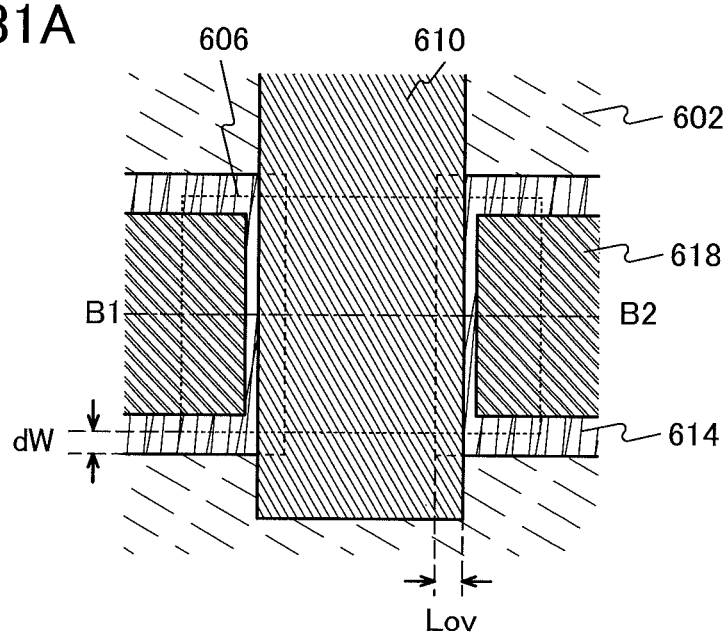
FIGS. 31A and 31B are a top view and a cross-sectional view of a semiconductor device.
Figure 31B:
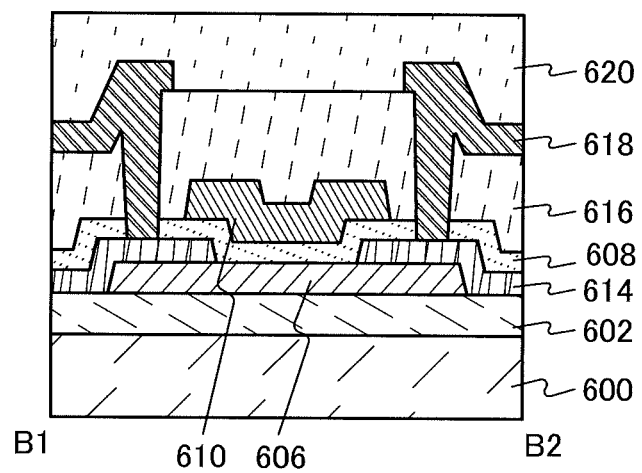

FIGS. 31A and 31B are a top view and a cross-sectional view which illustrate a structure of a transistor manufactured in this embodiment. FIG. 31A is the top view of the transistor. FIG. 31B is a cross-sectional view along dashed-dotted line B1-B2 in FIG. 31A.

The transistor illustrated in FIG. 31B includes a substrate 600; a base insulating layer 602 provided over the substrate 600; an oxide semiconductor layer 606 provided over the base insulating layer 602; a pair of electrodes 614 in contact with the oxide semiconductor layer 606; a gate insulating layer 608 provided over the oxide semiconductor layer 606 and the pair of electrodes 614; a gate electrode 610 provided to overlap with the oxide semiconductor layer 606 with the gate insulating layer 608 positioned therebetween; an interlayer insulating layer 616 provided to cover the gate insulating layer 608 and the gate electrode 610; wirings 618 connected to the pair of electrodes 614 through openings formed in the gate insulating layer 608 and the interlayer insulating layer 616; and a protective film 620 provided to cover the interlayer insulating layer 616 and the wirings 618.

As the substrate 600, a glass substrate is used. As the base insulating layer 602, a silicon oxide film is used. As the oxide semiconductor layer 606, an In—Sn—Zn-based oxide film is used. As the pair of electrodes 614, a tungsten film is used. As the gate insulating layer 608, a silicon oxide film is used. The gate electrode 610 has a stacked structure of a tantalum nitride film and a tungsten film. The interlayer insulating layer 616 has a stacked structure of a silicon oxynitride film and a polyimide film. The wirings 618 each have a stacked structure in which a titanium film, an aluminum film, and a titanium film are formed in this order. As the protective film 620, a polyimide film is used.

Note that in the transistor having the structure illustrated in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor layer 606, is referred to as dW.

Embodiment 6

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 3]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 4]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region can be expressed as the following formula.

$$I_d = \frac{W\mu V_g V_d C_{ox}}{L}\exp\left(-\frac{E}{kT}\right) \quad \text{[Formula 5]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} \quad \text{[Formula 6]}$$
$$= \ln\left(\frac{W\mu V_d C_{ox}}{L}\right) - \frac{e^3 N^2 t}{8kT\varepsilon C_{ox} V_g}$$

The right side of Formula 6 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/cm^2$.

On the basis of the defect density obtained in this manner, or the like, $\mu_0$ can be calculated to be 120 cm²/Vs from Formula 3 and Formula 4. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \quad \text{[Formula 7]}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 7 is increased and accordingly the mobility $\mu_1$ is decreased.

Figure 18:
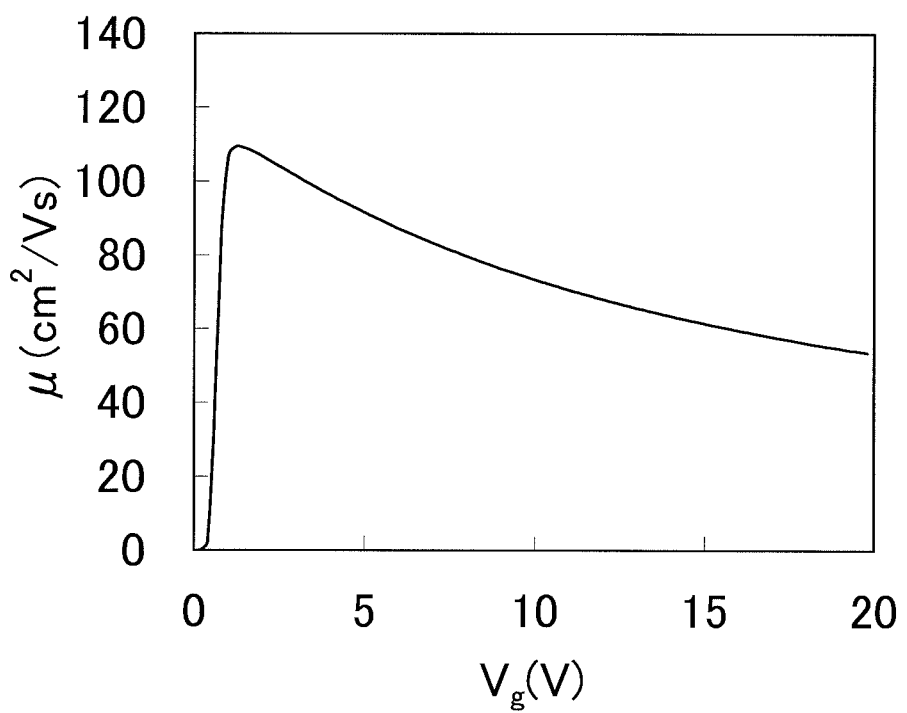
FIG. 18 shows the gate voltage dependence of mobility obtained by calculation.

Calculation results of the mobility $\mu_2$ of a transistor whose channel includes an ideal oxide semiconductor without a defect inside the semiconductor are shown in FIG. 18. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 1030a and a semiconductor region 1030c which have n$^+$-type conductivity in an oxide semiconductor layer. The resistivities of the semiconductor region 1030a and the semiconductor region 1030c are $2\times10^{-3}$ Ωcm.

The transistor illustrated in FIG. 22A is formed over a base insulating layer 1010 and an embedded insulator 1020 which is embedded in the base insulating layer 1010 and formed of aluminum oxide. The transistor includes the semiconductor region 1030a, the semiconductor region 1030c, an intrinsic semiconductor region 1030b serving as a channel formation region therebetween, and a gate 1050. The width of the gate 1050 is 33 nm.

A gate insulating layer 1040 is formed between the gate 1050 and the semiconductor region 1030b. In addition, a sidewall insulator 1060a and a sidewall insulator 1060b are formed on both side surfaces of the gate 1050, and an insulator 1070 is formed over the gate 1050 so as to prevent a short circuit between the gate 1050 and another wiring. The sidewall insulator has a width of 5 nm. A source 1080a and a drain 1080b are provided in contact with the semiconductor region 1030a and the semiconductor region 1030c, respectively. Note that the channel width of this transistor is 40 nm.

The transistor of FIG. 22B is the same as the transistor of FIG. 22A in that it is formed over the base insulating layer 1010 and the embedded insulator 1020 formed of aluminum oxide and that it includes the semiconductor region 1030a, the semiconductor region 1030c, the intrinsic semiconductor region 1030b provided therebetween, the gate 1050 having a width of 33 nm, the gate insulating layer 1040, the sidewall insulator 1060a, the sidewall insulator 1060b, the insulator 1070, the source 1080a, and the drain 1080b.

The transistor illustrated in FIG. 22B is different from the transistor illustrated in FIG. 22A in the conductivity type of semiconductor regions under the sidewall insulator 1060a and the sidewall insulator 1060b. In the transistor illustrated in FIG. 22A, the semiconductor regions under the sidewall insulator 1060a and the sidewall insulator 1060b are part of the semiconductor region 1030a having n$^+$-type conductivity and part of the semiconductor region 1030c having n$^+$-type conductivity, whereas in the transistor illustrated in FIG. 22B, the semiconductor regions under the sidewall insulator 1060a and the sidewall insulator 1060b are part of the intrinsic semiconductor region 1030b. In other words, in the semiconductor layer of FIG. 22B, a region having a width of $L_{off}$ which overlaps with neither the semiconductor region 1030a (the semiconductor region 1030c) nor the gate 1050 is provided.

This region is called an offset region, and the width $L_{off}$ is called an offset length. As is seen from the drawing, the offset length is equal to the width of the sidewall insulator 1060a (the sidewall insulator 1060b).

Figure 19A:
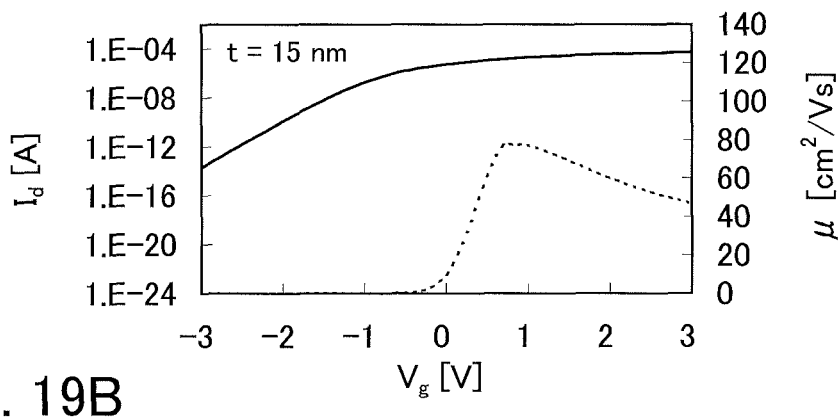
FIGS. 19A to 19C show the gate voltage dependence of drain current and mobility obtained by calculation.
Figure 19B:
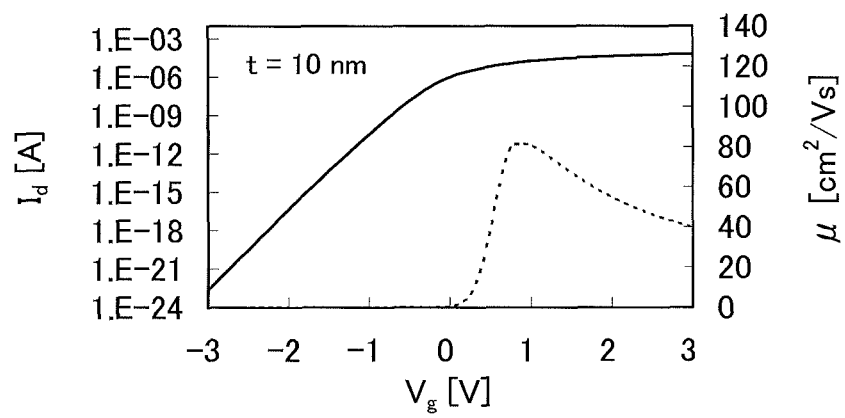
Figure 19C:
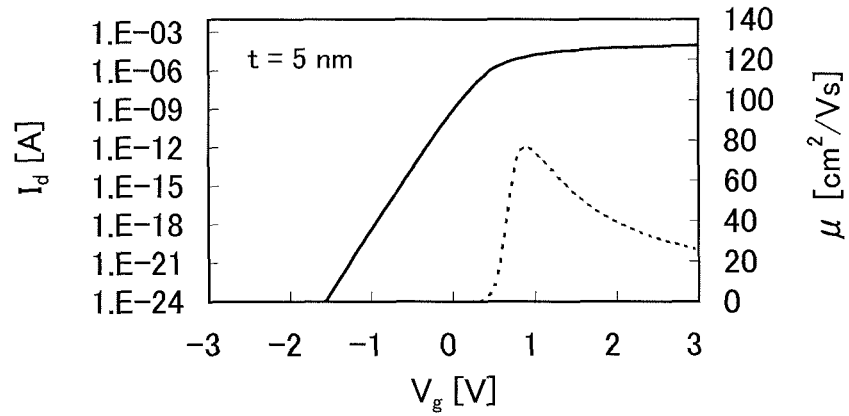

The other parameters used in calculation are as described above. For the calculation, device simulation software Sentaurus Device manufactured by Synopsys, Inc. was used. FIGS. 19A to 19C show the gate voltage ($V_g$: a potential difference between the gate and the source) dependence of the drain current ($I_d$, a solid line) and the mobility ($\mu$, a dotted line) of the transistor having the structure illustrated in FIG. 22A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 19A shows the gate voltage dependence of the transistor in the case where the thickness of the gate insulating layer is 15 nm, FIG. 19B shows that of the transistor in the case where the thickness of the gate insulating layer is 10 nm, and FIG. 19C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility $\mu$ and the drain current $I_d$ in an on state (on-state current). The graphs show that the drain current exceeds 10 μA, which is required in a memory element and the like, at a gate voltage of around 1 V.

Figure 20A:
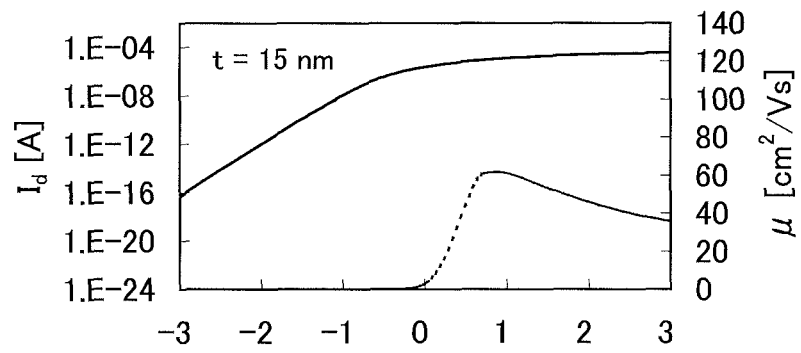
FIGS. 20A to 20C show the gate voltage dependence of drain current and mobility obtained by calculation.
Figure 20B:
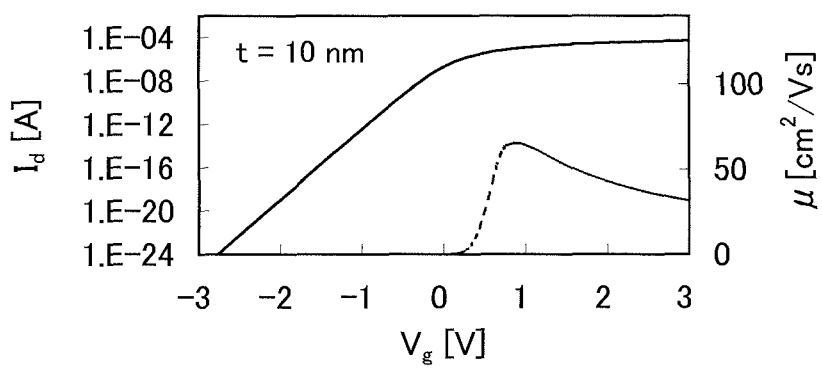
Figure 20C:
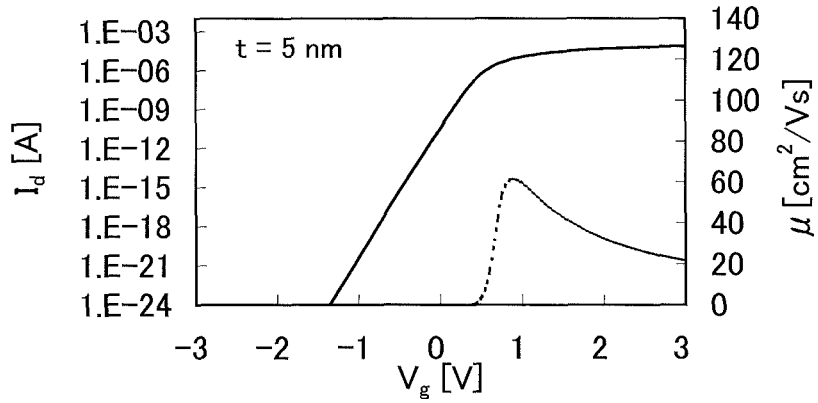

FIGS. 20A to 20C show the gate voltage $V_g$ dependence of the drain current $I_d$ (a solid line) and the mobility $\mu$ (a dotted line) of the transistor having the structure illustrated in FIG. 22B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 20A shows the gate voltage dependence of the transistor in the case where the thickness of the gate insulating layer is 15 nm, FIG. 20B shows that of the transistor in the case where the thickness of the gate insulating layer is 10 nm, and FIG. 20C shows that of the transistor in the case where the thickness of the gate insulating layer is 5 nm.

Figure 21A:
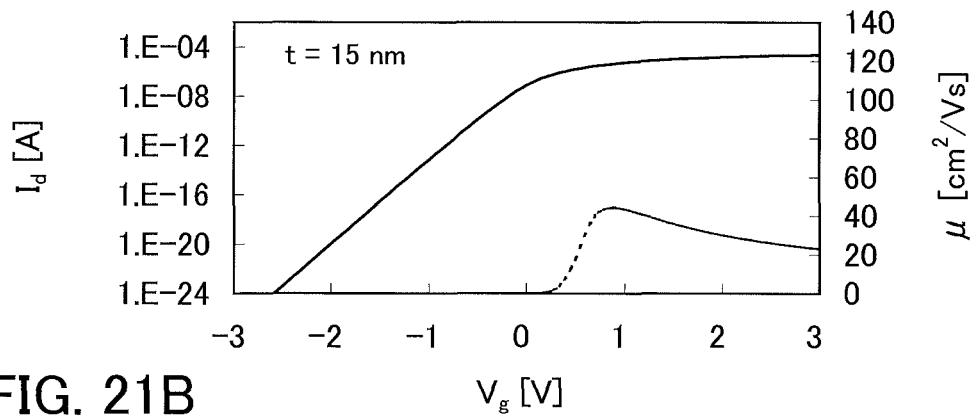
FIGS. 21A to 21C show the gate voltage dependence of drain current and mobility obtained by calculation.
Figure 21B:
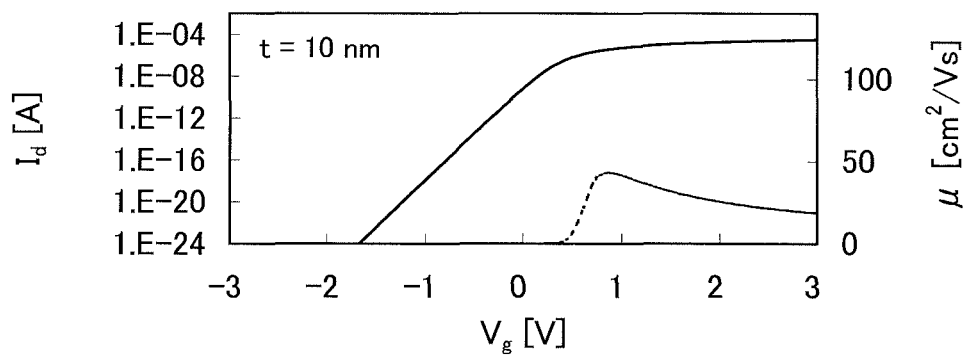
Figure 21C:
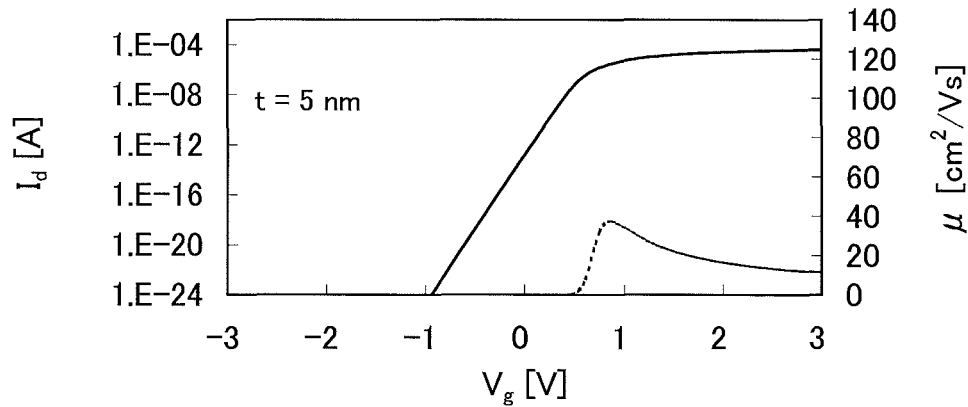

Further, FIGS. 21A to 21C show the gate voltage dependence of the drain current $I_d$ (a solid line) and the mobility $\mu$ (a dotted line) of the transistor having the structure illustrated in FIG. 22B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 19A to 19C, approximately 60 cm$^2$/Vs in FIGS. 20A to 20C, and approximately 40 cm$^2$/Vs in FIGS. 21A to 21C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

A transistor in which an oxide semiconductor including In, Sn, and Zn is used as a channel formation region can have favorable characteristics by depositing the oxide semiconductor while heating a substrate or by performing heat treatment after an oxide semiconductor layer is formed. Note that a main component refers to an element included in a composition at greater than or equal to 5 atomic %.

By intentionally heating the substrate after formation of the oxide semiconductor layer including In, Sn, and Zn, the field-effect mobility of the transistor can be improved. Further, the threshold voltage of the transistor can be positively shifted to make the transistor normally off.

Figure 23A:
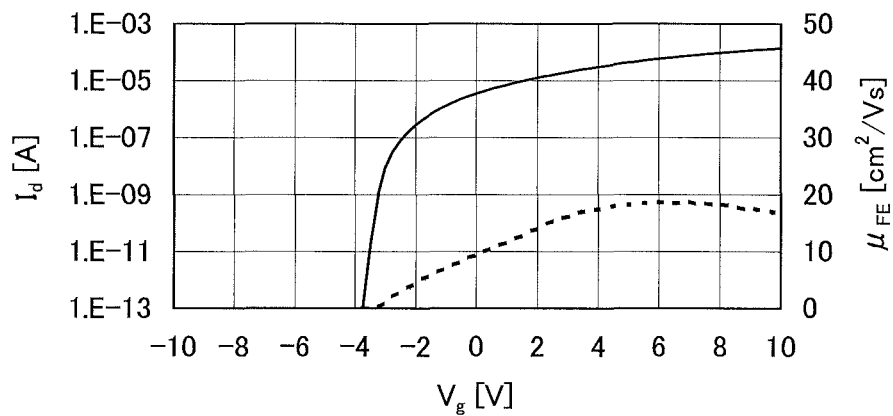
FIGS. 23A to 23C are graphs each showing characteristics of a transistor including an oxide semiconductor layer.
Figure 23B:
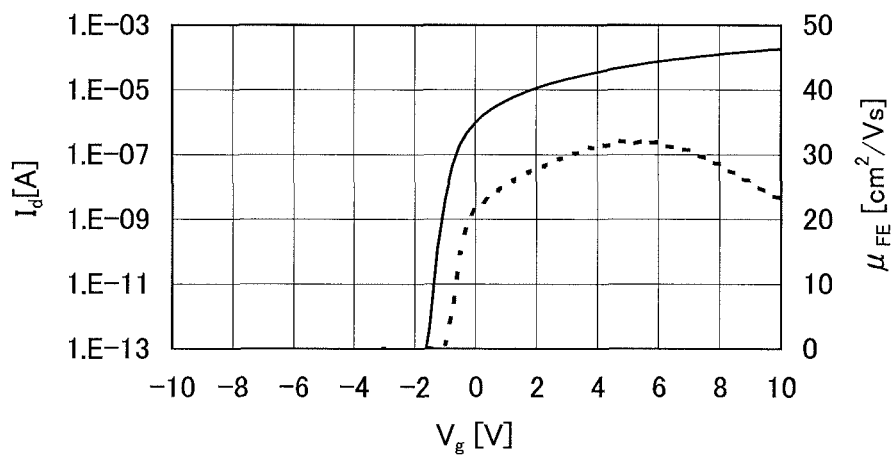
Figure 23C:
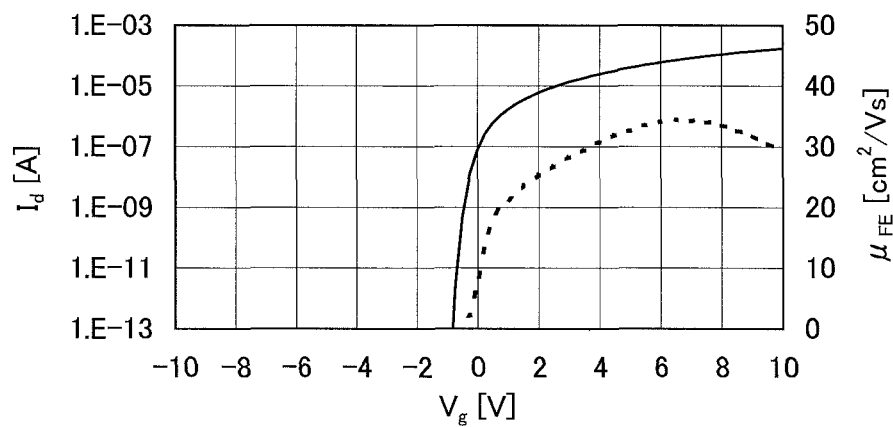

As an example, FIGS. 23A to 23C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 23A shows characteristics of a transistor whose oxide semiconductor layer including In, Sn, and Zn was formed by a sputtering method without heating a substrate intentionally. The field-effect mobility of the transistor is 18.8 cm$^2$/Vsec. On the other hand, when the oxide semiconductor layer including In, Sn, and Zn is formed while heating the substrate intentionally, the field-effect mobility can be improved. FIG. 23B shows characteristics of a transistor whose oxide semiconductor layer including In, Sn, and Zn was formed while heating a substrate at 200° C. The field-effect mobility of the transistor is 32.2 cm$^2$/Vsec.

The field-effect mobility can be further improved by performing heat treatment after formation of the oxide semiconductor layer including In, Sn, and Zn. FIG. 23C shows characteristics of a transistor whose oxide semiconductor layer including In, Sn, and Zn was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor layer. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor layer that includes In, Sn, and Zn and is formed without heating a substrate intentionally is used as a channel formation region, the threshold voltage tends to be shifted negatively. However, when the oxide semiconductor layer formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor layer having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied under a condition of 2 MV/cm at 150° C. for one hour, drift of the threshold voltage can be less than ±1.5 V, preferably less than ±1.0 V.

Next, a BT test was performed on the following two transistors: Sample 1 on which heat treatment was not performed after formation of an oxide semiconductor layer, and Sample 2 on which heat treatment at 650° C. was performed after formation of an oxide semiconductor layer. Note that FIGS. 31A and 31B may be referred to for the structures of the transistors of Sample 1 and Sample 2.

First, $V_g$-$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that an electric field intensity applied to the gate insulating layer 608 was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that an electric field intensity applied to the gate insulating layer 608 was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 24A:
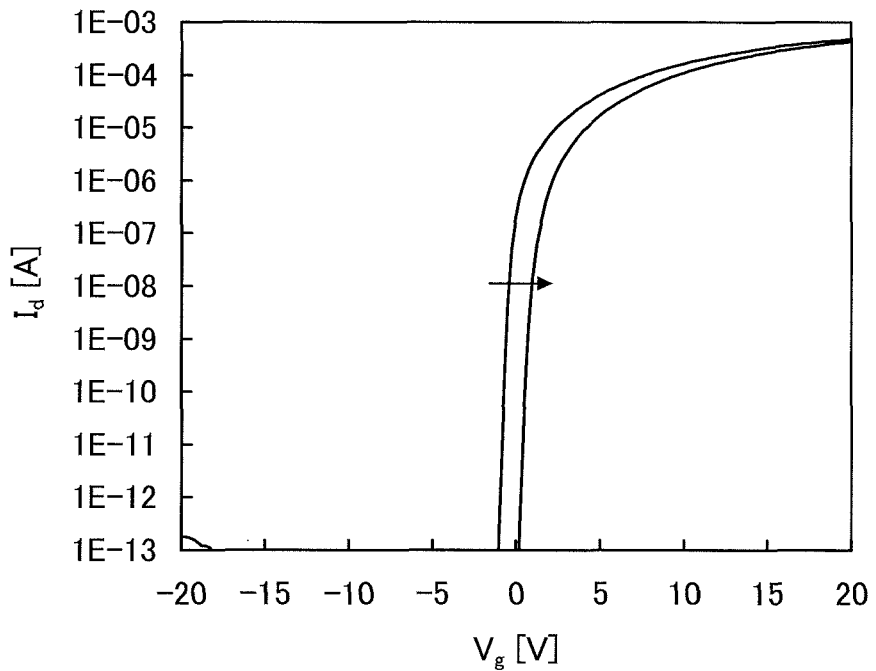
FIGS. 24A and 24B show $V_g$-$I_d$ characteristics after a BT test of a transistor of Sample 1.
Figure 24B:
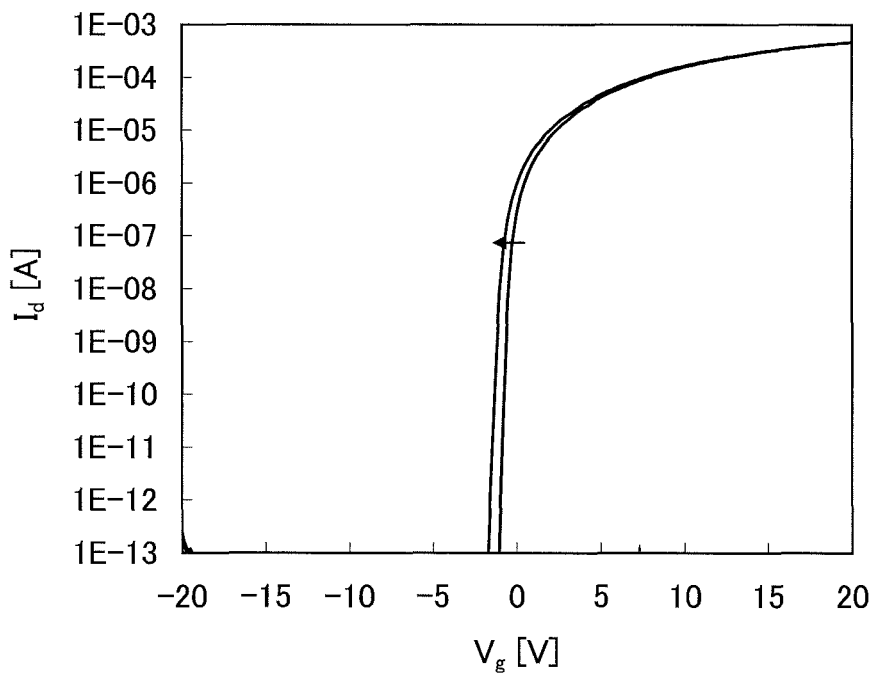
Figure 25A:
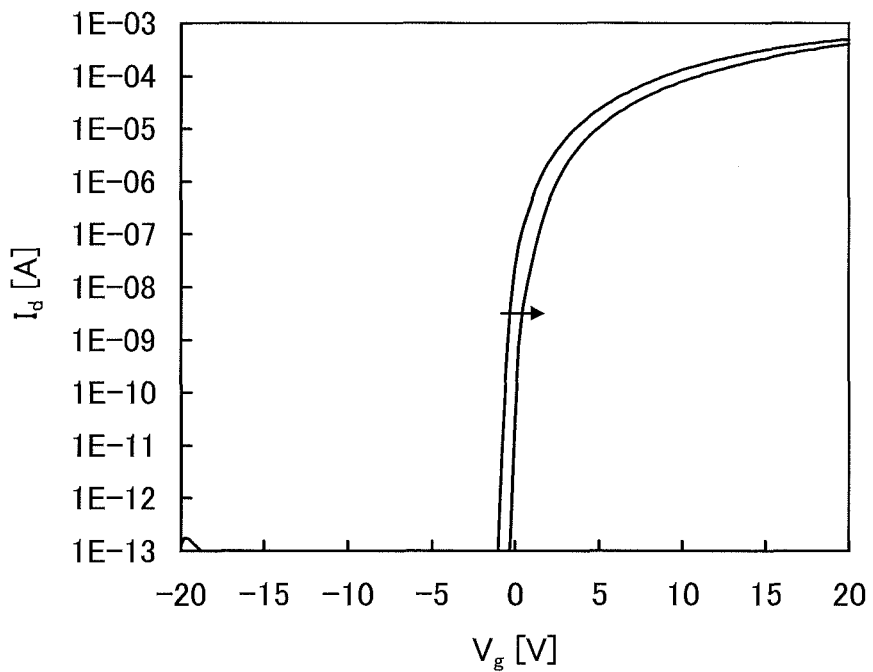
FIGS. 25A and 25B show $V_g$-$I_d$ characteristics after a BT test of a transistor of Sample 2.
Figure 25B:
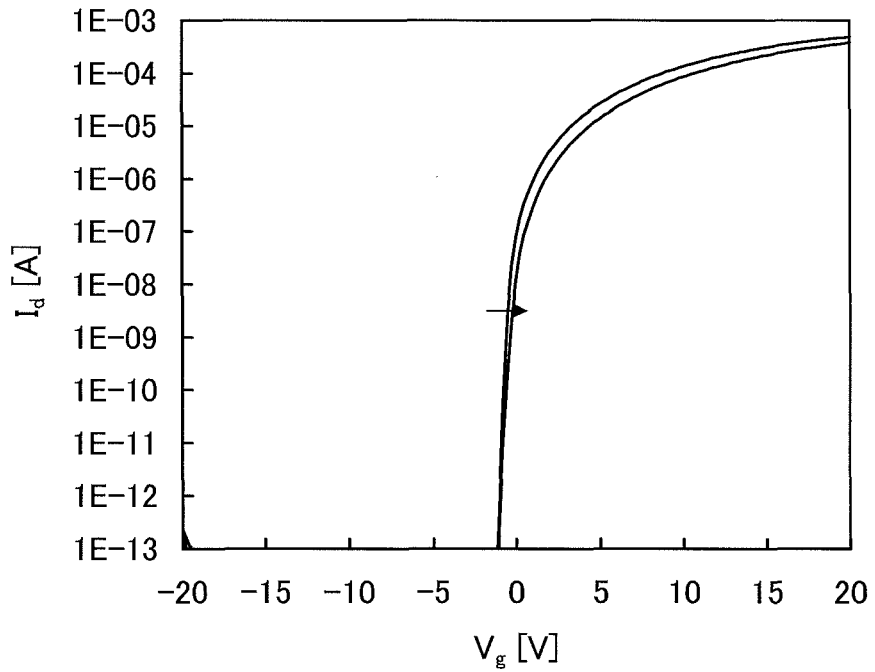

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor layer may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor layer can be obtained. For example, when an oxide semiconductor layer which is formed by sputtering using a target having a composition ratio of In:Sn:Zn=1:1:1 without heating a substrate intentionally is analyzed by X-ray diffraction (XRD), a halo pattern is observed. The formed oxide semiconductor layer can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn-based oxide film with a thickness of 100 nm was formed over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn-based oxide target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 26:
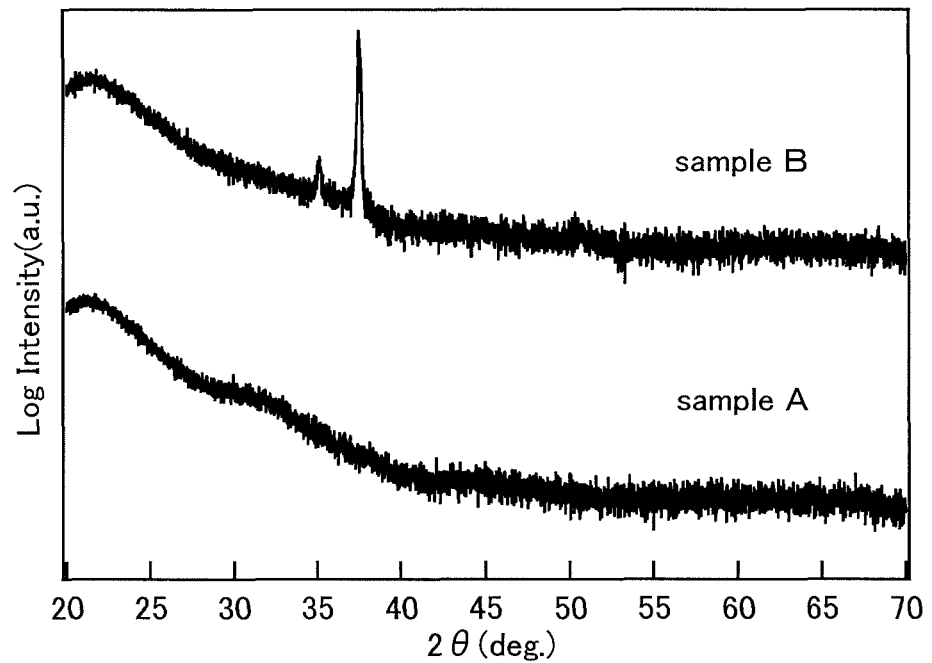
FIG. 26 shows XRD spectra of Sample A and Sample B.

FIG. 26 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor including In, Sn, and Zn and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/µm or lower. Here, the unit of the off-state current is used to indicate current per micrometer of a channel width.

Figure 27:
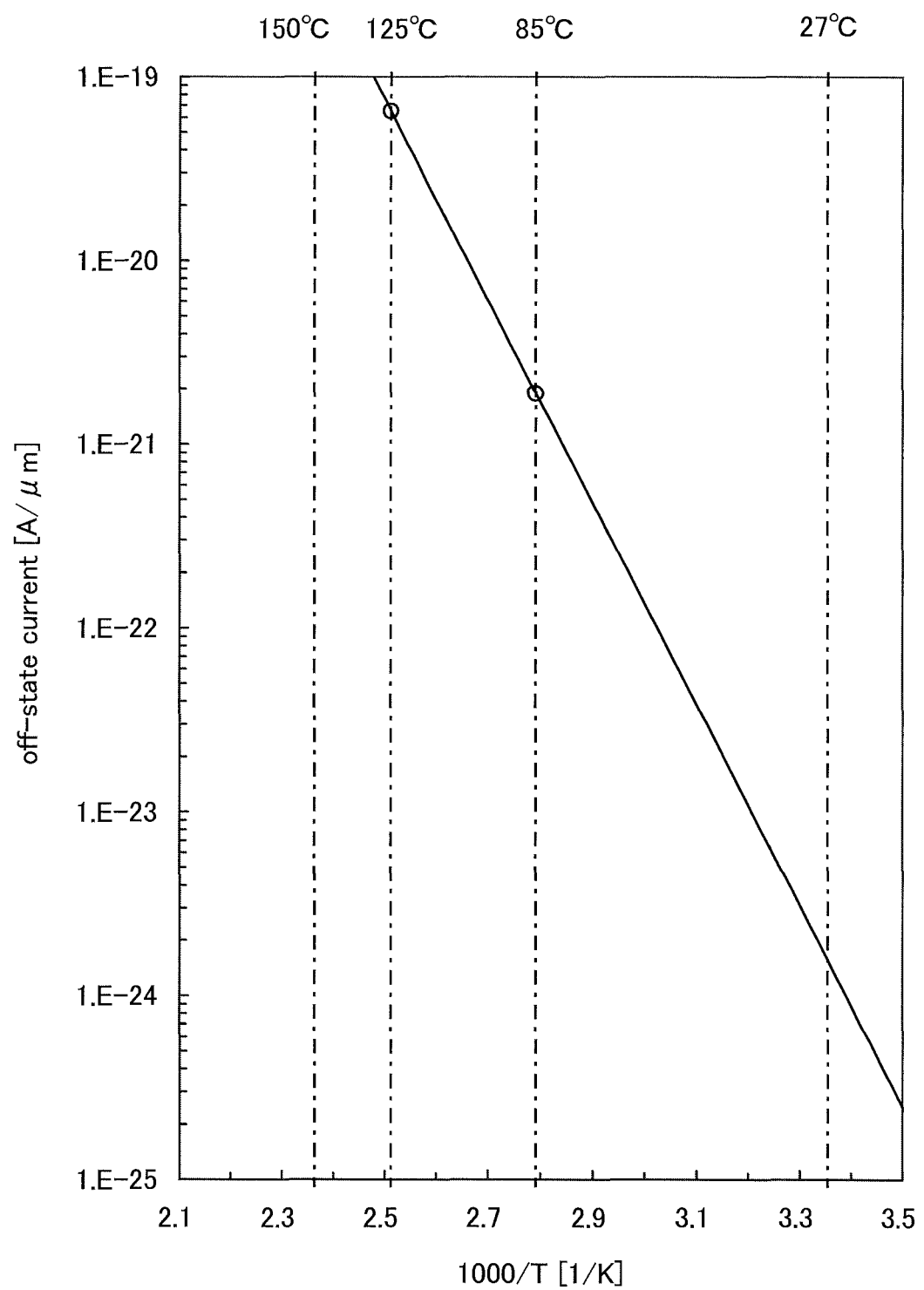
FIG. 27 is a graph showing relation between off-state current and substrate temperature in measurement of a transistor.

FIG. 27 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 27, the off-state current can be 1 aA/µm ($1\times10^{-18}$ A/µm) or lower, 100 zA/µm ($1\times10^{-19}$ A/µm) or lower, and 1 zA/µm ($1\times10^{-21}$ A/µm) or lower when the substrate temperature is 125° C., 85° C., and room temperature (27° C.), respectively. Preferably, the off-state current can be 0.1 aA/µm ($1\times10^{-19}$ A/µm) or lower, 10 zA/µm ($1\times10^{-20}$ A/µm) or lower, and 0.1 zA/µm ($1\times10^{-22}$ A/µm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor layer during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn by heat treatment, a film which does not include moisture originally is preferably formed because moisture is released from the oxide semiconductor including In, Sn, and Zn at a higher temperature than from an oxide semiconductor including In, Ga, and Zn as main components.

The relation between the substrate temperature and electrical characteristics of a transistor formed using Sample B, on which heat treatment at 650° C. was performed after formation of the oxide semiconductor layer, was evaluated.

The transistor used for the measurement has a channel length L of 3 µm, a channel width W of 10 µm, Lov of 0 µm, and dW of 0 µm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 28:
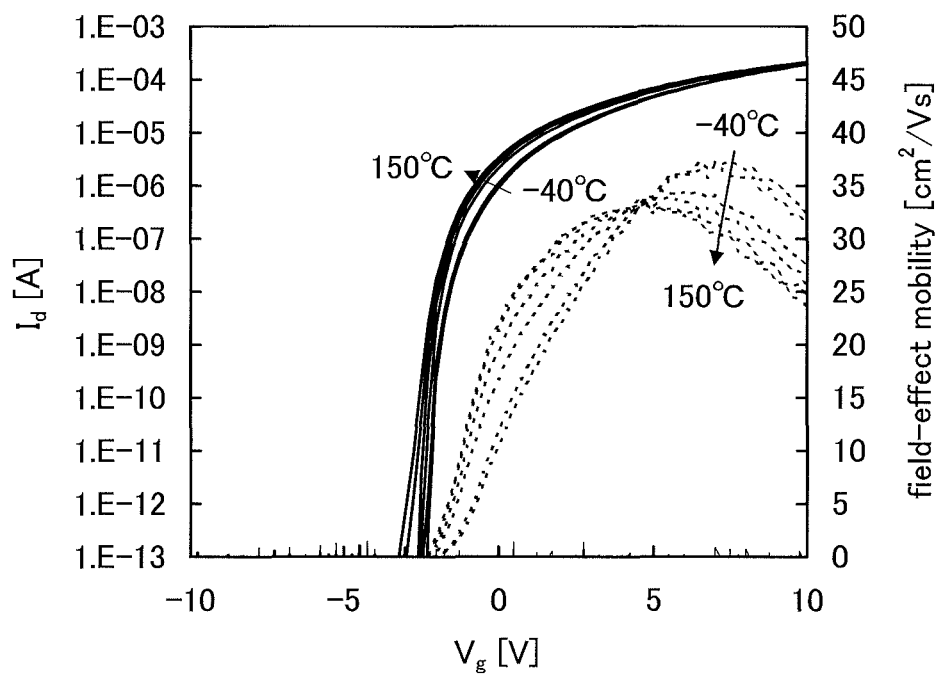
FIG. 28 is a graph showing $V_g$ dependence of $I_d$ and the field-effect mobility.
Figure 29A:
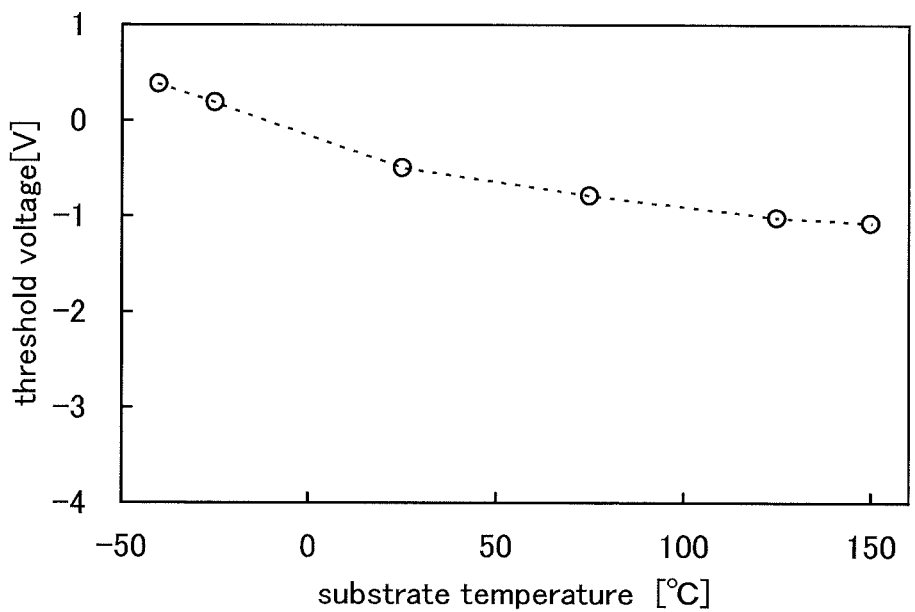
FIG. 29A is a graph showing relation between substrate temperature and threshold voltage.

FIG. 28 shows the $V_g$ dependence of $I_d$ (a solid line) and field-effect mobility (a dotted line). FIG. 29A shows a relation between the substrate temperature and the threshold voltage, and FIG. 29B shows a relation between the substrate temperature and the field-effect mobility.

From FIG. 29A, it is found that the threshold voltage gets lower as the substrate temperature increases. Note that the threshold voltage is decreased from 0.38 V to −1.08 V in the range from −40° C. to 150° C.

Figure 29B:
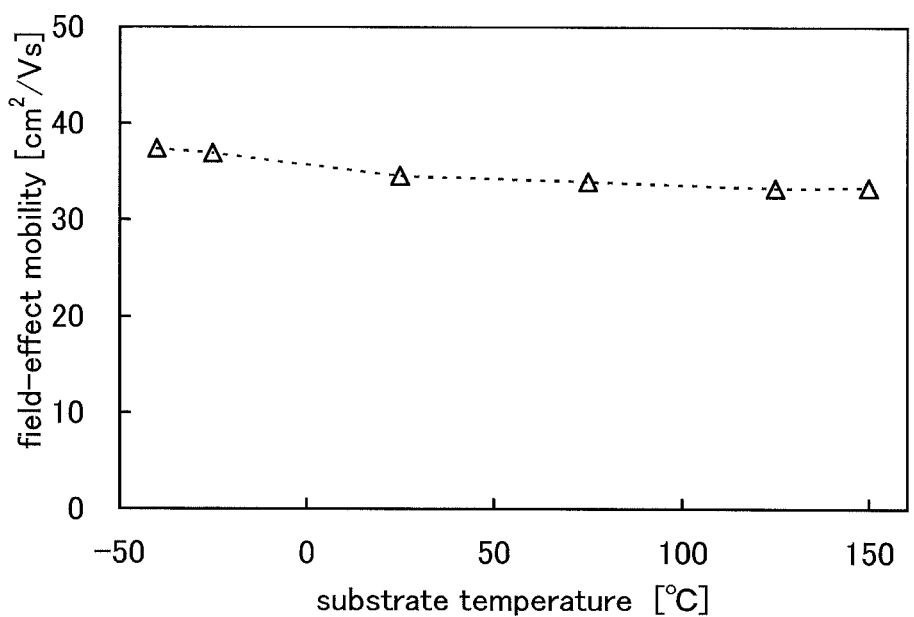
FIG. 29B is a graph showing relation between substrate temperature and the field-effect mobility.

From FIG. 29B, it is found that the field-effect mobility gets lower as the substrate temperature increases. Note that the field-effect mobility is decreased from 37.4 cm²/Vs to 33.4 cm²/Vs in the range from −40° C. to 150° C. Thus, it is found that variation in electrical characteristics is small in the above temperature range.

In a transistor in which such an oxide semiconductor including In, Sn, and Zn is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/µm or lower, which can achieve on-state current needed for an LSI. For example, in an FET where L/W is 33 nm/40 nm, an on-state current of 12 µA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Embodiment 7

In this embodiment, application of the semiconductor device described in any of the above embodiments to an electronic device will be described with reference to FIGS. 13A to 13F. In this embodiment, application of the above-described semiconductor device to electronic devices such as a computer, a cellular phone (also referred to as a mobile phone or a mobile phone set), a portable information terminal (including a portable game machine, an audio reproducing device, and the like), a camera such as a digital camera or a digital video camera, electronic paper, and a television set (also referred to as a television or a television receiver) is described.

Figure 13A:
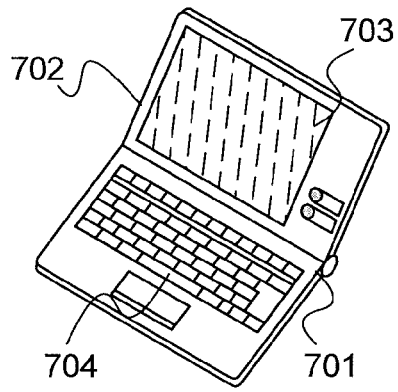
FIGS. 13A to 13F each illustrate an electronic device.

FIG. 13A illustrates a notebook personal computer that includes a housing 701, a housing 702, a display portion 703, a keyboard 704, and the like. The semiconductor device described in any of the above embodiments is provided inside at least one of the housings 701 and 702. Therefore, a notebook personal computer in which writing and reading of data are performed at high speed, data is stored for a long time, and power consumption is sufficiently reduced can be realized.

Figure 13D:
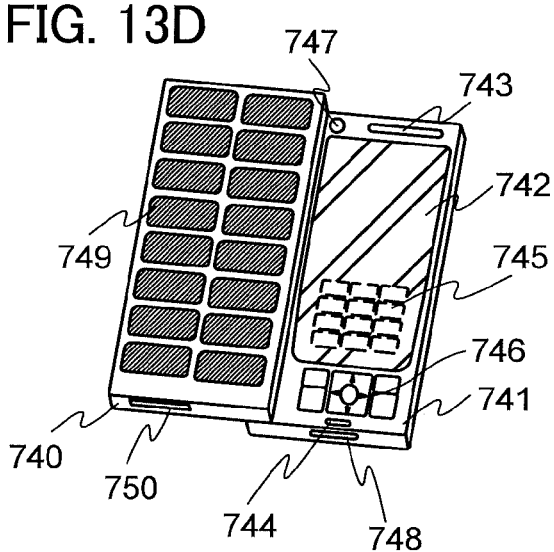
Figure 13B:
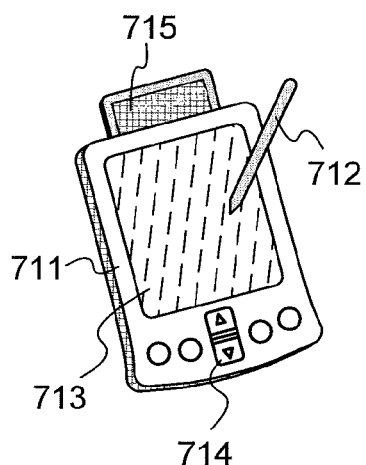

FIG. 13B illustrates a personal digital assistant (PDA). In a main body 711, a display portion 713, an external interface 715, an operation button 714, and the like are provided. Further, a stylus 712 and the like for operation of the personal digital assistant are provided. The semiconductor device described in any of the above embodiments is provided inside the main body 711. Therefore, a personal digital assistant in which writing and reading of data are performed at high speed, data is stored for a long time, and power consumption is sufficiently reduced can be realized.

Figure 13E:
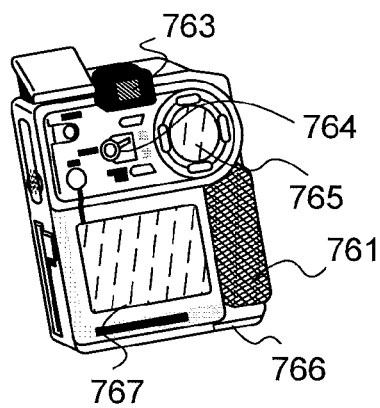
Figure 13C:
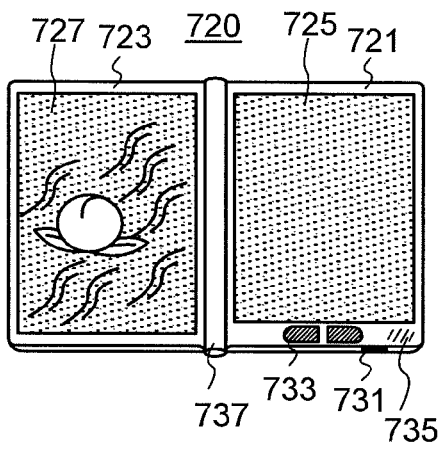

FIG. 13C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, and the like. At least one of the housings 721 and 723 is provided with the memory device described in any of the above embodiments. Therefore, an e-book reader in which writing and reading of data are performed at high speed, data is stored for a long time, and power consumption is sufficiently reduced can be realized.

FIG. 13D illustrates a cellular phone which includes two housings, a housing 740 and a housing 741. Moreover, the housings 740 and 741 which are shown unfolded in FIG. 13D can overlap with each other by sliding; thus, the size of the cellular phone can be reduced, which makes the cellular phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in any of the above embodiments. Therefore, a cellular phone in which writing and reading of data are performed at high speed, data is stored for a long time, and power consumption is sufficiently reduced can be realized.

FIG. 13E illustrates a digital camera which includes a main body 761, a display portion 767, an eyepiece 763, an operation switch 764, a display portion 765, a battery 766, and the like. The semiconductor device described in any of the above embodiments is provided inside the main body 761. Therefore, a digital camera in which writing and reading of data are performed at high speed, data is stored for a long time, and power consumption is sufficiently reduced can be realized.

Figure 13F:
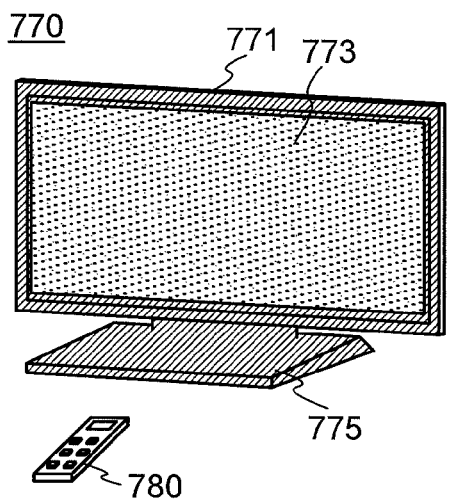

FIG. 13F illustrates a television set 770 which includes a housing 771, a display portion 773, a stand 775, and the like. The television set 770 can be operated with an operation switch of the housing 771 or a remote controller 780. The semiconductor device described in any of the above embodiments is mounted on the housing 771 and the remote controller 780. Therefore, a television set in which writing and reading of data are performed at high speed, data is stored for a long time, and power consumption is sufficiently reduced can be realized.

As described above, the semiconductor device in any of the above embodiments is mounted on each of the electronic devices described in this embodiment. Therefore, electronic devices in which power consumption is reduced can be realized.

EXPLANATION OF REFERENCE

100: substrate, 102: protective layer, 104: semiconductor region, 106: element isolation insulating layer, 108: gate insulating layer, 110: gate electrode, 116: channel formation region, 120: impurity region, 122: metal layer, 124: metal compound region, 126: electrode, 128: insulating layer, 130a: source electrode or drain electrode, 130b: source electrode or drain electrode, 136a: conductive layer, 136b: conductive layer, 136c: conductive layer, 140: insulating layer, 142a: source electrode or drain electrode, 142b: source electrode or drain electrode, 142c: electrode, 144: oxide semiconductor layer, 145: oxide semiconductor layer, 145a: crystalline oxide semiconductor layer, 145b: crystalline oxide semiconductor layer, 146: gate insulating layer, 148a: gate electrode, 148b: conductive layer, 150: insulating layer, 152: insulating layer, 154a: electrode, 154b: electrode, 156: wiring, 162: transistor, 164: capacitor, 170: memory cell, 172: transistor, 174: capacitor, 180: transistor, 181: transistor, 182: transistor, 183: transistor, 184: transistor, 185: transistor, 186: transistor, 187: transistor, 188: transistor, 190: sense latch, 201: sense latch array, 202: memory cell array, 203: first word line driver circuit, 204: data line driver circuit, 205: second word line driver circuit, 241: reading circuit, 242: writing circuit, 243: precharge circuit, 372: transistor, 374: capacitor, 500: substrate, 502: base insulating layer, 504: protective insulating layer, 506: oxide semiconductor layer, 506a: high-resistance region, 506b: low-resistance region, 508: gate insulating layer, 510: gate electrode, 512: sidewall insulating layer, 514: electrode, 516: interlayer insulating layer, 518: wiring, 600: substrate, 602: base insulating layer, 606: oxide semiconductor layer, 608: gate insulating layer, 610: gate electrode, 614: electrode, 616: interlayer insulating layer, 618: wiring, 620: protective film, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power switch, 733: operation key, 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television set, 771: housing, 773: display portion, 775: stand, 780: remote controller, 1010: base insulating layer, 1020: embedded insulator, 1030a: semiconductor region, 1030b: semiconductor region, 1030c: semiconductor region, 1040: gate insulating layer, 1050: gate, 1060a: sidewall insulator, 1060b: sidewall insulator, 1070: insulator, 1080a: source, and 1080b: drain.

This application is based on Japanese Patent Application serial no. 2010-249111 filed with Japan Patent Office on Nov. 5, 2010, and Japanese Patent Application serial no. 2011-113176 filed with Japan Patent Office on May 20, 2011, the entire contents of which are hereby incorporated by reference.

The invention claimed is:

1. A semiconductor device comprising:
a peripheral circuit formed by utilizing a semiconductor substrate;
a memory cell array over the peripheral circuit; and
an insulating layer between the peripheral circuit and the memory cell array, the insulating layer comprising an opening,
wherein the peripheral circuit comprises a plurality of sense latches arranged in matrix,
wherein the memory cell array comprises a plurality of memory cells arranged in matrix,
wherein each of the plurality of memory cells comprises:
a transistor comprising a gate electrode, a source electrode, a drain electrode, a gate insulating layer, and an oxide semiconductor layer; and
a capacitor,
wherein each of the plurality of sense latches comprises a first terminal and a second terminal, and
wherein at least one of the first terminal and the second terminal is electrically connected via at least an electrode in the opening of the insulating layer to one of the source electrode and the drain electrode of the transistor.

2. The semiconductor device according to claim 1, wherein the peripheral circuit is a sense latch array.

3. The semiconductor device according to claim 1, further comprising:
a first word line driver circuit;
a second word line driver circuit; and
a data line driver circuit,
wherein the first word line driver circuit is electrically connected to the plurality of memory cells through first word lines, wherein the second word line driver circuit is electrically connected to the plurality of sense latches through second word lines, and wherein the data line driver circuit is electrically connected to the plurality of sense latches through first data lines and second data lines.

4. The semiconductor device according to claim 1, wherein the semiconductor substrate comprises a semiconductor material other than a material for the oxide semiconductor layer.

5. A semiconductor device comprising:
a peripheral circuit formed by utilizing a semiconductor substrate;
a plurality of memory cell arrays stacked over the peripheral circuit; and
an insulating layer between the peripheral circuit and the plurality of memory cell arrays, the insulating layer comprising an opening,
wherein the peripheral circuit comprises a plurality of sense latches arranged in matrix,
wherein each of the plurality of memory cell arrays comprises a plurality of memory cells arranged in matrix,
wherein each of the plurality of memory cells comprises:
a transistor comprising a gate electrode, a source electrode, a drain electrode, a gate insulating layer, and an oxide semiconductor layer; and
a capacitor,
wherein each of the plurality of sense latches comprises a first terminal and a second terminal, and
wherein at least one of the first terminal and the second terminal is electrically connected via at least an electrode in the opening of the insulating layer to one of the source electrode and the drain electrode of the transistor.

6. The semiconductor device according to claim 5, wherein the peripheral circuit is a sense latch array.

7. The semiconductor device according to claim 5, further comprising:
a first word line driver circuit;
a second word line driver circuit; and
a data line driver circuit,
wherein the first word line driver circuit is electrically connected to the plurality of memory cells through first word lines,
wherein the second word line driver circuit is electrically connected to the plurality of sense latches through second word lines, and
wherein the data line driver circuit is electrically connected to the plurality of sense latches through first data lines and second data lines.

8. The semiconductor device according to claim 5, wherein each of the oxide semiconductor layers in the transistors in the plurality of memory cell arrays comprises a same oxide semiconductor material.

9. The semiconductor device according to claim 5, wherein the semiconductor substrate comprises a semiconductor material other than a material for the oxide semiconductor layer.

10. A semiconductor device comprising:
a peripheral circuit formed by utilizing a semiconductor substrate;
a first memory cell array and a second memory cell array stacked over the peripheral circuit; and
an insulating layer between the peripheral circuit and the first memory cell array, the insulating layer comprising an opening,
wherein the peripheral circuit comprises a plurality of sense latches arranged in matrix,
wherein each of the first memory cell array and the second memory cell array comprises a plurality of memory cells arranged in matrix,
wherein each of the plurality of memory cells included in the first memory cell array comprises:
a first transistor comprising a first gate electrode, a first source electrode, a first drain electrode, a first gate insulating layer, and a first oxide semiconductor layer; and
a first capacitor,
wherein each of the plurality of memory cells included in the second memory cell array comprises:
a second transistor comprising a second gate electrode, a second source electrode, a second drain electrode, a second gate insulating layer, and a second oxide semiconductor layer; and
a second capacitor,
wherein each of the plurality of sense latches comprises a first terminal and a second terminal, and
wherein at least one of the first terminal and the second terminal is electrically connected via at least an electrode in the opening of the insulating layer to one of the first source electrode and the first drain electrode of the first transistor, and one of the second source electrode and the second drain electrode of the second transistor.

11. The semiconductor device according to claim 10, wherein the peripheral circuit is a sense latch array.

12. The semiconductor device according to claim 10, further comprising:
a first word line driver circuit;
a second word line driver circuit; and
a data line driver circuit,
wherein the first word line driver circuit is electrically connected to each of the plurality of memory cells included in the first memory cell array and the second memory cell array through first word lines,
wherein the second word line driver circuit is electrically connected to the plurality of sense latches through second word lines, and
wherein the data line driver circuit is electrically connected to the plurality of sense latches through first data lines and second data lines.

13. The semiconductor device according to claim 10, wherein the first oxide semiconductor layer and the second oxide semiconductor layer comprise a same oxide semiconductor material.

14. The semiconductor device according to claim 10, wherein the semiconductor substrate comprises a semiconductor material other than a material for the first oxide semiconductor layer and the second oxide semiconductor layer.

* * * * *

UNITED STATES PATENT AND TRADEMARK OFFICE
CERTIFICATE OF CORRECTION

| | | |
|---|---|---|
| PATENT NO. | : 8,896,046 B2 | Page 1 of 1 |
| APPLICATION NO. | : 13/285450 | |
| DATED | : November 25, 2014 | |
| INVENTOR(S) | : Kiyoshi Kato | |

It is certified that error appears in the above-identified patent and that said Letters Patent is hereby corrected as shown below:

In The Specification

Column 10, line 53, after "includes" replace "in" with --m--;

Column 14, line 56, after "q," replace "in" with --m--;

Column 14, line 66, before "second" insert --m--;

Column 14, line 67, after "of" replace "in" with --m--;

Column 19, line 37, replace "farmed" with --formed--;

Column 20, line 43, replace "SOT" with --SOI--;

Column 20, line 52, replace "SOT" with --SOI--;

Column 21, line 37, replace "CAR" with --CMP--;

Column 24, line 9, replace "farmed" with --formed--;

Column 24, line 62, replace "$(ZnO)_m$" with --$(ZnO)_n$--;

Column 40, line 63, after "area" insert --,--; and

Column 48, line 1, replace "Vin" with --V in--.

Signed and Sealed this
Twenty-first Day of July, 2015

Michelle K. Lee
*Director of the United States Patent and Trademark Office*